(12) United States Patent
Welch et al.

(10) Patent No.: US 7,224,858 B2
(45) Date of Patent: *May 29, 2007

(54) OPTICAL TRANSMISSION NETWORK WITH A RECEIVER PHOTONIC INTEGRATED CIRCUIT (RXPIC) UTILIZING AN OPTICAL SERVICE CHANEL (OSC)

(75) Inventors: David F. Welch, Menlo Park, CA (US); Ting-Kuang Chiang, Saratoga, CA (US); Radhakrishnan L. Nagarajan, Cupertino, CA (US); Vincent G. Dominic, Fremont, CA (US); Fred A. Kish, Jr., Palo Alto, CA (US)

(73) Assignee: Infinera Corporation, Sunnyvale, CA (US)

( * ) Notice: Subject to any disclaimer, the term of this patent is extended or adjusted under 35 U.S.C. 154(b) by 94 days.

This patent is subject to a terminal disclaimer.

(21) Appl. No.: 11/030,466

(22) Filed: Jan. 6, 2005

(65) Prior Publication Data

US 2005/0135729 A1    Jun. 23, 2005

Related U.S. Application Data

(63) Continuation of application No. 10/267,304, filed on Oct. 8, 2002, now Pat. No. 7,116,851.

(60) Provisional application No. 60/367,595, filed on Mar. 25, 2002, provisional application No. 60/328,568, filed on Oct. 9, 2001, provisional application No. 60/328,207, filed on Oct. 9, 2001, provisional application No. 60/392,494, filed on Jun. 28, 2002, provisional application No. 60/370,345, filed on Apr. 5, 2002, provisional application No. 60/378,010, filed on May 10, 2002.

(51) Int. Cl.
G02B 6/12    (2006.01)
G02B 6/28    (2006.01)
G02B 6/34    (2006.01)
H04B 10/12   (2006.01)

(52) U.S. Cl. .................... 385/14; 385/24; 385/37; 398/141; 398/162; 398/214

(58) Field of Classification Search ............... 385/14, 385/24, 37; 398/137–139, 206, 27, 209, 398/213, 162, 195–198, 141, 214
See application file for complete search history.

(56) References Cited

U.S. PATENT DOCUMENTS

| | | | |
|---|---|---|---|
| 4,954,786 A | 9/1990 | Yamakawa et al. | 330/4.3 |
| 5,006,906 A | 4/1991 | Deri | 357/16 |
| 5,054,871 A | 10/1991 | Deri et al. | 385/30 |
| 5,078,516 A | 1/1992 | Kapon et al. | 385/129 |
| 5,199,092 A | 3/1993 | Stegmueller | 385/50 |
| 5,206,920 A | 4/1993 | Cremer et al. | 385/37 |
| 5,418,183 A | 5/1995 | Joyner et al. | 437/129 |
| 5,488,507 A | 1/1996 | Nishimura | 359/344 |
| 5,617,234 A | 4/1997 | Koga et al. | 359/131 |
| 5,623,571 A | 4/1997 | Chou et al. | 385/130 |
| 5,631,768 A | 5/1997 | Bruno | 359/333 |
| 5,673,141 A | 9/1997 | Gambini | 359/341 |
| 5,720,893 A | 2/1998 | Ben-Michael et al. | 216/24 |
| 5,790,302 A | 8/1998 | Tiemeijer | 359/344 |
| 5,809,184 A | 9/1998 | Doerr et al. | |
| 5,870,417 A | 2/1999 | Verdiell et al. | 372/32 |
| 5,913,000 A | 6/1999 | Doerr et al. | 385/46 |
| 5,920,414 A | 7/1999 | Miyachi et al. | 359/133 |
| 6,008,675 A | 12/1999 | Handa | 327/96 |
| 6,052,222 A | 4/2000 | Kitiamura | 359/344 |
| 6,094,298 A | 7/2000 | Luo et al. | |
| 6,111,674 A | 8/2000 | Bhagavatula | 359/124 |
| 6,141,477 A | 10/2000 | Kitamura | 385/131 |
| 6,162,655 A | 12/2000 | Johnson et al. | 438/31 |
| 6,174,748 B1 | 1/2001 | Jeon et al. | 438/31 |
| 6,186,631 B1 | 2/2001 | Behringer et al. | 357/344 |
| 6,271,944 B1 | 8/2001 | Schemmann et al. | 359/124 |
| 6,271,945 B1 | 8/2001 | Terahara | 359/124 |
| 6,288,410 B1 | 9/2001 | Miyazawa | 257/14 |
| 6,298,186 B1 | 10/2001 | He | 385/37 |
| 6,307,660 B1 | 10/2001 | Cordell et al. | 359/189 |
| 6,310,719 B1 | 10/2001 | Goldstein et al. | 359/344 |
| 6,433,904 B1 | 8/2002 | Swanson et al. | 359/133 |
| 6,466,707 B1 | 10/2002 | Dawes et al. | 385/14 |

| 6,782,209 B2* | 8/2004 | Copeland et al. ............ 398/157 |
| 6,954,590 B2* | 10/2005 | Kandpal et al. ............... 398/31 |
| 2002/0015199 A1* | 2/2002 | Eder et al. ................... 359/110 |
| 2002/0039217 A1* | 4/2002 | Saunders et al. ............ 359/161 |

FOREIGN PATENT DOCUMENTS

| EP | 0639876 A1 | 2/1995 |
| EP | 0731576 A2 | 9/1996 |
| WO | WO 01/28049 | 4/2001 |

OTHER PUBLICATIONS

Zirngibl et al. ("WDM receiver by monolithic integration of an optical preamplifier, waveguide grating router and photodiode array", Electronics Letters, Mar. 30, 1995, vol. 31, No. 7, pp. 581-582).*

Tong ("Multiwavelength Receivers for WDM Systems", IEEE Communications Magazine, Dec. 1998, pp. 42-49).*

Ménézo et al. (10-Wavelength 200-GHz Channel Spacing Emitter Integrating DBR Lasers with a PHASAR on InP for WDM Applications, IEEE Photonics Technology Letters, vol. 11, No. 7, Jul. 1999, pp. 785-787).*

Amersfoort et al. ("Low-Loss Phased-Array Based 4-Channel Wavelength Demultiplexer Integrated with Photodetectors", IEEE Photonics Technology Letters, vol. 6, No. 1, Jan. 1994, pp. 62-64).*

Steenbergen et al. ("System performance of a 4-channel PHASAR WDM receiver operating at 1.2 Gbit/s", OFC'96 Technical Digest, Feb. 25-Mar. 1, 1996, pp. 310-311).*

Menezo et al. ("Design, Realization, and Characterization of a Ten-Wavelength Monolithic Source for WDM Applications Integrating DBR Lasers with a PHASAR", IEEE Journal of Selected Topics in Quantum Electronics, vol. 6, No. 1, Jan./Feb. 2000, pages.*

Kohtoku et al. ("Packaged Polarization-Insensitive WDM Monitor with Low Loss (7.3 dB) and Wide Tuning Range (4.5 nm)", IEEE Photonics Technology Letters, vol. 10, No. 11, Nov. 1998, pp. 1614-1616).*

Chandrasekhar et al. ("Monolithic Eight-Wavelength Demultiplexed Receiver for Dense WDM Applications", IEEE Photonics Technology Letters, vol. 7, No. 11, Nov. 1995, pp. 1342-1344).*

J.B.D. Soole, et al., "High-Speed Performance of InAlAs/InGaAs MSM Photodetectors at 1.3 µm and 1.5 µm Wavelengths", IEEE Photonics Technology Letters, vol. 1(8), Aug. 1989.

P.A. Kirby, "Multichannel Wavelength-Switched Transmitters and Receivers-New Component Concepts for Broad-Band Networks and Distributed Switching Systems", Journal of Lightwave Technology, vol. 8(2), pp. 202-211, Feb. 1990.

Charles H. Henry, et al., "Four-Channel Wavelength Division Multiplexers and Bandpass Filters Based on Elliptical Bragg Reflectors", Journal of Lightwave Technology, vol. 8(5), pp. 748-755, May 1990.

J.B.D. Soole, et al., "InGaAs Metal-Semiconductor-Metal Photodetectors for Long Wavelength Optical Communications", IEEE Journal of Quantum Electronics, vol. 27(3), pp. 737-752, Mar. 1991.

J.B.D. Soole, et al., "Monolithic InP/InGaAsP/InP Grating Spectrometer for the 1.48-1.56 µm Wavelength Range", Applied Physics Letters, vol. 58(18), pp. 1949-1951, May 6, 1991.

C. Cremer et al., "Grating Spectrograph Integrated with Photodiode Array in InGaAsP/InGaAs/InP", IEEE Photonics Technology Letters, vol. 4(1), pp. 108-110, Jan. 1992.

J.B.D. Soole, et al., "WDM Detection Uisng Integrated Grating Demultiplexer and High Density p-i-n Array", LEOS 1992, Summer Topical Meeting Digest, pp. B7-B8, Jul. 19, 1992 to Aug. 12, 1992, Santa Barbara, CA.

Kirk S. Giboney, et al., "Traveling-Wave Photodetectors", IEEE Photonics Technology Letters, vol. 4(12), pp. 1363-1365, Dec. 1992.

J.B.D. Soole et al., "Integrated Grating Demultiplexer and PIN Array for High Density Wavelength Division Multiplexed Detection at 1.5 µm", Electronic Letters, vol. 29(6), pp. 558-560, Mar. 18, 1993.

M. Zirngibl, et al., "Polarization Independent 8 x 8 Waveguide Grating Multiplexer on InP", Electronics Letters, vol. 29(2), pp. 201-202, Jan. 21, 1993.

M.A. Newkirk, et al., "1.5 µm Multiquantum-Well Semiconductor Optical Amplifier with Tensile and Compressively Strained Wells for Polarization-Independent Gain", IEEE Photonics Technology Letters, vol. 4(4), pp. 406-408, Apr. 1993.

M.R. Amersfoort, "Low-Loss Phased-Array Based 4-Channel Wavelength Demultiplexer Integrated with Photodetectors", IEEE Photonics Technology Letters, vol. 6(1), pp. 62-64, Jan. 1994.

P. Doussiere, et al., "1.55µm Polarization Independent Semiconductor Optical Amplifier with 25 dB Fiber to Fiber Gain", IEEE Photonics Technology Letters, vol. 6(2), pp. 170-172, Feb. 1994.

F. Tong et al., "Characterization of a 16-Channel Optical/Electronic Selector for Fast Packet-Switched WDMA Networks", IEEE Photonics Technology Letters, vol. 6(8), pp. 971-974, Aug. 1994.

B. Glance, et al., "Applications of the Integrated Waveguide Grating Router", Journal of Lightwave Technology, vol. 12(6), pp. 957-962, Jun. 1994.

M. Zirngibl et al., "WDM Receiver by Monolithic Integration of an Optical Preamplifier, Waveguide Grating Router and Photodiode Array", Electronic Letters, vol. 31(7), pp. 581-582, Mar. 30, 1995.

Lucas B. Soldano, et al, "Optical Multi-Mode Interference Devices Based on Self-Imaging: Principles and Applications", Journal of Lightwave Technology, vol. 13(4), pp. 615-627, Apr. 1995.

J.B.D. Soole, et al., "High Speed Monolithic WDM Detector for 1.5 µm Fibre Band", Electronic Letters, vol. 31(15), pp. 1276-1277, Jul. 20, 1995.

S. Chandrasekhar et al., "Monolithic Eight-Wavelength Demultiplexed Receiver for Dense WDM Applications", IEEE Photonics Technology Letters, vol. 7(11), pp. 1342-1344, Nov. 1995.

J.B.D. Soole, et al., "Polarization-Independent InP Arrayed Waveguide Filter Using Square Cross-Section Waveguides", Electronic Letters, vol. 32(4), pp. 323-324, Feb. 15, 1996.

L.Y. Lin, et al., "Velocity Matched Distributed Photodetectors With High-Saturation Power and Large Bandwidth", IEEE Photonics Technology Letters, vol. 8(10), pp. 1376-1378, Oct. 1996.

Kaminow and Koch, ed., "Optical Fiber Communication—IIIB" (vol. 2), Chapter 5, "Semiconductor Laser Growth and Fabrication Technology", Section IV, "Polarization Insensitive Amplifiers by Means of Strain", pp. 177-179, Academic Press, 1997.

H. Tanobe, et al., "Temperature Insensitive Arrayed Waveguide Gratings in InP Substrates", IEEE Photonics Technology Letters, vol. 10(2), pp. 235-237, Feb. 1998.

D. Wolfson, et al, "Detailed Theoretical Investigation of the Input Power Dynamic Range for Gain-Clamped Semiconductor Optical Amplifier Gates at 10 Gb/s", IEEE Photonic Technology Letters, vol., 10(9), pp. 1241-1243, Sep. 1998.

J.B.D. Soole, et al., "Waveguide Integrated MSM Photodetector on InP", Electronics Letters, vol. 24(24), pp. 1478-1480, Nov. 24, 1988.

J. Sarathy, et al., "Polarization Insensitive Waveguide Grating Routers i InP", IEEE Photonics Technology Letters, vol. 10(12), pp. 1763-1765, Dec. 1998.

K. Okamoto et al., "Fabrication of Coherent Optical Transversal Filter Consisting of MMI Splitter/Combiner and Thermo-Optic Amplitude and Phase Controllers", Electronic Letters, vol. 35(16), pp. 1331-1332, Aug. 5, 1999.

Young-Sang Cho, et al., "Analysis and Optimization of Polarization-Insensitive Semiconductor Optical Amplifiers with Delta-Strained Quantum Wells", IEEE Journal of Quantum Electronics, vol. 37(4), pp. 574-579, Apr. 2001.

Hatakeyama, et al., "Uniform and High-Performance Eight-Channel Bent Waveguide SOA Array for Hybrid PICs", IEEE Photonics Technology Letters, vol. 13(5), pp. 418-420, May 2001.

M. Kohtoku et al., "Polarization Independent Semiconductor Arrayed Waveguide Gratings Using a Deep-Ridge Waveguide Structure", IEICE Trans. Electron., vol. E81-C, No. 8, pp. 1195-1204, Aug. 1998.

Wen-Jeng Ho et al., "InGaAs PIN Photodiodes on Semi-Insulating InP Substrates With bandwidth Exceeding 14 GHz", Solid-State Electronics, vol. 38(7), pp. 1295-1298, 1995.

Kudo et al., "1.55-μm Wavelength-Selectable Microarray DFB-LD's with Monolithically Integrated MMI Combiner, SOA, and EA-Modulator", *IEEE Photonics Technology Letters*, vol. 12(3), pp. 242-244, Mar. 2000.

Kitamura et al., "Polarization-Insensitive Semiconductor Optical Amplifier Array Grown by Selective MOVPE", *IEEE Photonics Technology Letters*, vol. 6(2), pp. 173-175, Feb. 1994.

C. H. Joyner et al., "An 8-Channel Digitally Tunable Transmitter with Electroabsorption Modulated Output by Selective-Area Epitaxy", *IEEE Photonics Technology Letters*, vol. 7(9), pp. 1013-1015, Sep. 1995.

Vreeburg et al., "A Low-Loss 16-Channel Polarization Dispersion Compensated PHASAR Demultiplexer", *IEEE Photonics Technology Letters*, vol. 10(3), pp.382-384, Mar. 1998.

"Argo 4-Channel 2.5 Gbps Multiwavelength Receiver", ThreeFive Photonics BV, pp. 1-4, Mar. 2002.

Möller et al. "Mode Stabilization Technique for the Multifrequency Laser", *25th Optical Fiber Communication Conference, Technical Digest*, pp. 187-189, Mar. 7, 2000.

Kaminow et al., "Optical Fiber Telecommunications IIIB—Chapter5—Semiconductor Laser Growth and Fabrication by C.H. Joyner", pp. 177-179, Academic Press 1997.

Doussiere et al., "1550 nm Polarization Independent DBR Gain-Clamped SOA with High Dynamic Input Power Range", $22^{ND}$ European Conference on optical Communication—WeD.2.4—ECOC '96, pp. 169-172, Oslo, Norway 1996.

M. Zirngibl et al., "High Performance, 12 Frequency Optical Multichannel Controller", *Electronic Letters*, vol. 30(9), pp. 700-701, Apr. 28, 1994.

J.B.D. Soole et al., Monolithic Wavelength Demultiplexer and High density p-i-n Array for 1.5 μm WDM Applications:, *Integrated Photonics Research*, 10(AS-A255 423), pp. 1-4 (pp. 353-356), Apr. 1992.

J. Park et al., "New design for Low-Loss Star Couplers and Arrayed Waveguide Grating devices", *IEEE Photonics Technology Letters*, vol. 14(5), pp. 651-653, May. 2002.

E. Tangdiongga et al, "Performance Assessment of A Complete Packaged Sub-Gbps WDM Receiver", *Proc. Symposium IEEE/LEOS Benelux Chapter 2000*, Oct. 30-30, 2000, ISBN 90-9014260-6, ed. X.J.M. Leijtens; J.H. den Besten; Delft University of Technology, IEEE/LEOS, Delft, The Netherlands, 2000, pp. 219-222.

M. Smit et al., Photonic Integrated Circuits for Advanced Communication Networks, *International Journal of Optoelectronics*, vol. 12(1), pp. 25-30, 1998.

Zirngibl et al., "WDM Receiver by Monolithic Integration. . . Photodetector Array", Electronic Letters, vol. 31(7), pp. 581-582, Mar. 30, 1995.

Doussiere et al., "Clamped Gain Traveling . . . Applications", Proceedings of the Intern'al Semiconductor Laser Conference-Maui, Hawaii, vol. Conf. 14, pp. 185-186, Sep. 19, 1994.

Doussiere et al., "1550 nm Polarization . . Power Range", 22nd European Conference on Optical Communications, Norway, vol. 3, pp. 169-172, Sep. 15-19, 1996.

Van Thourhout et al., "Elimination of crosstalk..Gain Clamping", OFC/IOOC '99 Optical Fiber Communication Conference-San Diego, CA, THB4-1—THB4-3, Feb. 21, 1999.

Doussiere et al., "1550 Micron Poalrisation . . . Fiber Gain", IEEE Photonics Technology Letters, vol. 6(2), pp. 170-172, Feb. 1, 1994.

Steenbergen et al., "System Performance . . . 1.2 Gbits/s", OFC '96 Conference on Optical Fiber Communication, San Hose, CA, vol. 2, pp. 310-311, Oct. 1996.

Suzuki et al., "Optical Signal Quality . . . Eight Photodiodes", Electronic Letters, vol. 35(10), pp. 836-837, May 13, 1999.

Soole et al., "Monolithic WDM Sources . . . Multiplexer/Demultiplexer", Leos '92, Boston, MA, pp. 690-691, Nov. 16, 1992.

U.S. Appl. No. 11/030,762, filed Jan. 7, 2005, Welch et al., Commonly assigned Ap.

U.S. Appl. No. 11/035,875, filed Jan. 10, 2005, Welch et al., Commonly assigned Ap.

\* cited by examiner

*Primary Examiner*—Michelle Connelly-Cushwa
(74) *Attorney, Agent, or Firm*—W. Douglas Carothers, Jr.

(57) ABSTRACT

An optical receiver photonic integrated circuit (RxFIC) comprises a semiconductor monolithic chip having an input to receive from an optical transmissior link a combined channel signal originating from an optical transmitter source and comprising a plurality of channel signals having different wavelengths forming a wavelength grid. An optical decorobiner is integrated in the chip and optically coupled to the input to receive the multiplexed channel signal and provide a decombined individual channel signal on an output waveguide of a plurality of such output waveguides provided from the optical decombiner. A plurality of photodetectors are also integrated in the chip and each photodetector is optically coupled to one of the output waveguides to receive a decombined channel signal and convert the channel signal to an electrical signal. A controller is coupled to receive a portion of the converted signals to determine at least one performance property of the signals and provide service channel signal as feedback about that property via the semiconductor monolithic chip to the optical transmitter source. The controller is coupled to an integrated optical service channel (OSC) on the chip that has a light source which is modulated by the service channel signal. The light source may he integrated on the chip. The optical service channel (OSC) is coupled as an input to the decombiner for transport off the chip to optical transmitter source.

58 Claims, 38 Drawing Sheets

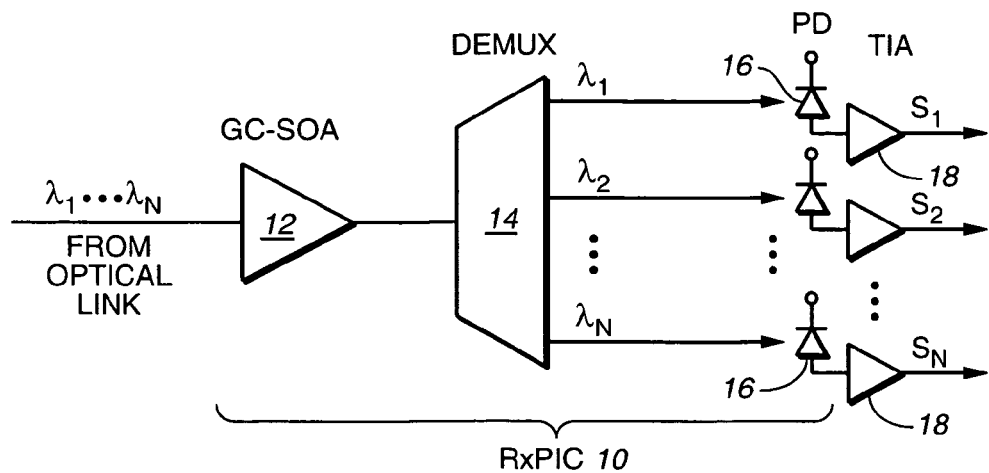
FIG._1
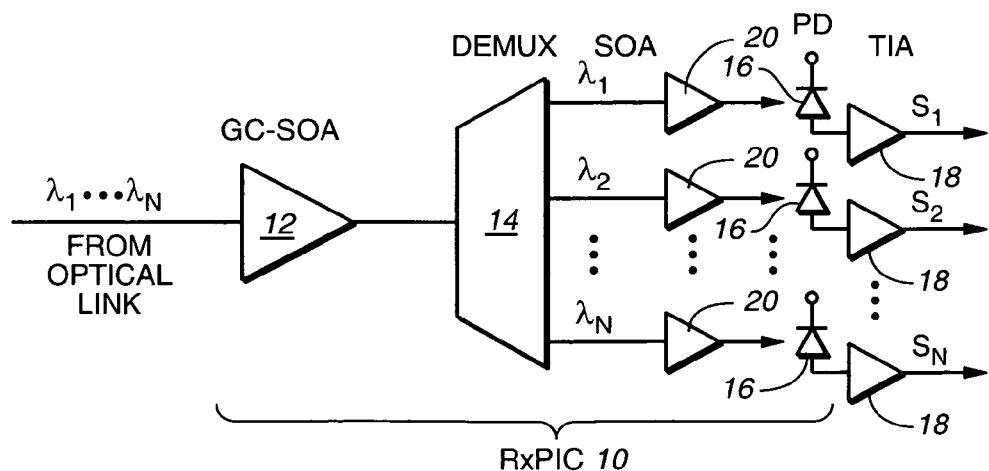
FIG._2

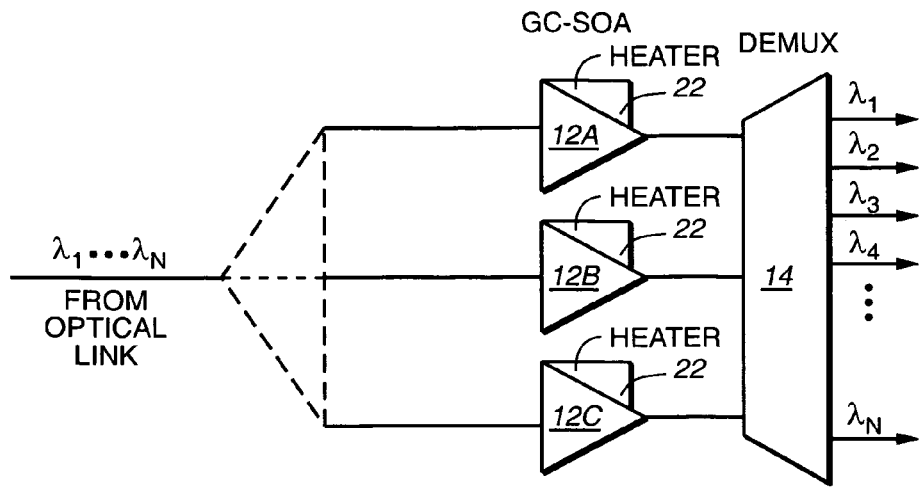
FIG._3
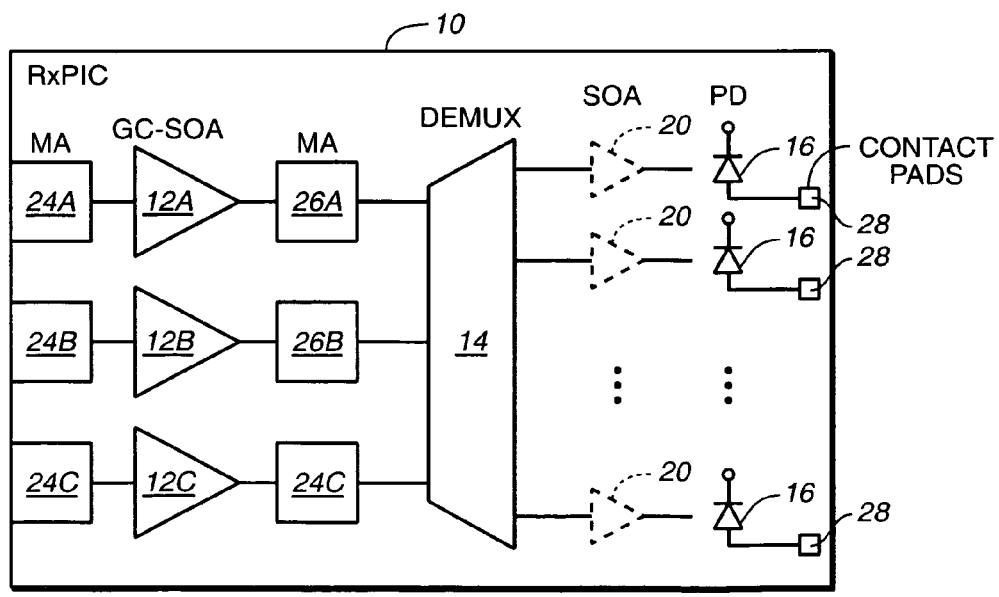
FIG._4

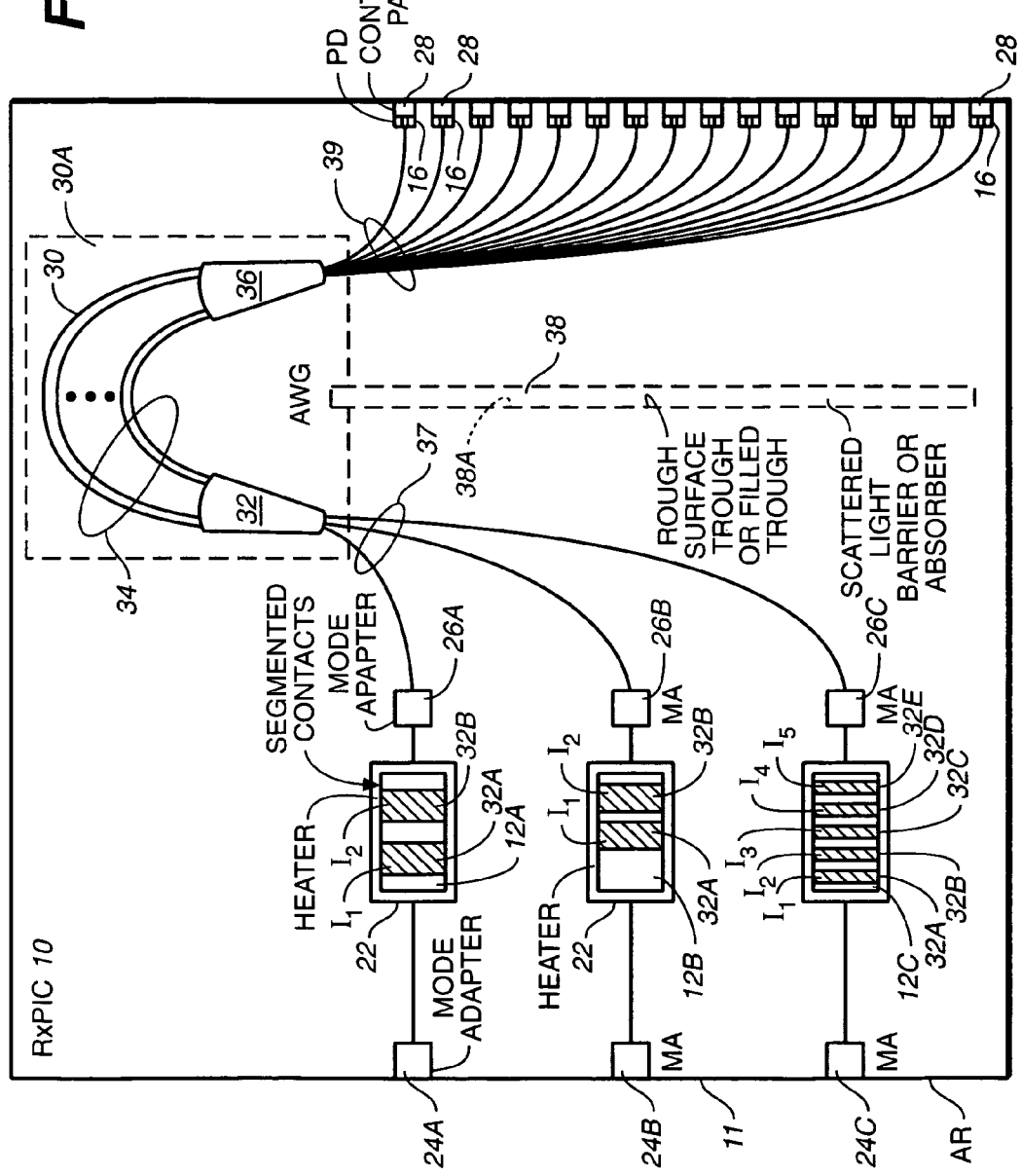
FIG._5

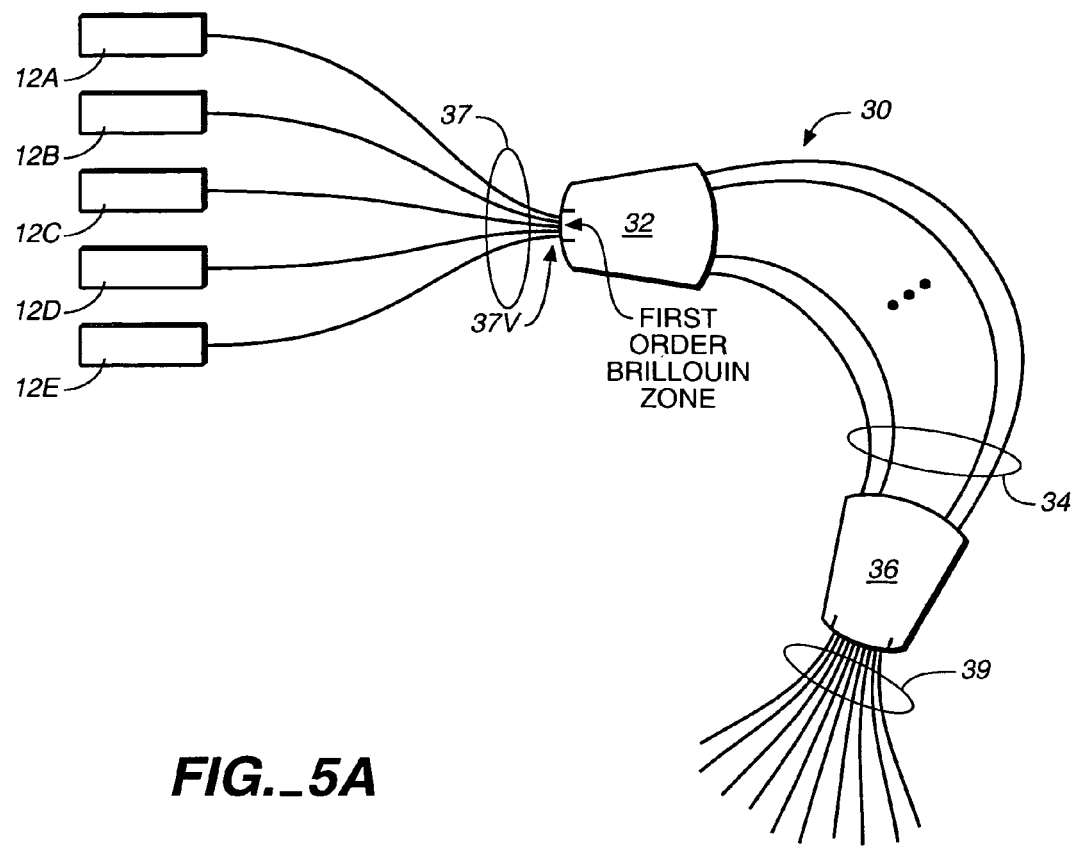
FIG._5A

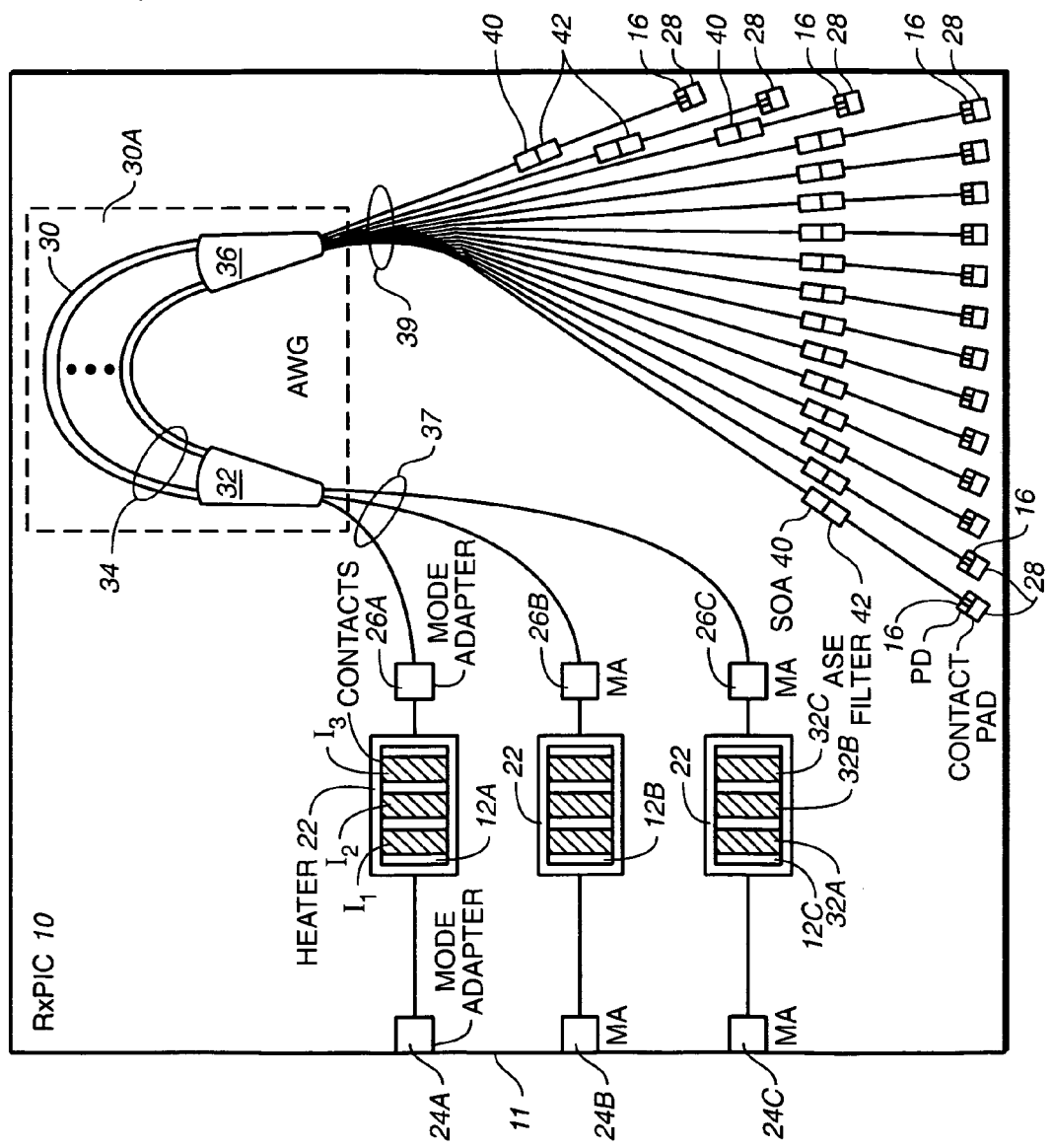
FIG._6

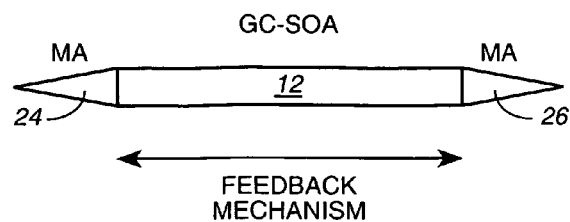
FIG._7
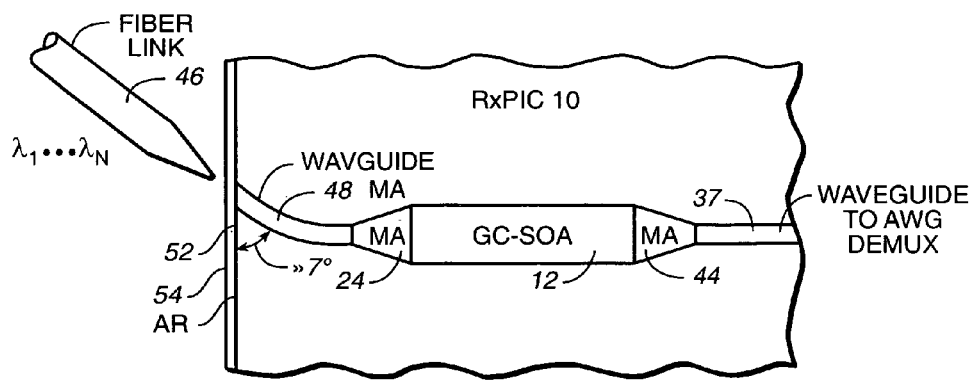
FIG._7A
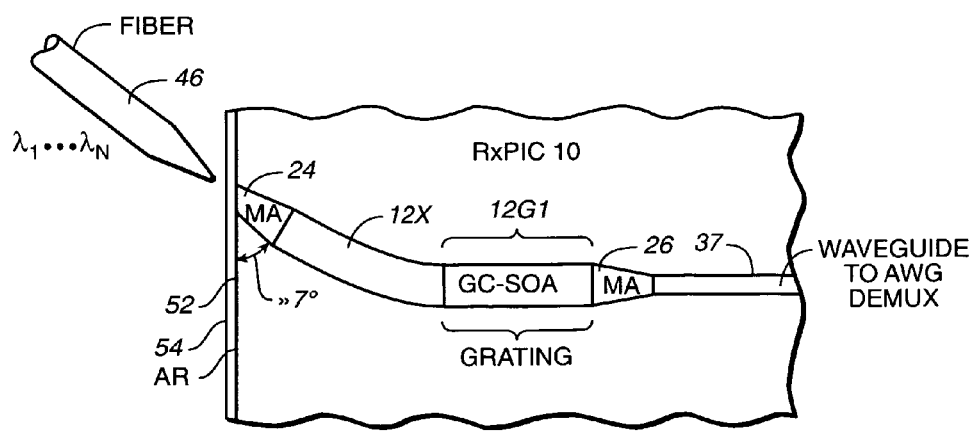
FIG._7B

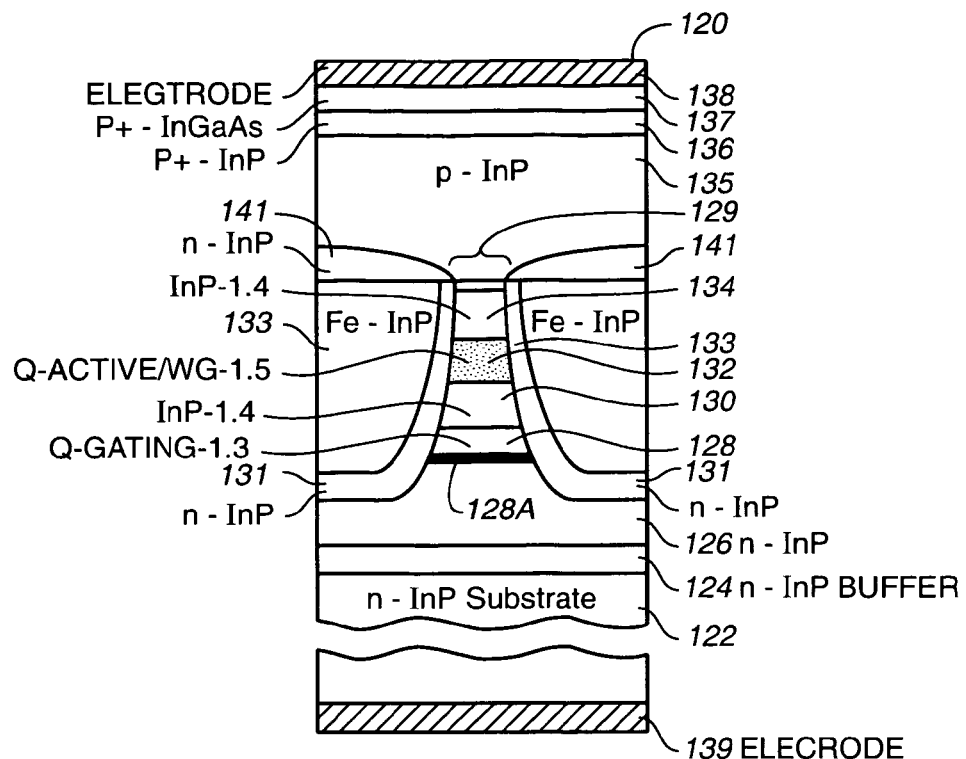
FIG._8A
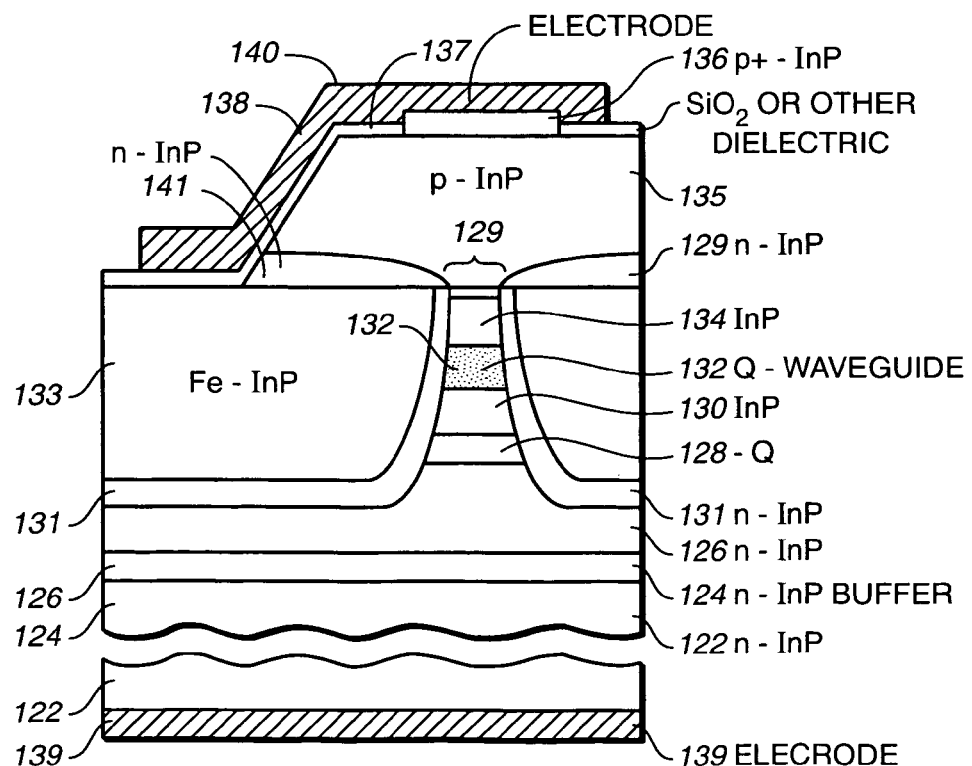
FIG._8B

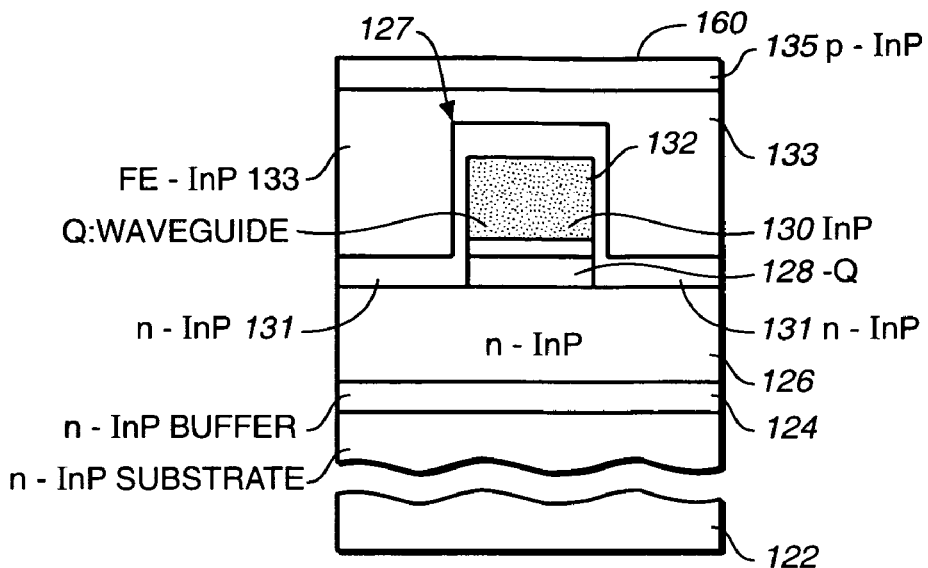
FIG._8C
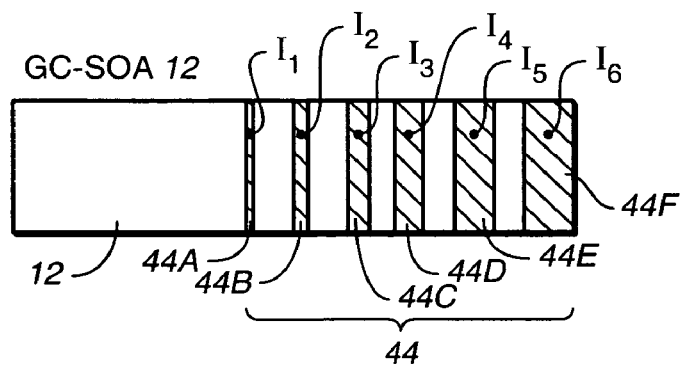
FIG._9
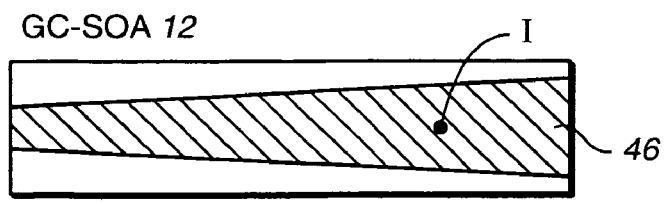
FIG._10

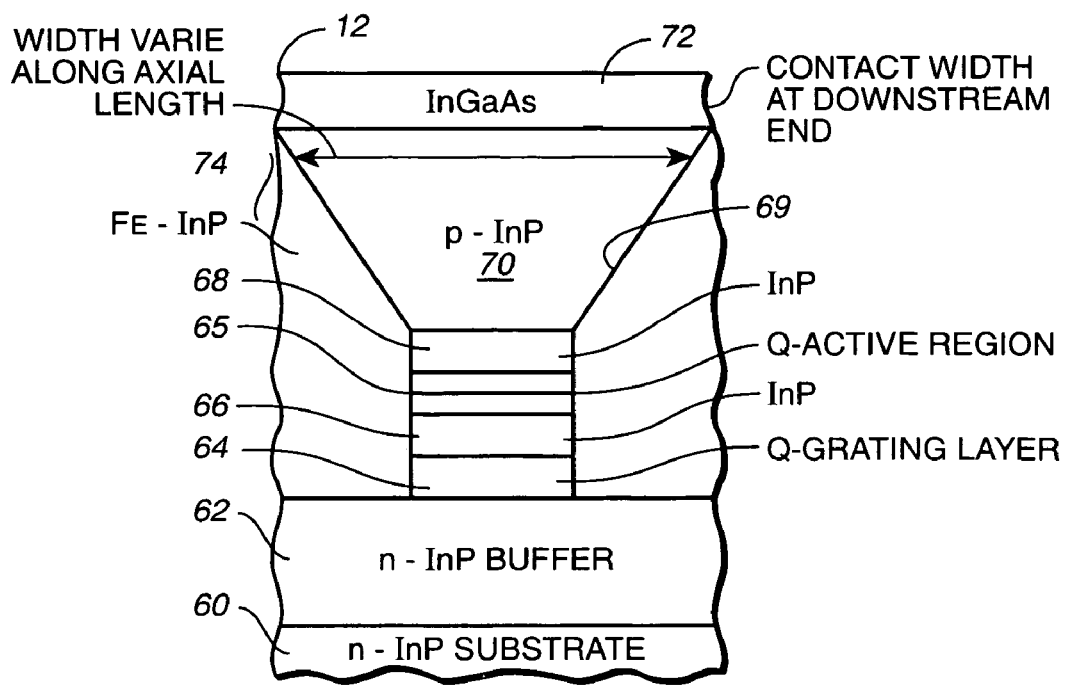
FIG._11

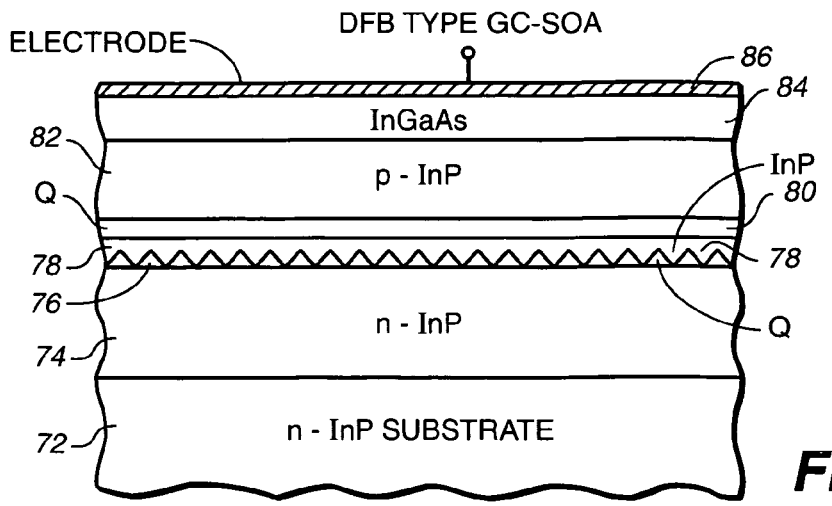
FIG._12
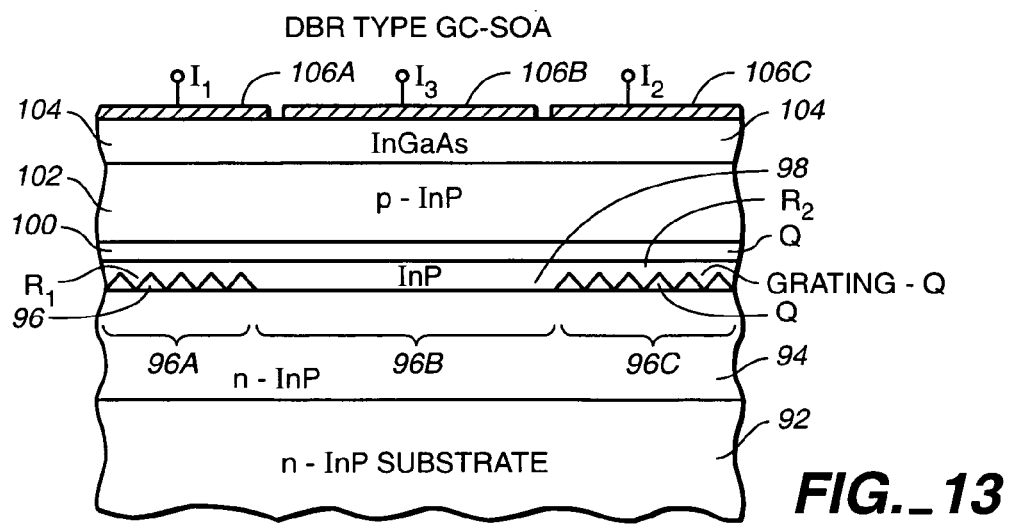
FIG._13
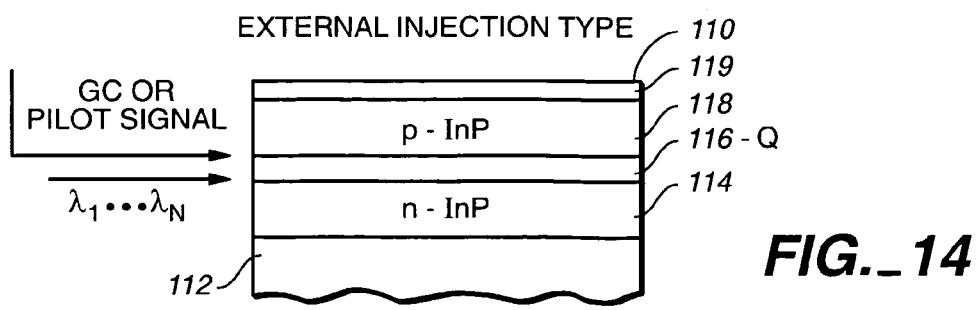
FIG._14

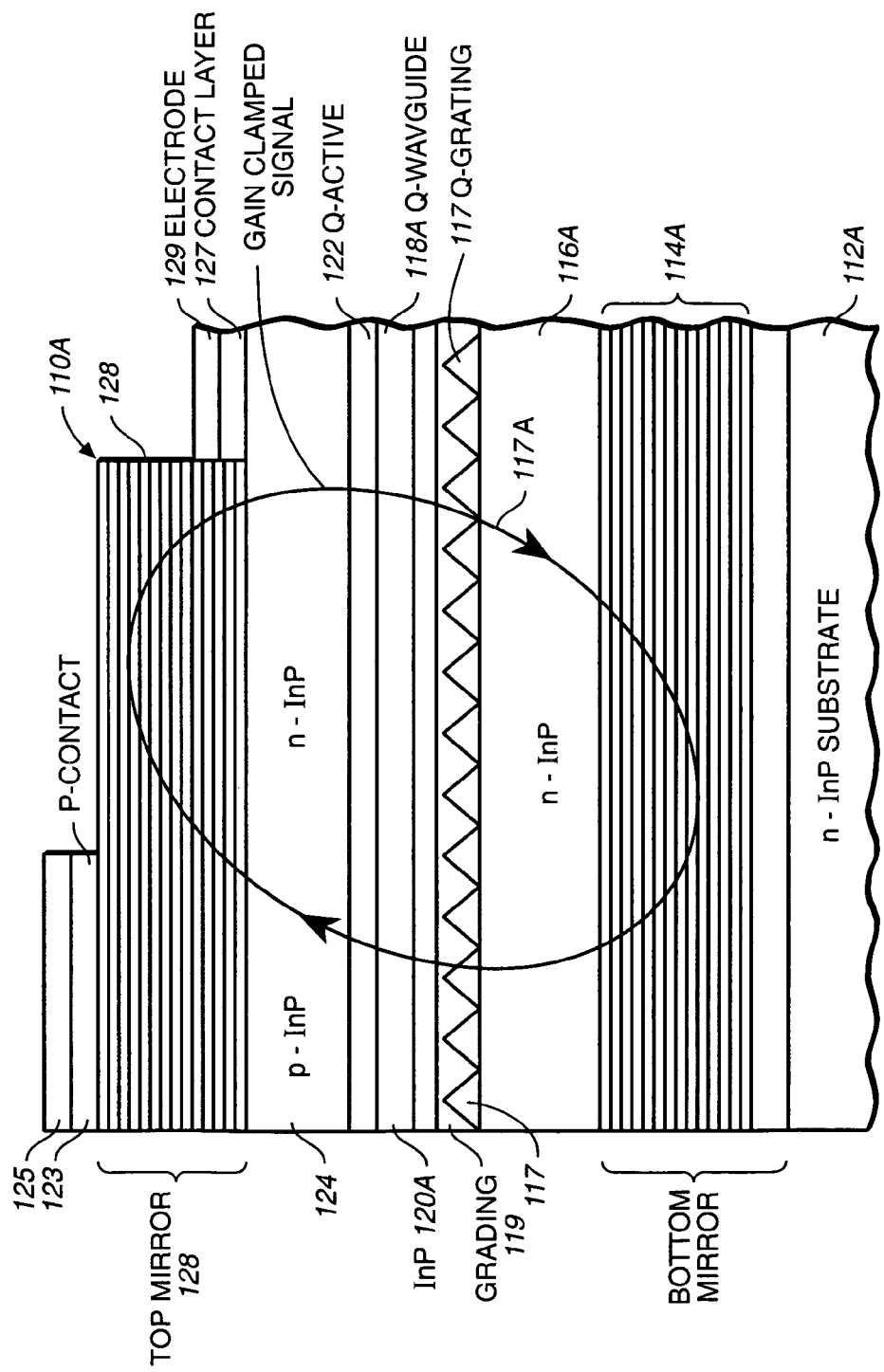
FIG._15

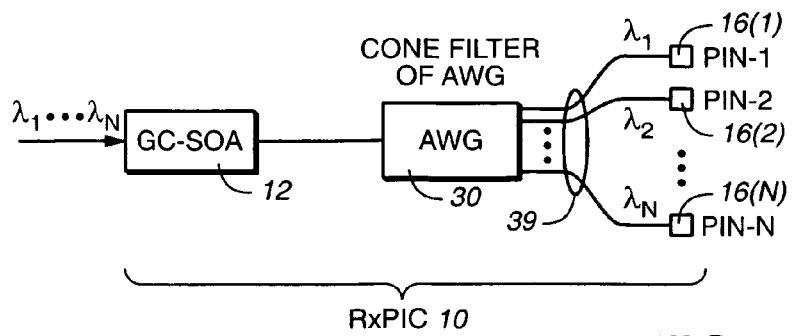
FIG._16
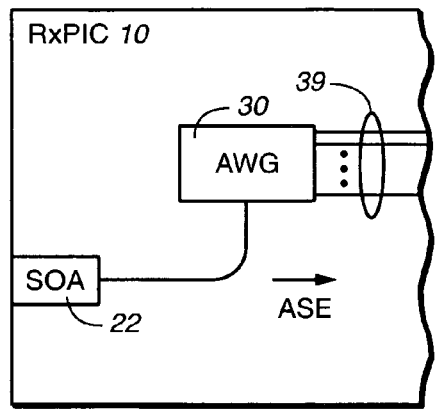
FIG._16A
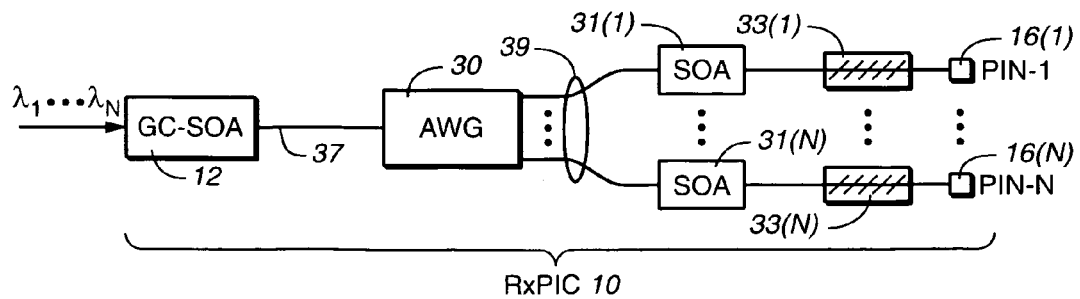
FIG._17

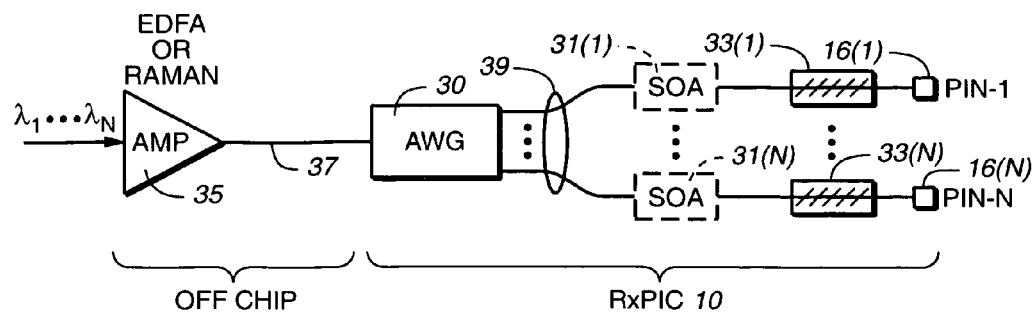
FIG._18
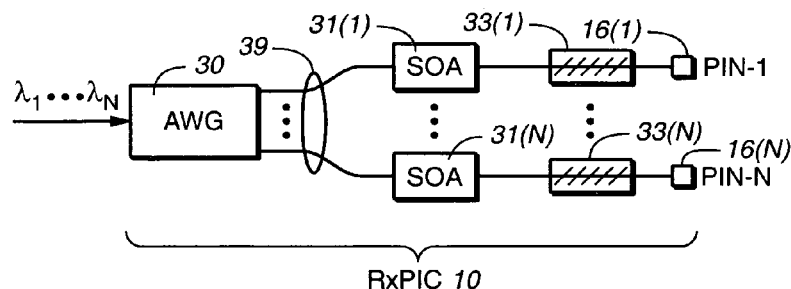
FIG._19
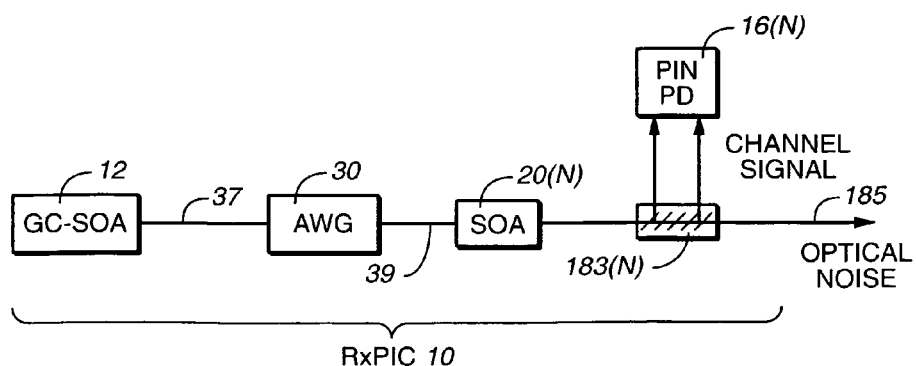
FIG._19A

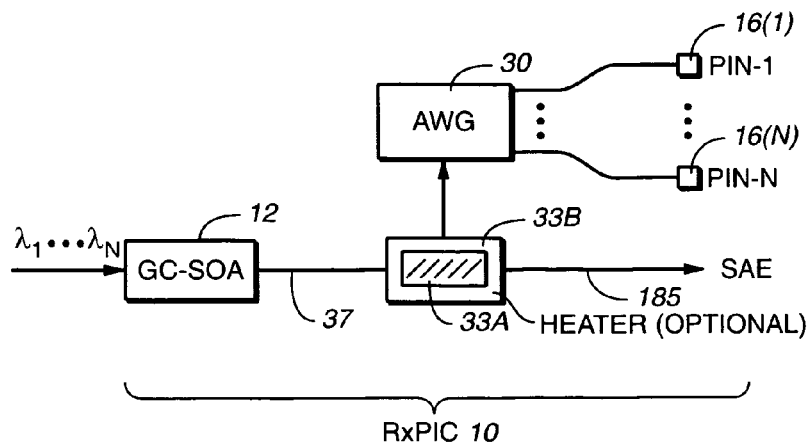
FIG._20
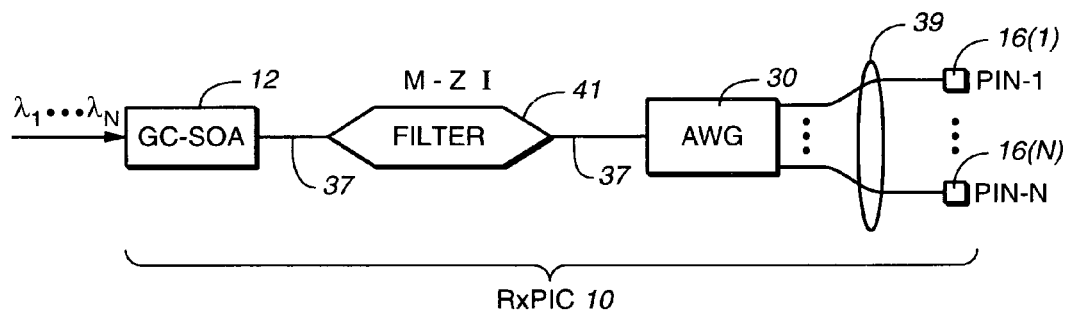
FIG._21
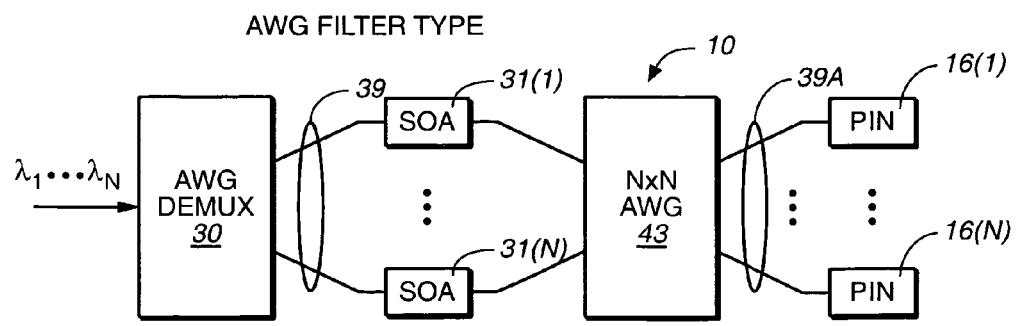
FIG._22

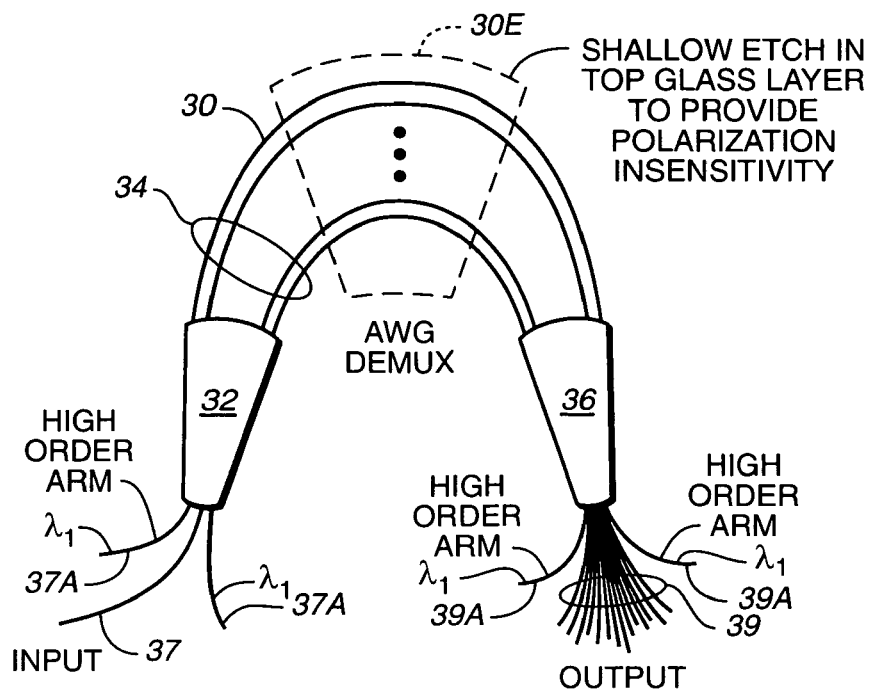
FIG._23
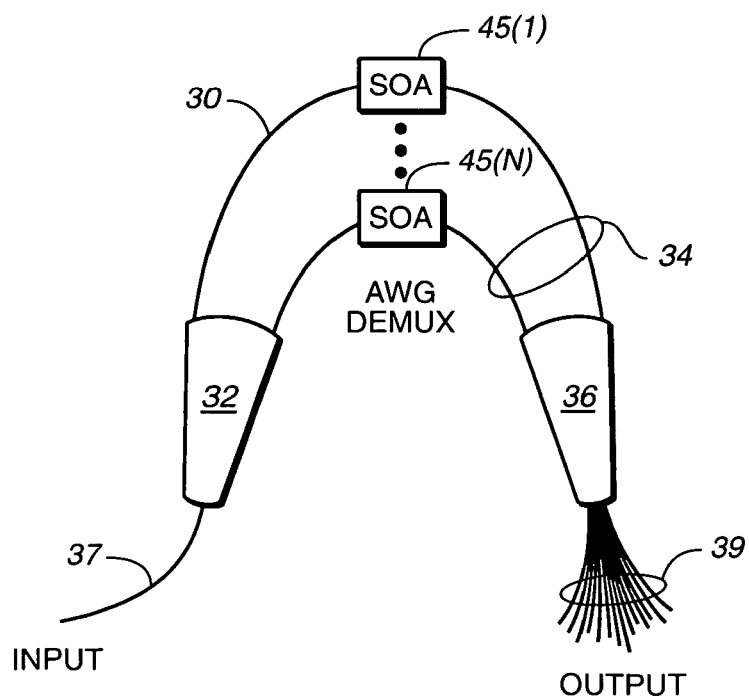
FIG._24

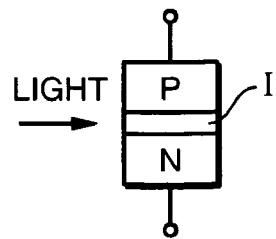
FIG._25
*(PRIOR ART)*
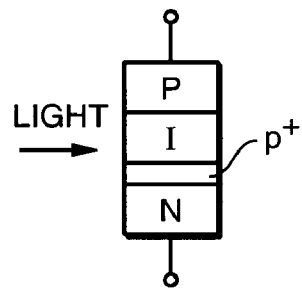
FIG._26
*(PRIOR ART)*
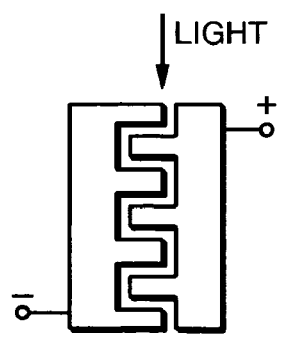
FIG._27
*(PRIOR ART)*

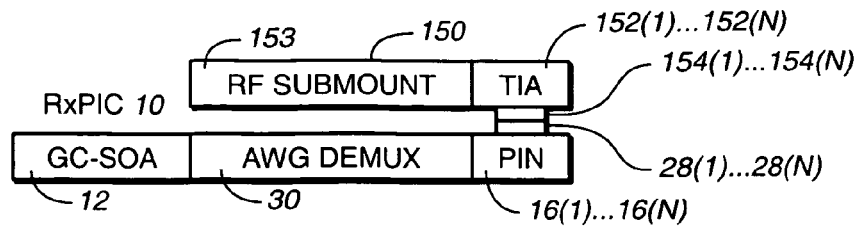
FIG._28
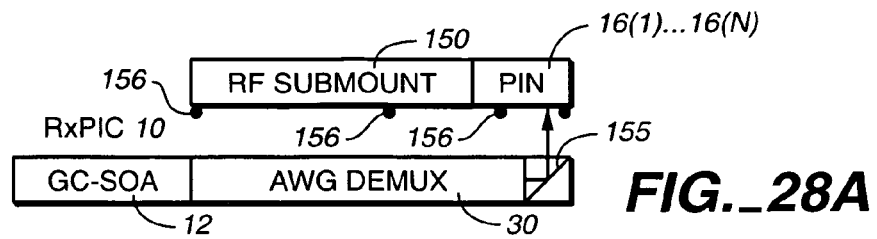
FIG._28A
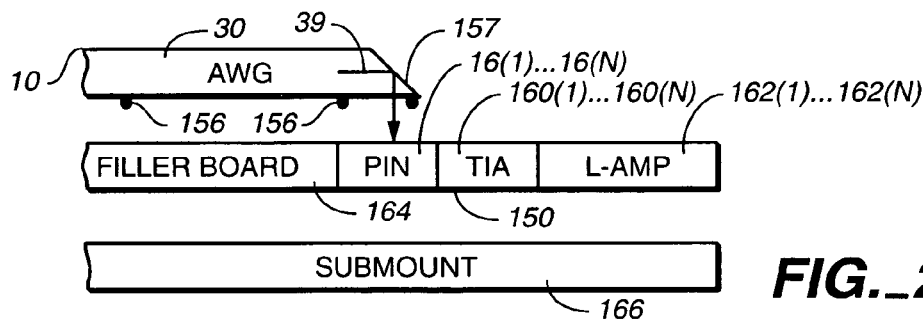
FIG._28B
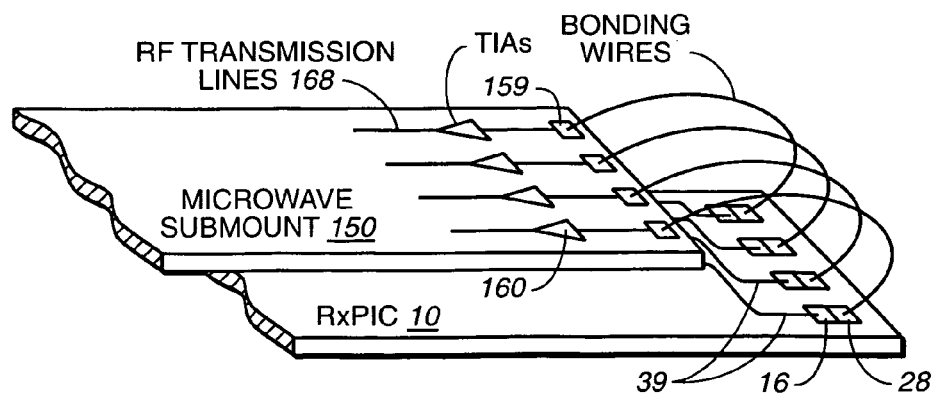
FIG._29

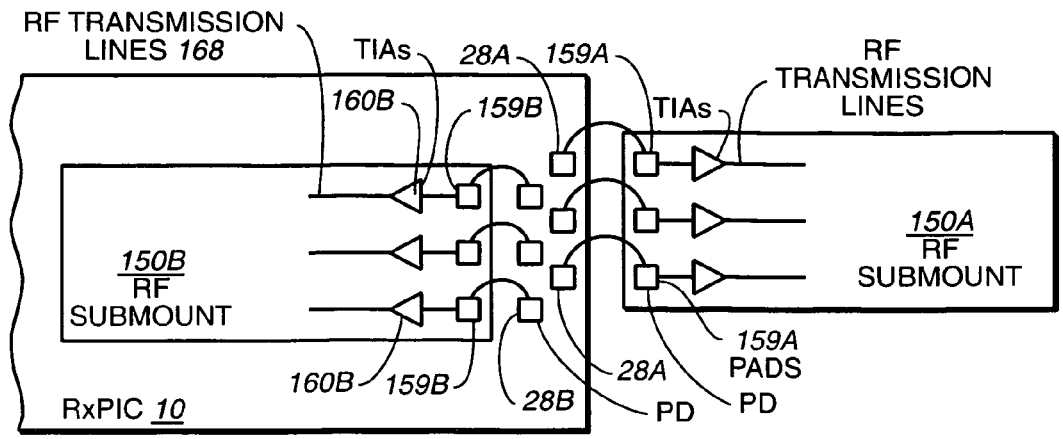
FIG._30
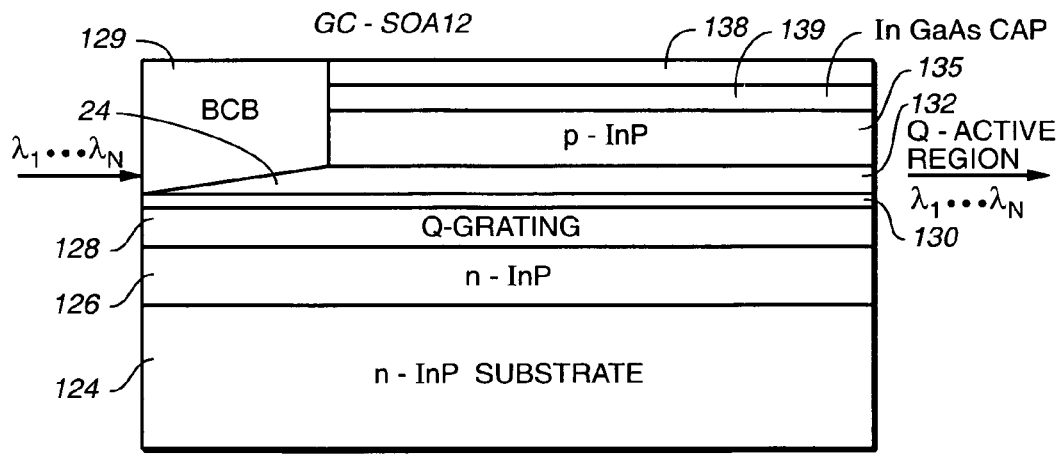
FIG._31
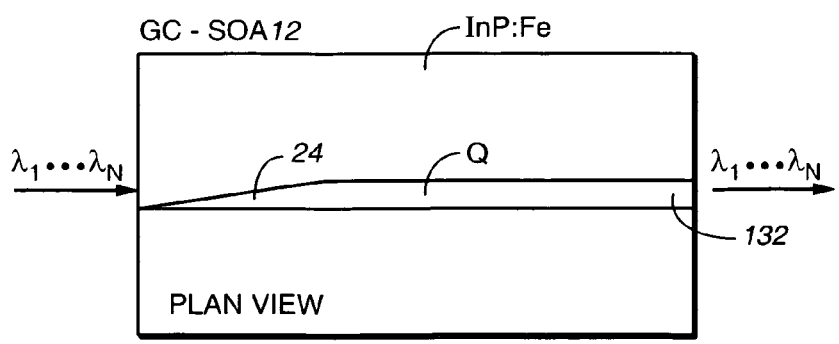
FIG._32

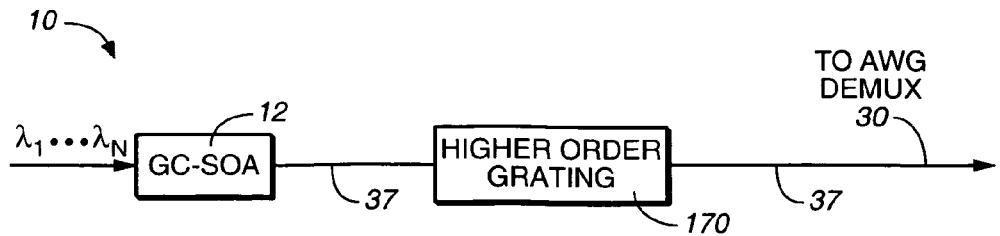
FIG._33
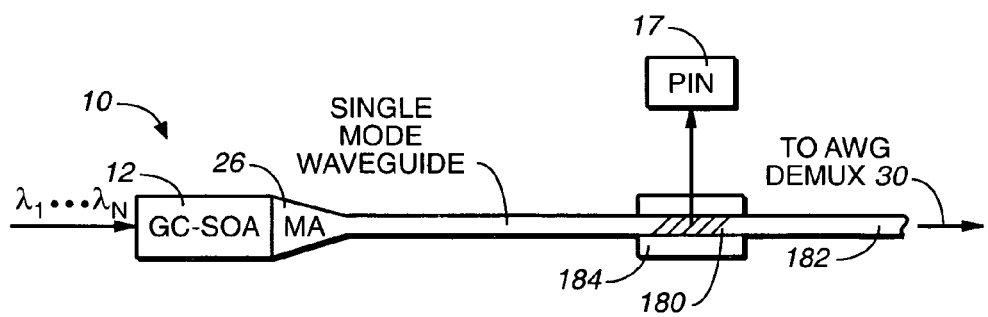
FIG._34
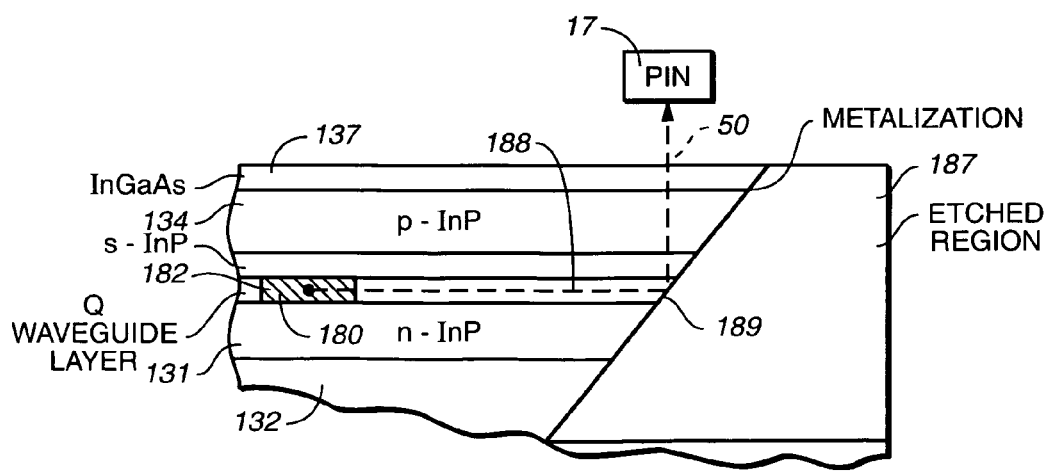
FIG._35

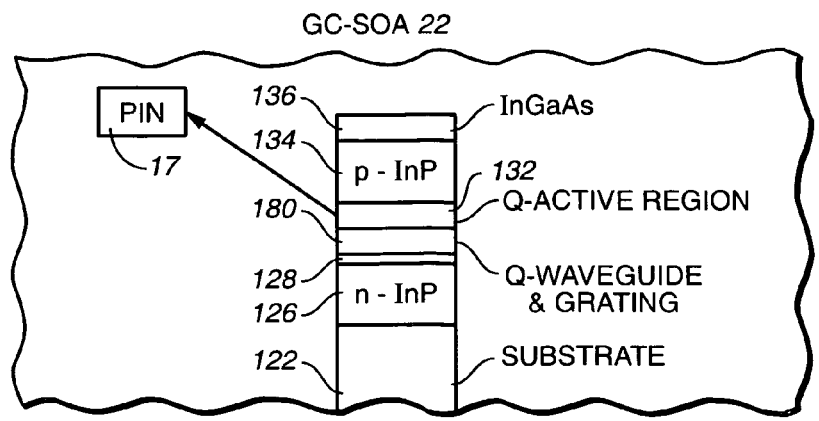
FIG._36
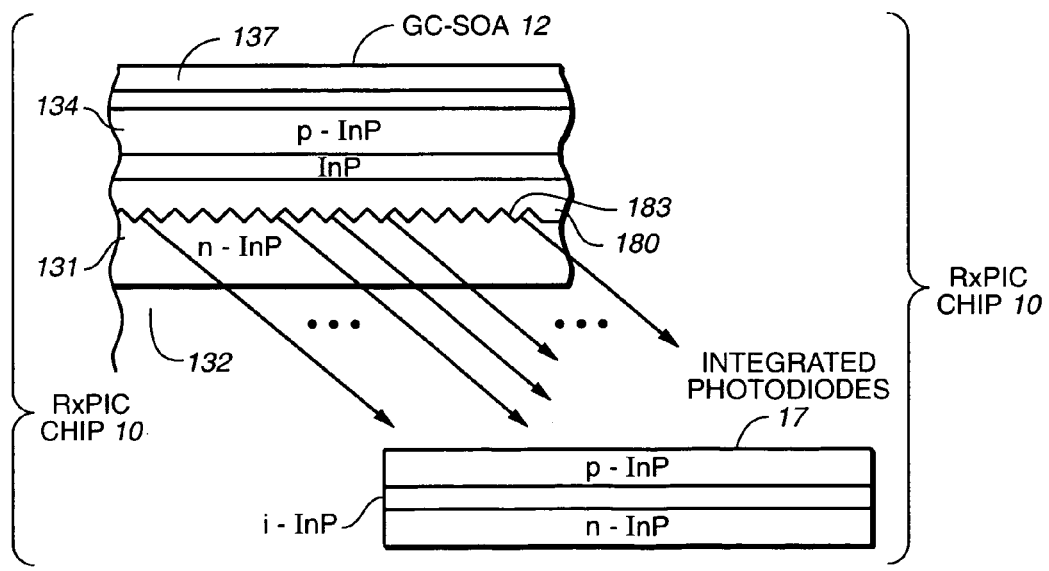
FIG._37

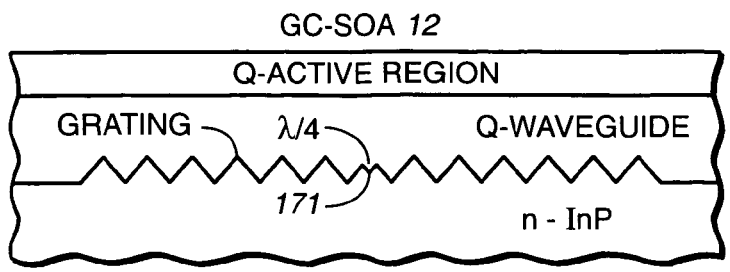
FIG._38
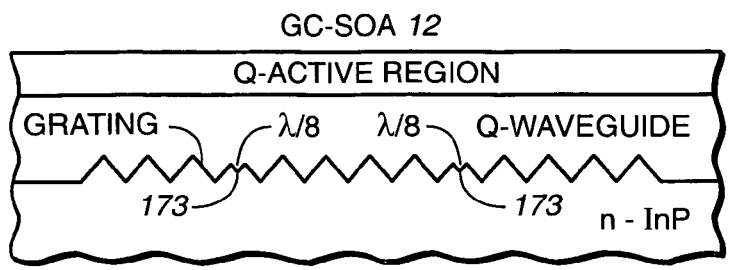
FIG._39
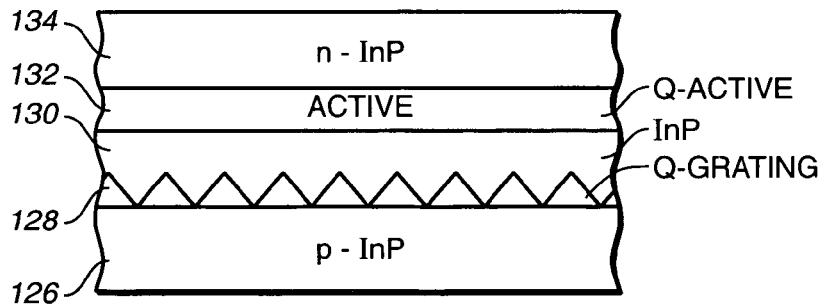
Q-ACTIVE$_{BG}$ » Q-GRATING$_{BG}$, THEN
LOSS SELECTIVE OF MODE
Q-ACTIVE$_{BG}$ < Q-GRATING$_{BG}$, THEN
INDEX SELECTIVE OF MODE
FIG._40A
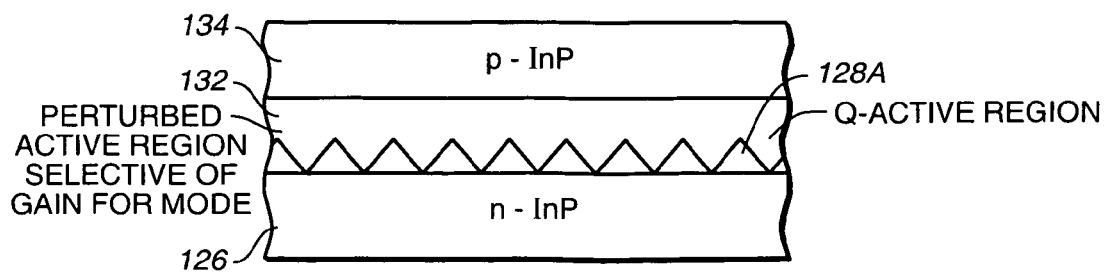
FIG._40B

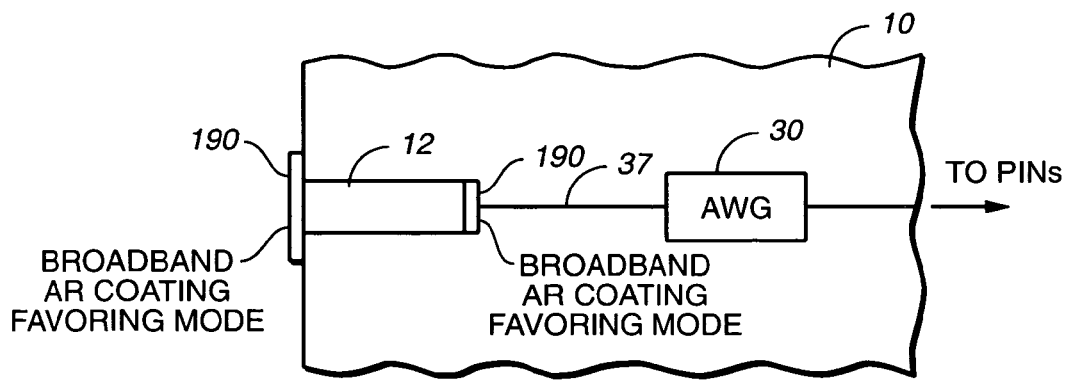
FIG._41
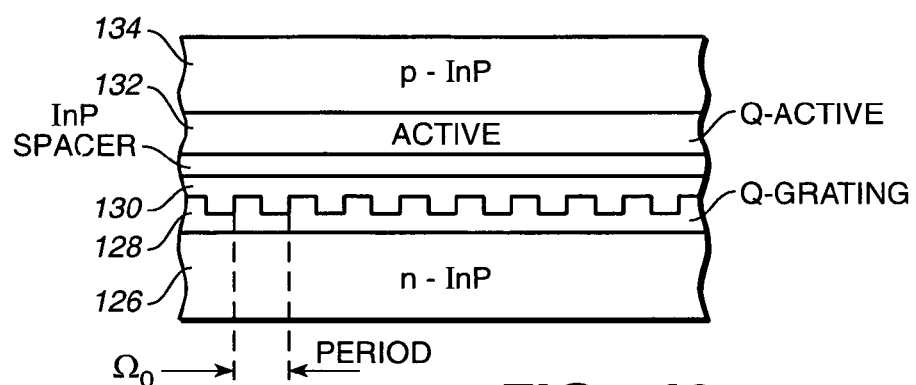
FIG._42
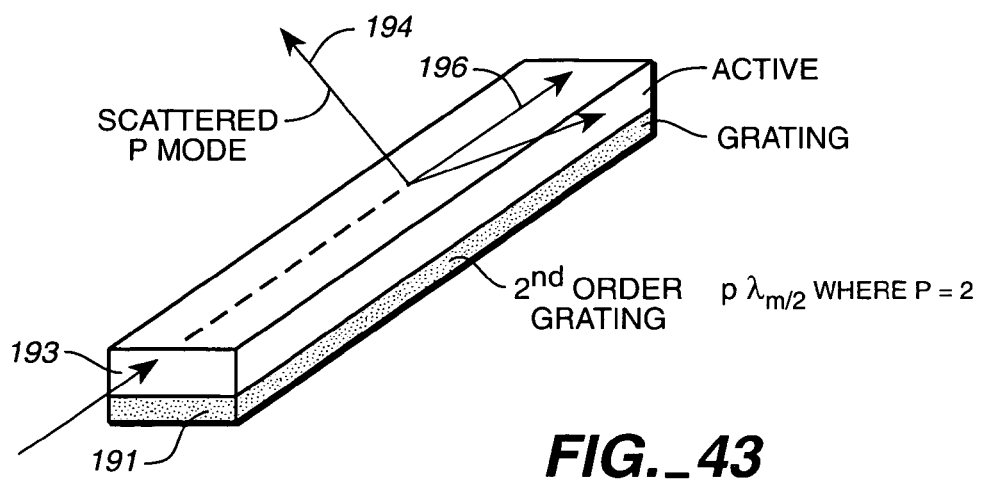
FIG._43

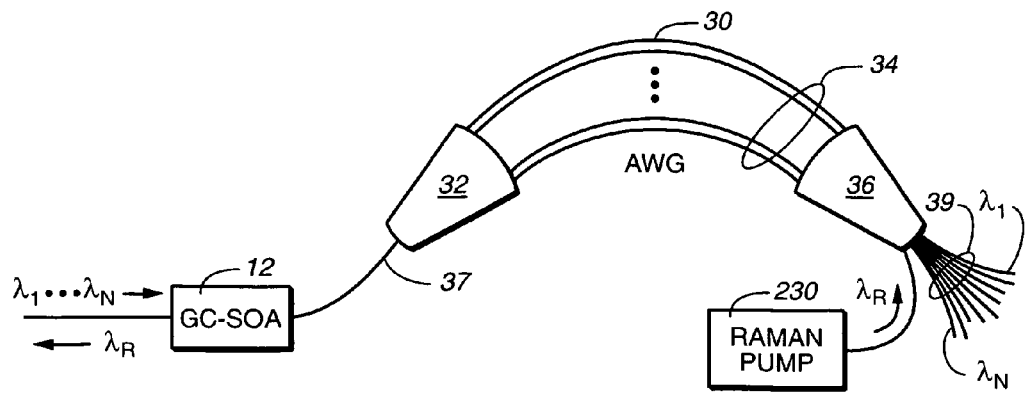
FIG._44
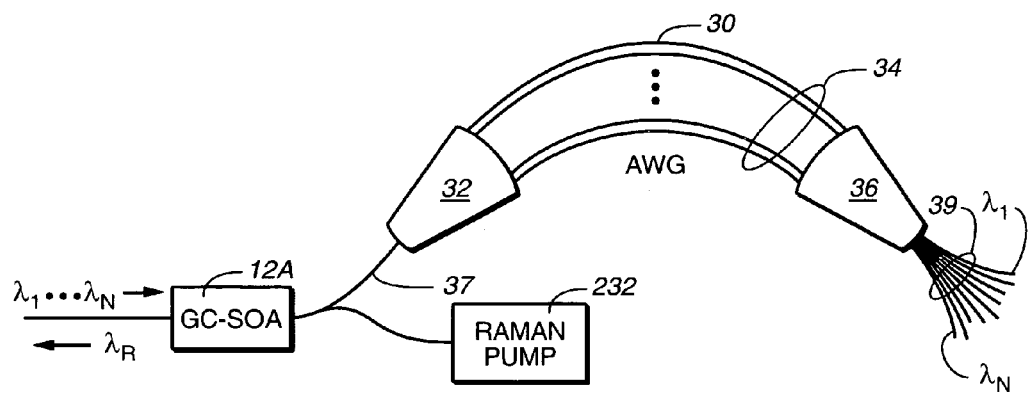
FIG._45
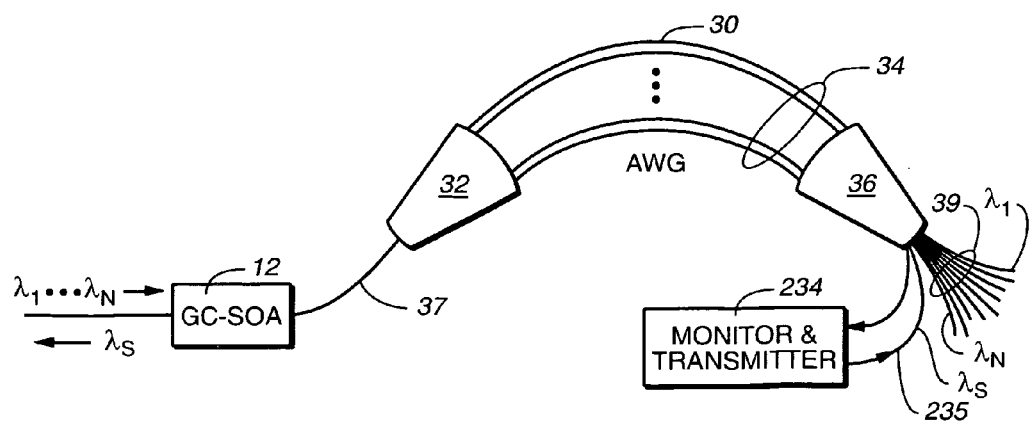
FIG._46

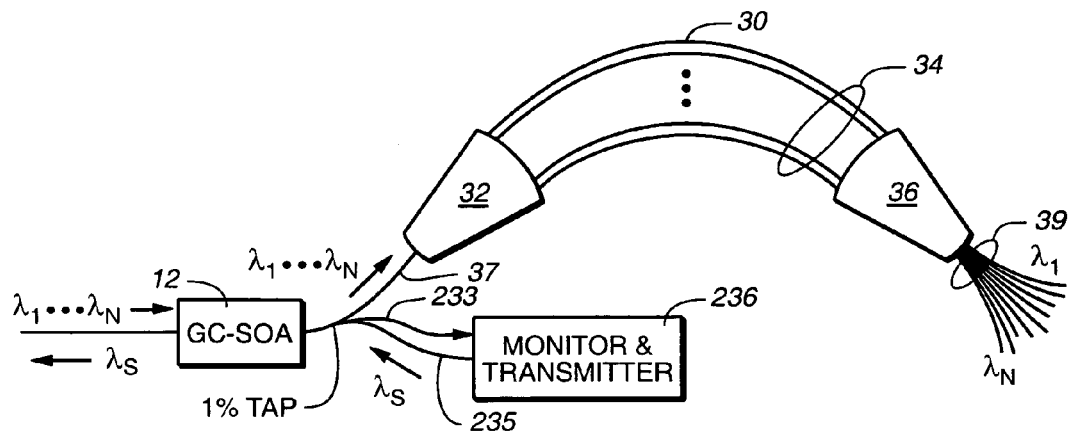
FIG._47
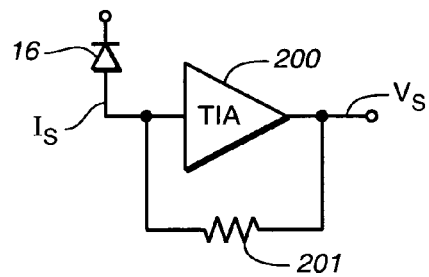
FIG._48 (PRIOR ART)
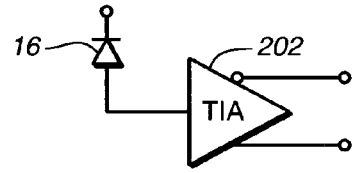
FIG._49 (PRIOR ART)
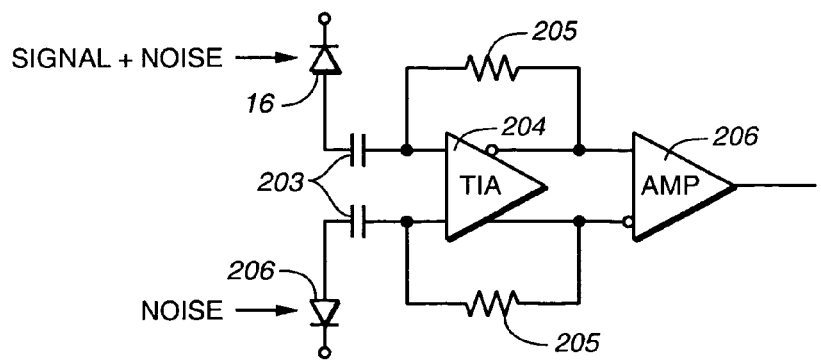
FIG._50

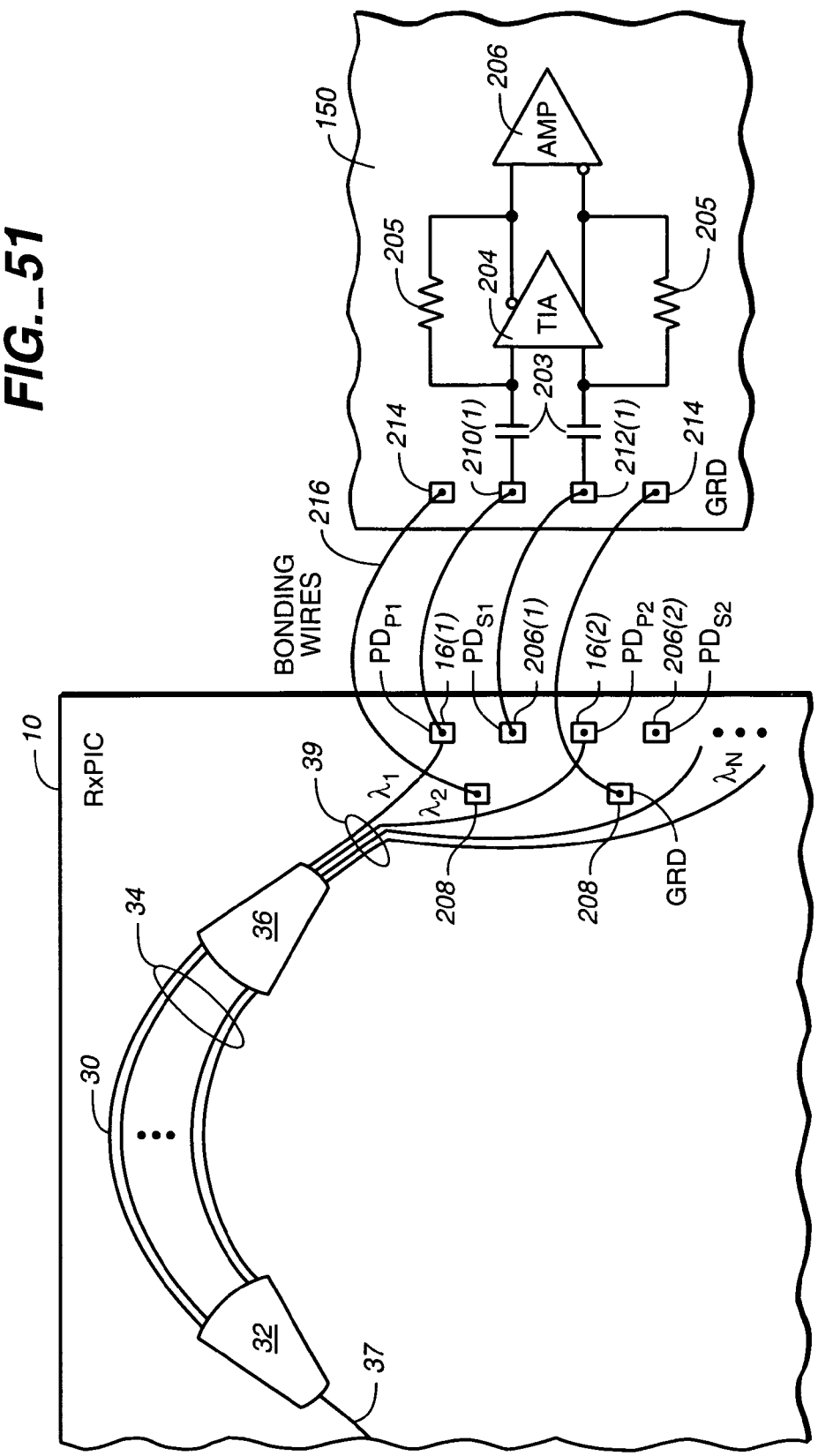
FIG._51

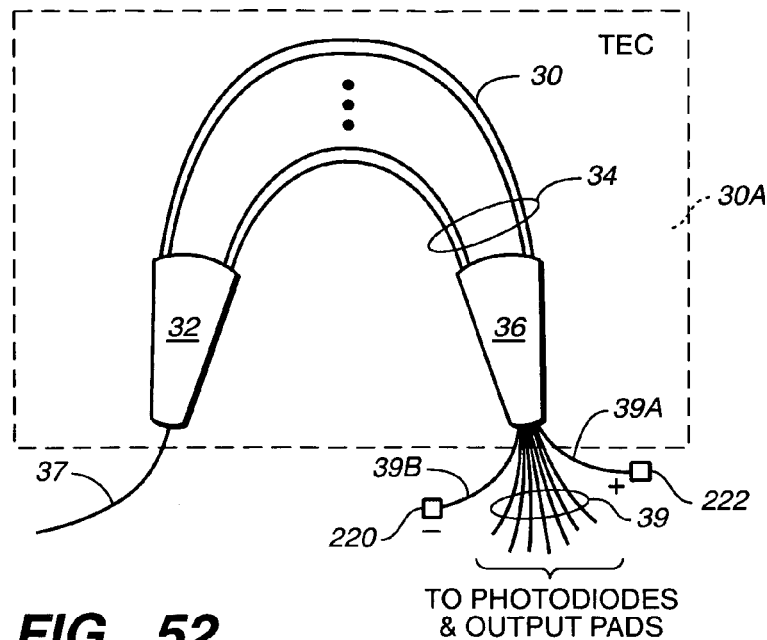
FIG._52
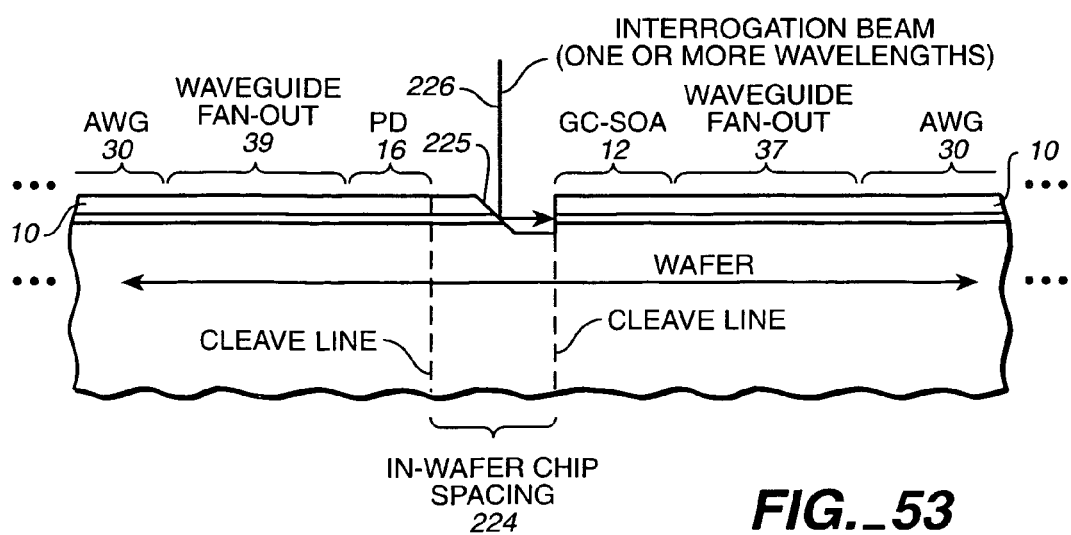
FIG._53

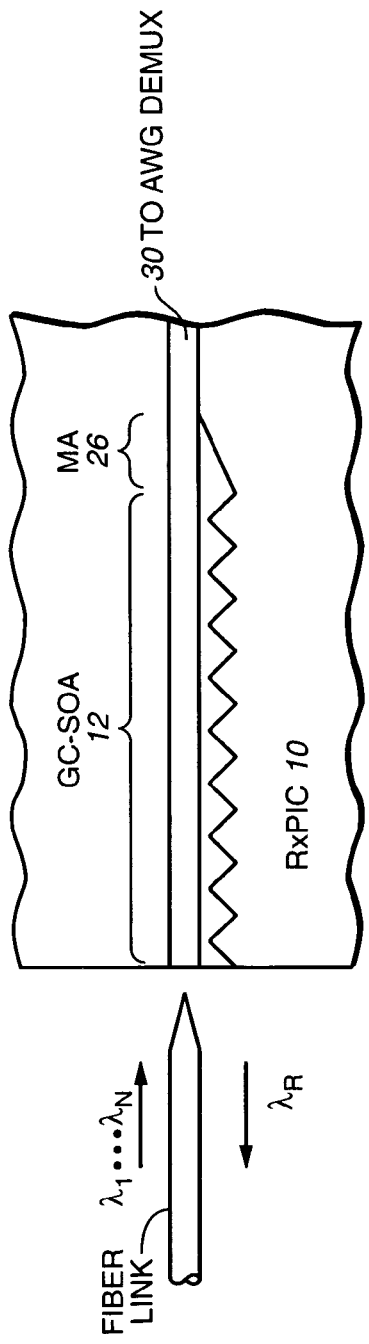
FIG._54
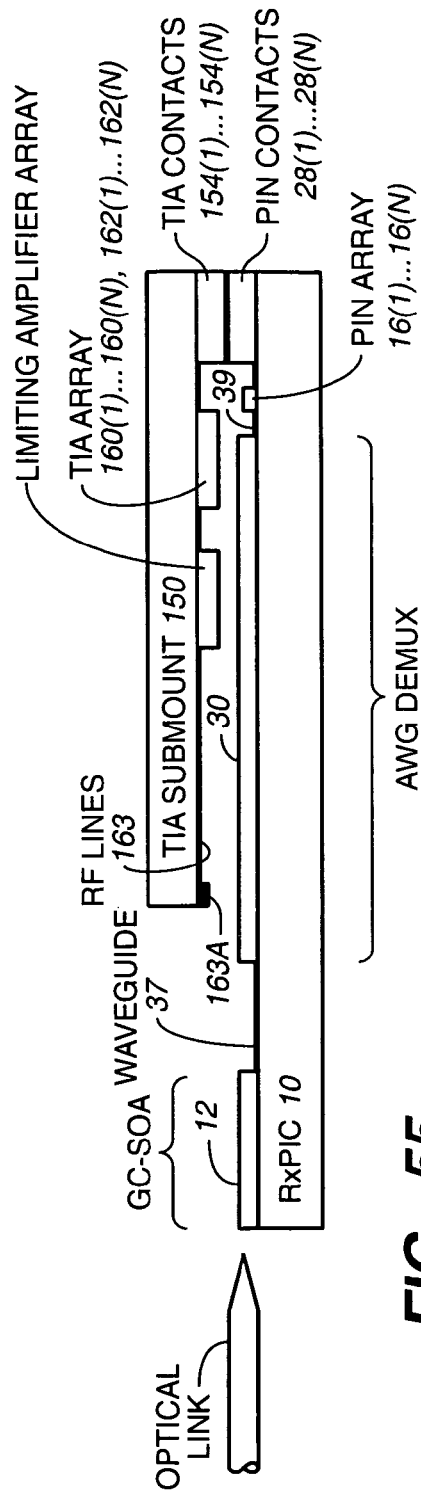
FIG._55

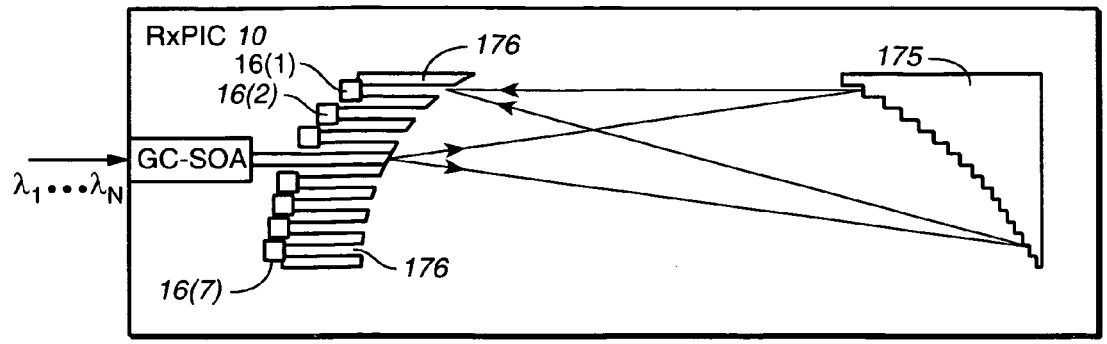
FIG._56
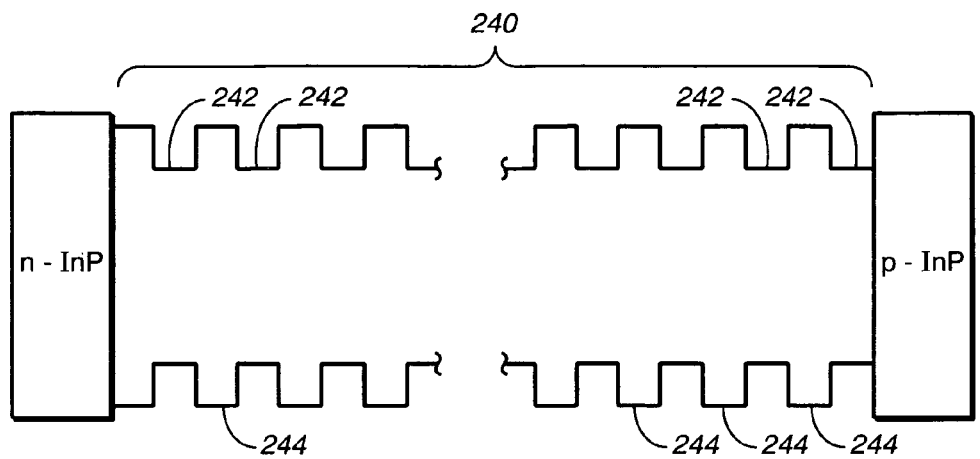
FIG._57
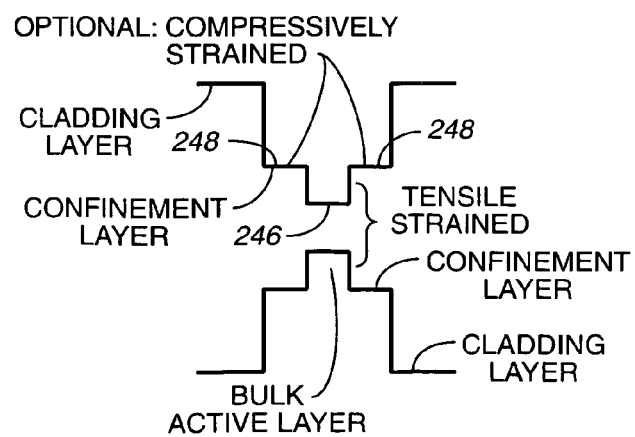
FIG._58

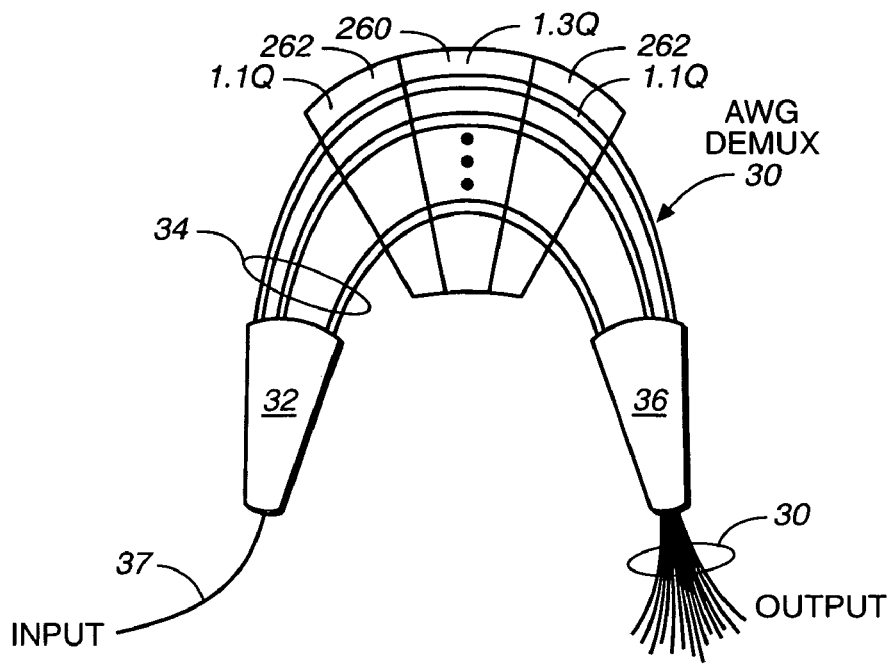
FIG._59
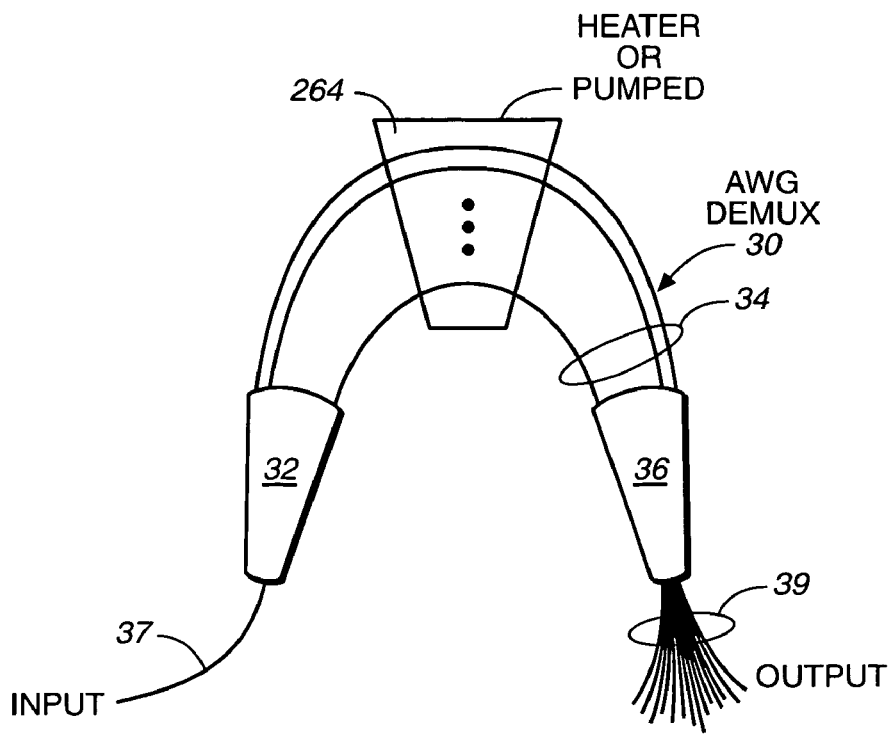
FIG._60

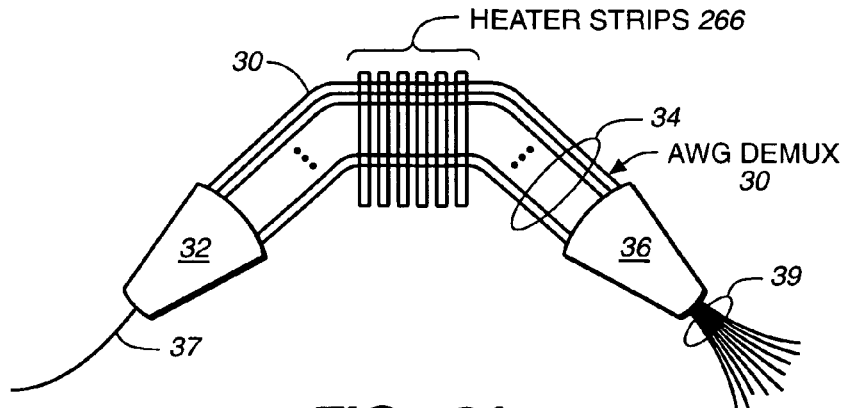
FIG._61
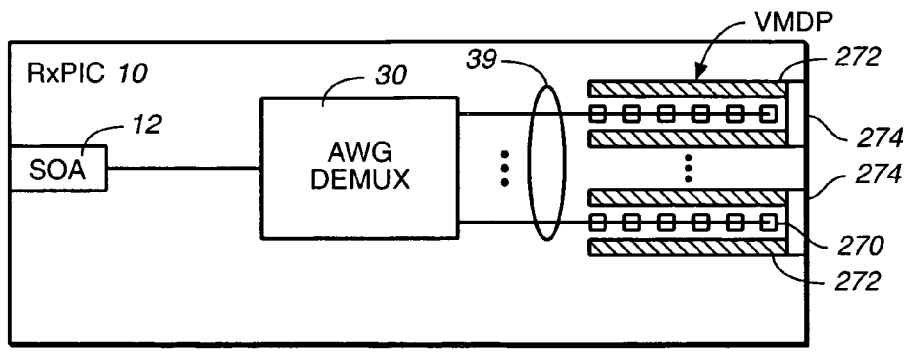
FIG._62A
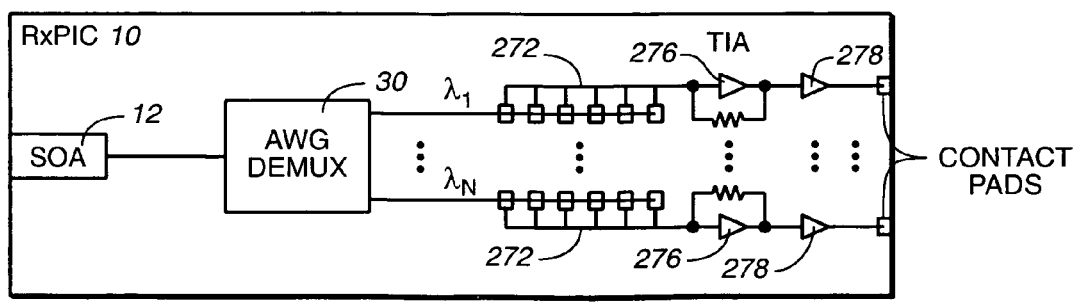
FIG._62B

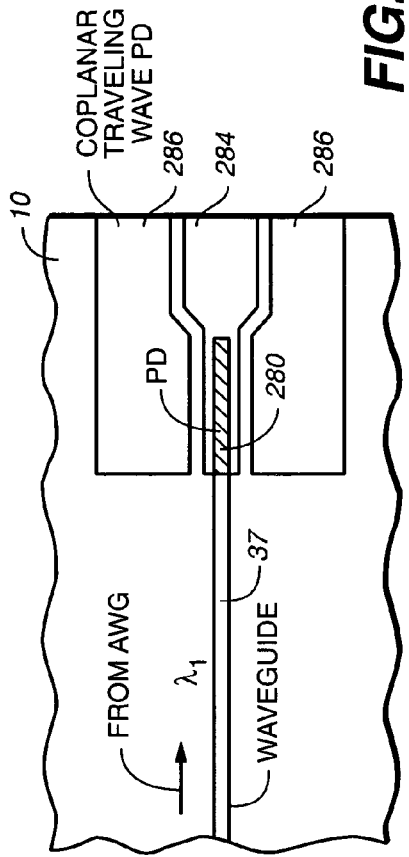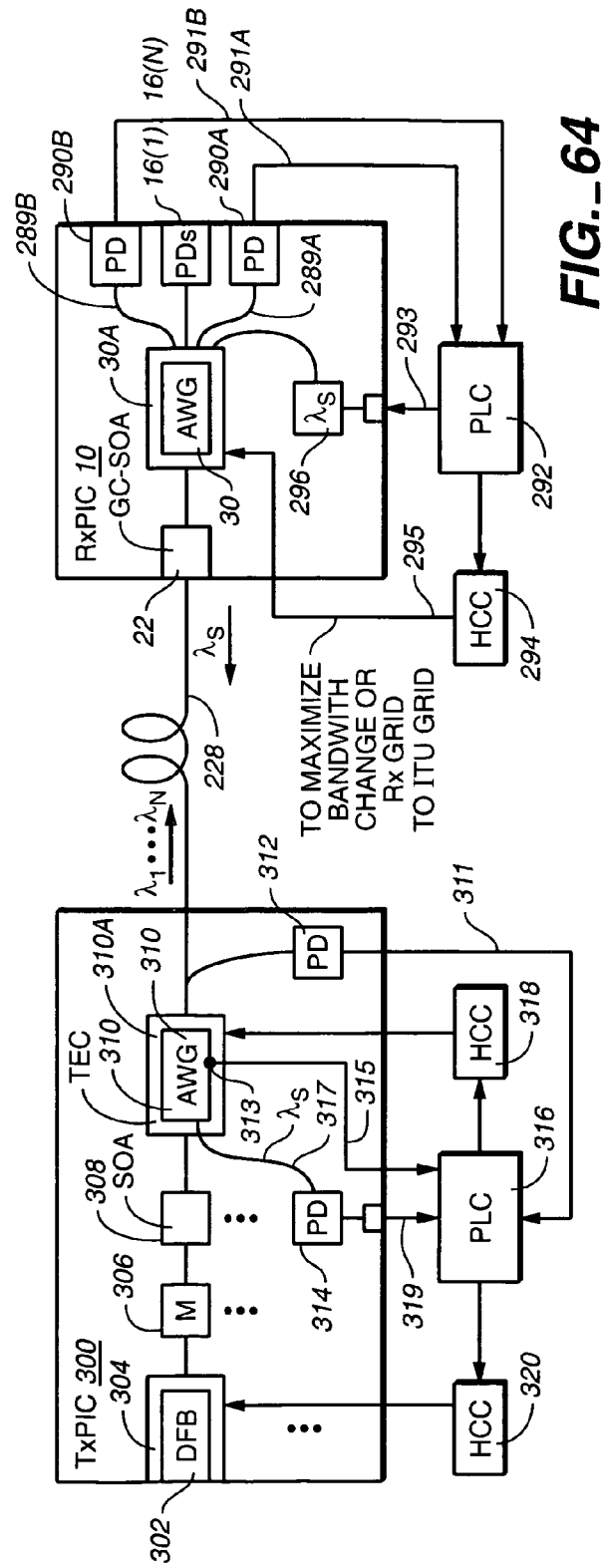

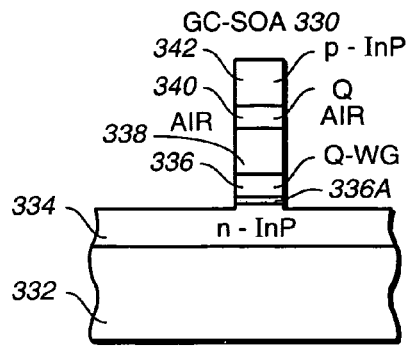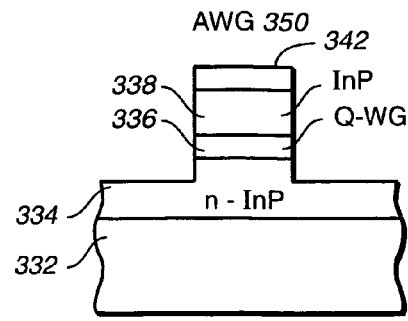
*FIG._65A*  *FIG._65B*
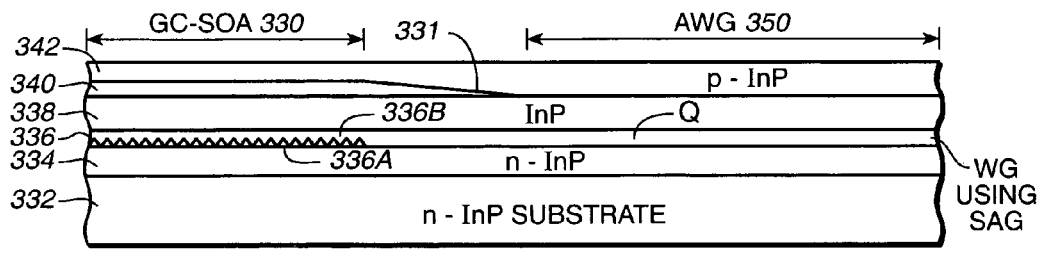
*FIG._65C*
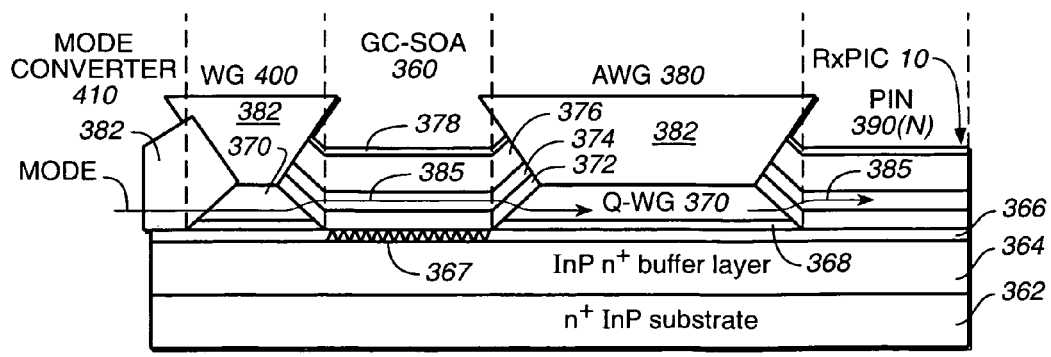
*FIG._66*

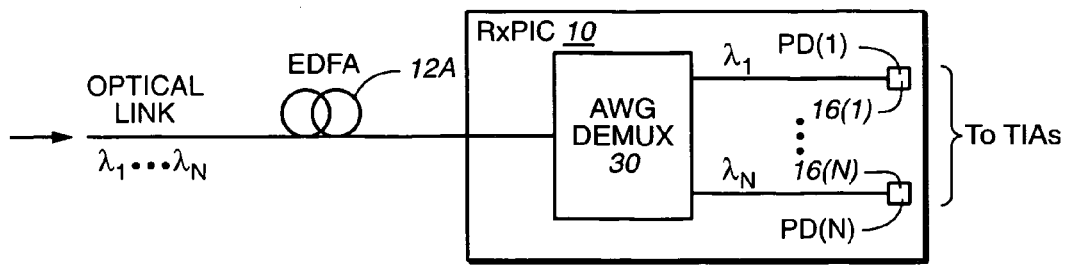
FIG._67
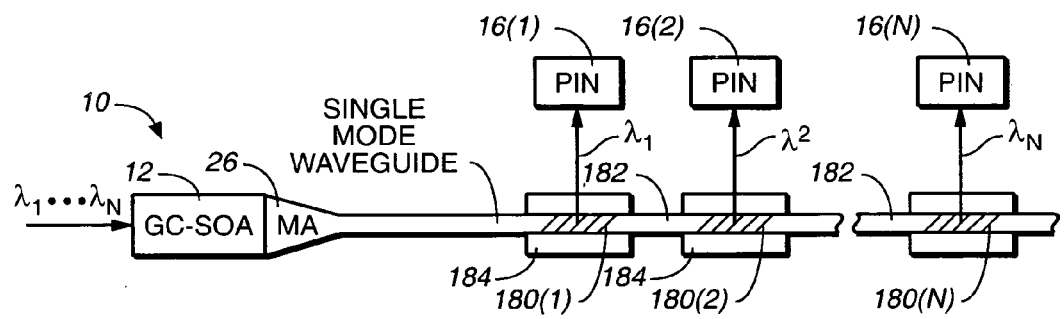
FIG._68
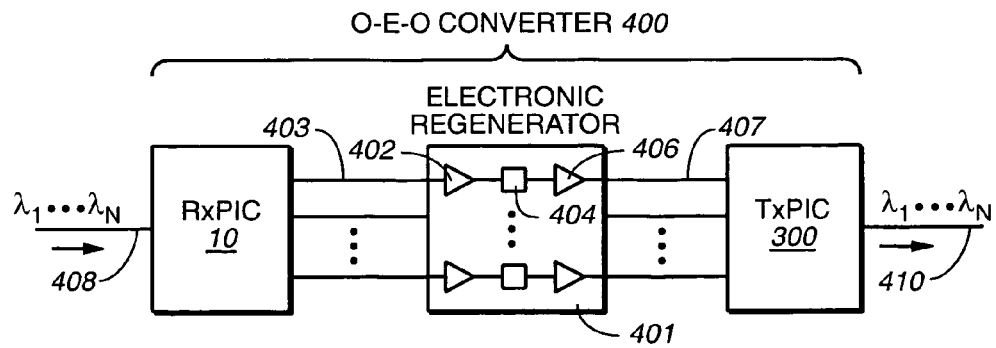
FIG._69

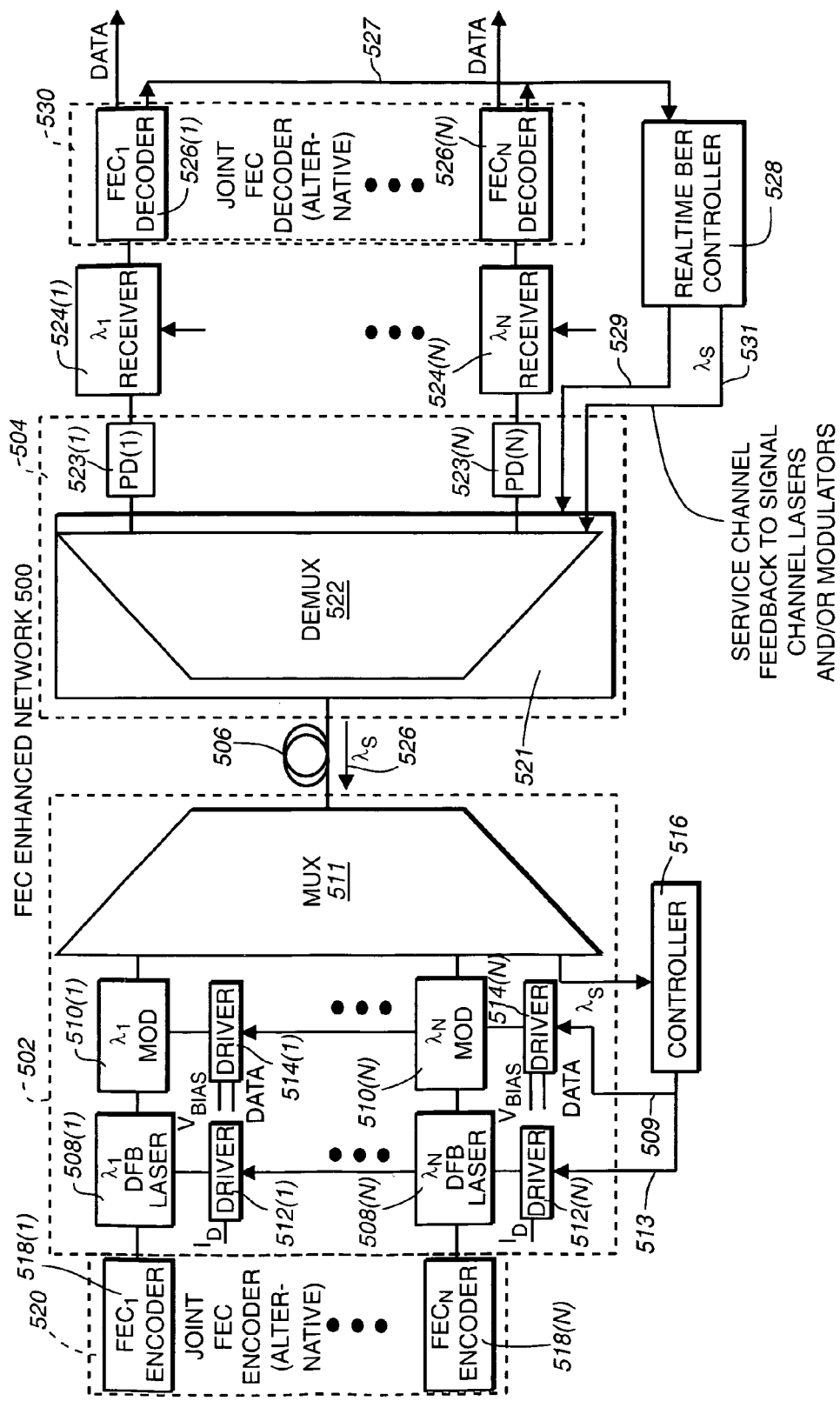
FIG._70

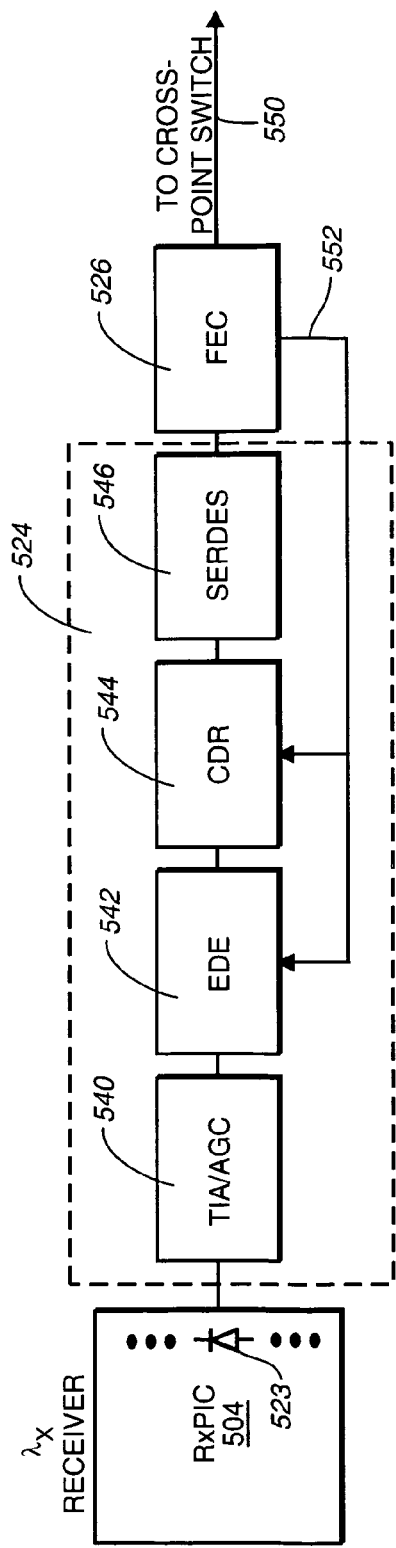
FIG._71B
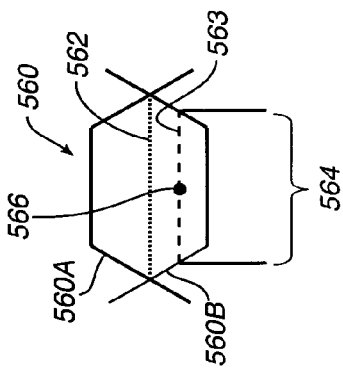
FIG._71A

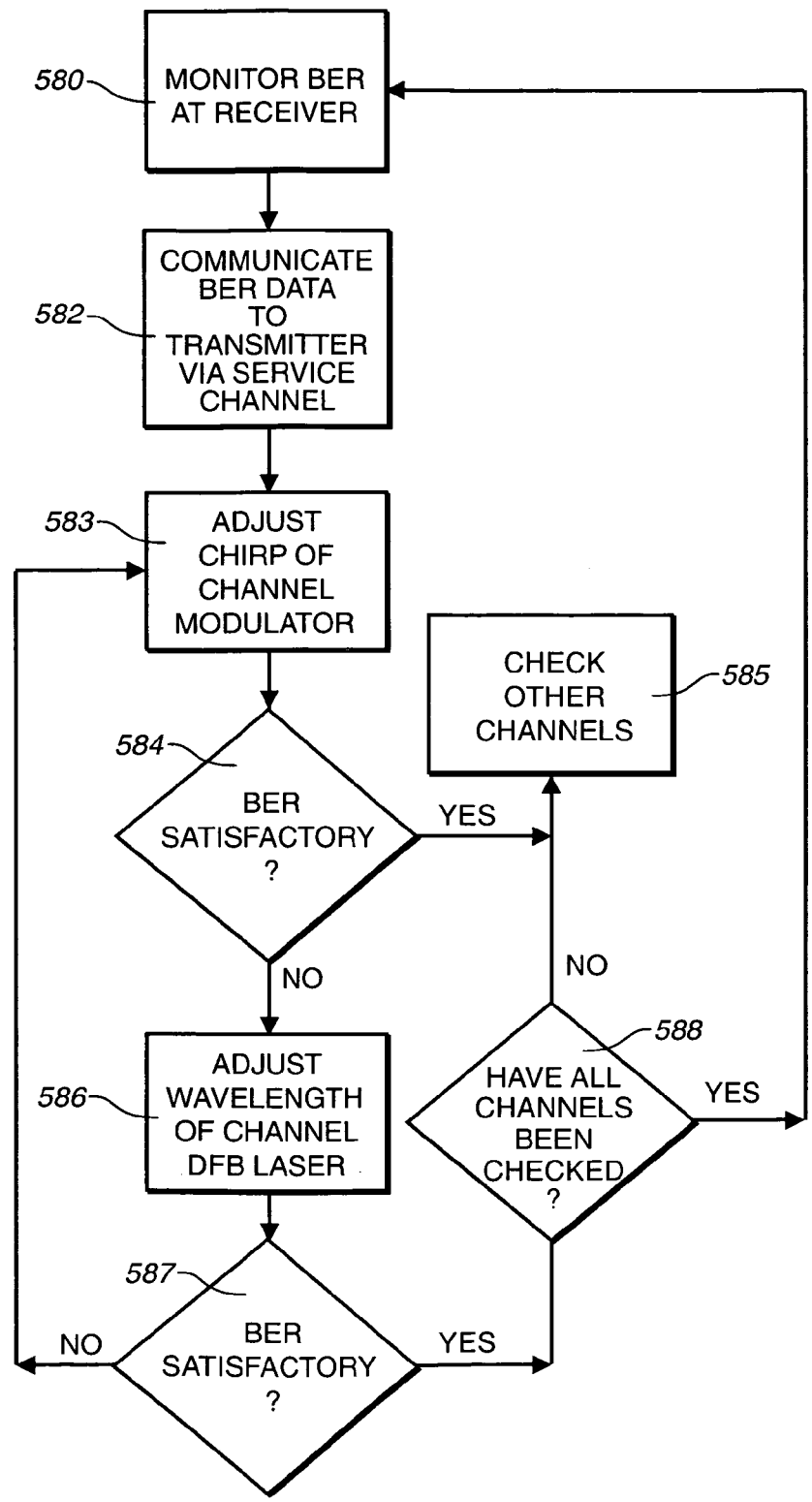
FIG._72

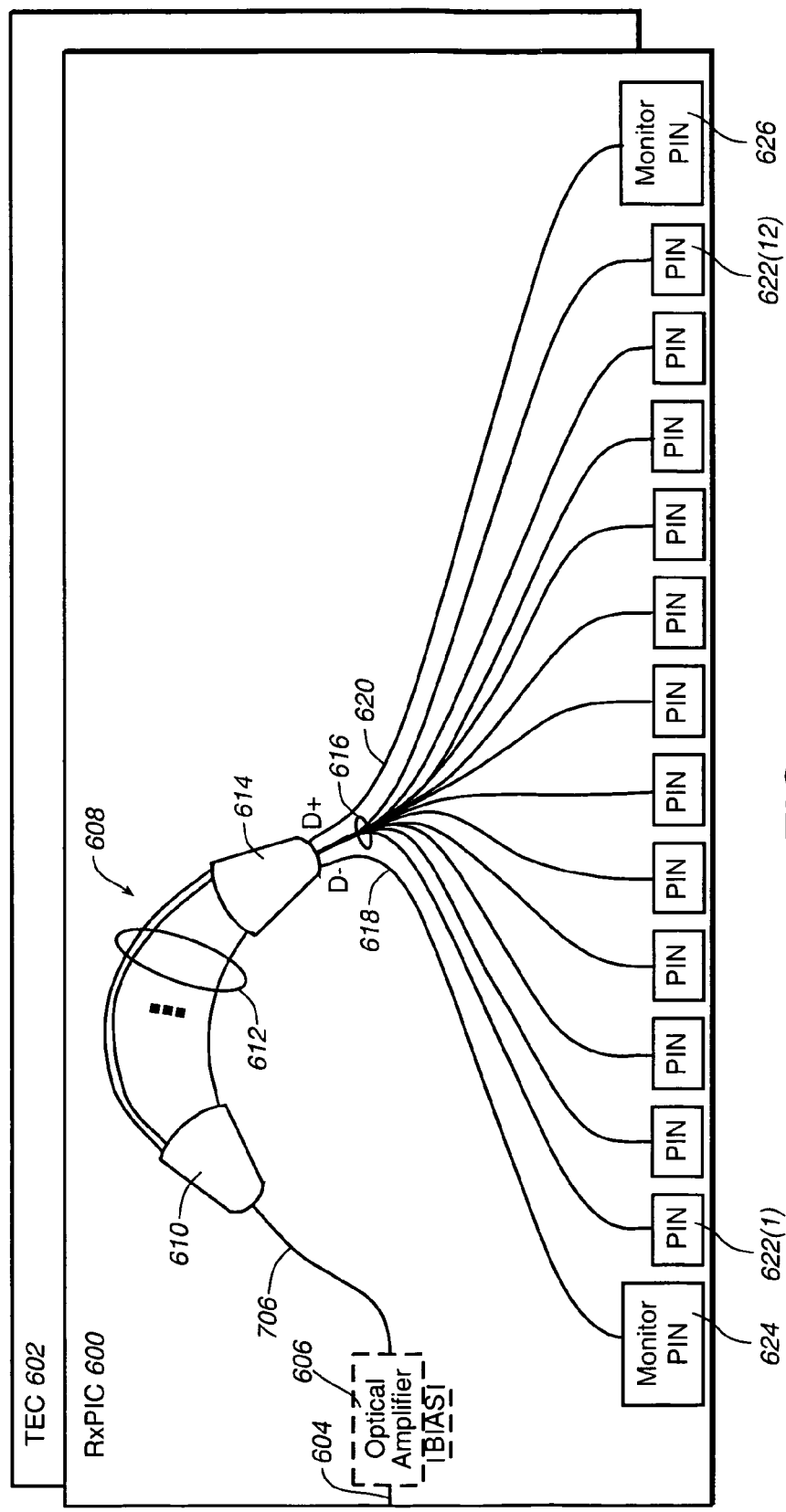
FIG._73

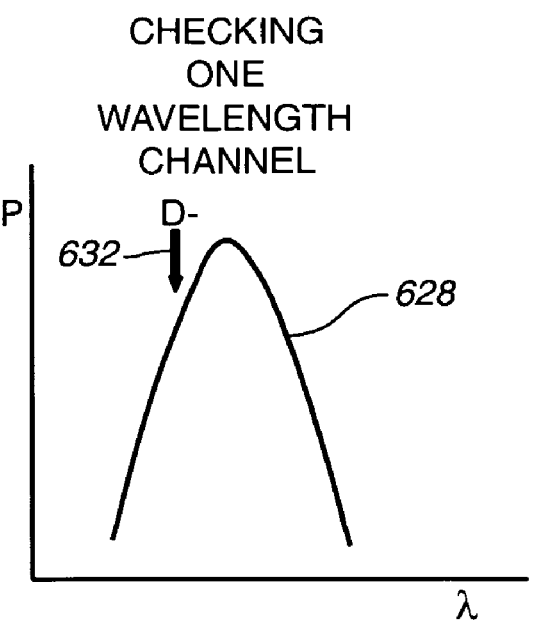
FIG._73B
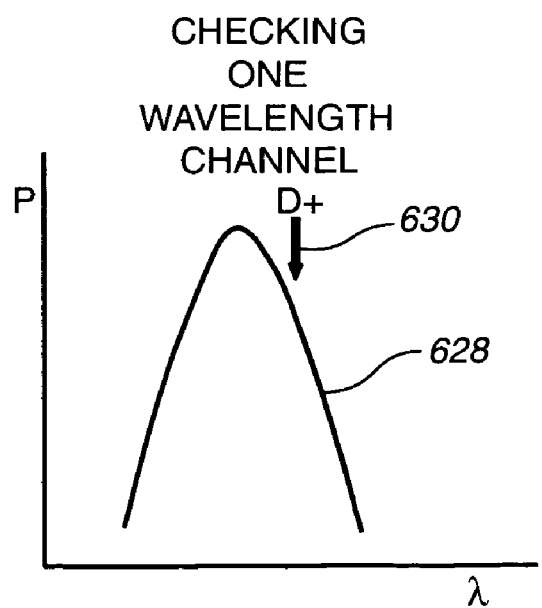
FIG._73A

OPTICAL TRANSMISSION NETWORK WITH A RECEIVER PHOTONIC INTEGRATED CIRCUIT (RXPIC) UTILIZING AN OPTICAL SERVICE CHANEL (OSC)

REFERENCE TO RELATED APPLICATION

This is continuation of U.S. non-provisional patent application, Ser. No. 10/267,304, filed Oct. 8, 2002 now U.S. Pat. No. 7,116,852 issued Oct. 3, 2006, which claims the benefit of priority of provisional applications, Ser. No. 60/367,595, filed Mar. 25, 2002 and entitled, AN OPTICAL SIGNAL RECEIVER PHOTONIC INTEGRATED CIRCUIT (Rx-PIC), AN ASSOCIATED OPTICAL SIGNAL TRANSMITTER PHOTONIC INTEGRATED CIRCUIT (TxPIC) AND AN OPTICAL NETWORK TRANSMISSION SYSTEM UTILIZING THESE CIRCUITS, Ser. No. 60/328,568, filed Oct. 9, 2001, entitled, APPARATUS AND METHOD FOR FIBER OPTICAL COMMUNICATION, now part of U.S. patent application, Ser. No. 10/267,331, filed Oct. 8, 2002; Ser. No. 60/328,207, filed Oct. 9, 2001 and entitled, PHOTONIC INTEGRATED CIRCUITS FOR DWDM OPTICAL NETWORKS, now U.S. patent application, Ser. No. 10/267,331, filed Oct. 8, 2002; Ser. No. 60/392,494, filed Jun. 28, 2002 and entitled DIGITAL OPTICAL NETWORK ARCHITECTURE, now U.S. patent application, Ser. No. 10/267,212, filed Oct. 8, 2002; Ser. No. 60/370,345, filed Apr. 5, 2002 and entitled WAVELENGTH STABILIZATION IN TRANSMITTER PHOTONIC INTEGRATED CIRCUITS (TxPICs); Ser. No. 60/378,010, filed May 10, 2002 and entitled, TRANSMITTER PHOTONIC INTEGRATED CIRCUIT (TxPIC) CHIP WITH ENHANCED POWER AND YIELD WITHOUT ON-CHIP AMPLIFICATION, now U.S. patent application, Ser. No. 10/370,345, filed Oct. 8, 2002, now U.S. Pat. No. 7,058,246 issued Jun. 6, 2006, all of which applications are owned by the assignee herein and are all incorporated herein by their reference.

BACKGROUND OF THE INVENTION

1. Field of the Invention

This invention relates generally to optical telecommunications and more particularly to the deployment of photonic integrated circuits (PICs), in particular, optical receiver photonic integrated circuits (RxPICs) and optical transmitter photonic integrated circuits (TxPICs) utilized in optical transport or transmission networks.

2. Description of the Related Art

The employment of photonic integrated circuits (PICs), also sometimes referred to as planar lightware circuits (PLCs), are on the rise in optical telecommunication systems. These devices provide the integration of both active and passive optical components on a single substrate and are integrated with other optical components to form a multifunctional optical device for use in such systems. The gravitation to PICs is strong because it leads to utility of providing an entire system function, let alone a component function, in a single chip in a single package. Compared to the deployment of discrete optical components, such monolithic PIC chips can significantly reduce the size of optical components necessary in the optical system, albeit an optical transmitter (TxPIC) or optical receiver (RxPIC), for example, as well as significantly reduce the over cost of the system.

Optical PICs are already known in the art. As related to an optical receiver on a chip, the article to M. Zimgibl et al. entitled, "WDM receiver by Monolithic Integration of an Optical Preamplifier, Waveguide Grating router and Photodiode Array", ELECTRONIC LETTERS, Vol. 31(7), pp. 581-582, Mar. 30, 1995, discloses a 1 cm by 4 mm PIC chip, fabricated in InP, that includes the integrated components comprising an optical amplifier (SOA) optically coupled to an AWG DEMUX having a plurality of different signal channel outputs each coupled to a respective photodiode (PD) in an array of on-chip photodiodes. The SOA boosts the multiplexed input channel signals. The AWG DEMUX demultiplexes the signals into separate channel signals which signals are respectively detected by the array of PDs. The optical receiver chip may also be placed on a thermoelectric cooler (TEC) so that the spectral response or wavelength grid of the AWG can be fine tuned. A similar PIC chip configuration is shown in U.S. Pat. No. 5,913,000 to Doerr et al. but relates to a laser structure without an array of photodiodes, but rather an array of second optical amplifiers in their place, and where the PIC chip facets include reflective mirror surfaces to form multiple laser cavities. Further, an article to C. Cremer et al. entitled, "Grating Spectrograph Integrated with Photodiode Array in InGaAsP/InGaAs/InP", IEEE Photonics Technology Letters, Vol. 4(1), pp. 108110, January 1992, discloses a 4 mm by 7 mm InGaAsP/InP chip comprising a grating demultiplexer integrated with a photodiode array. The grating demultiplexer comprises a slab waveguide having multiple input waveguides and output waveguides to and from the slab. The slab has one end as a reflective mirror and, thus, "mirrors" one half of a full slab waveguide structure. The output waveguides from the slab are respectively coupled to an array of photodiodes integrated on the InP chip. See also the papers of J. B. Soole et al., Integrated Grating demultiplexer and PIN array for High Density Wavelength Division Multiplexed Detection at 1.5 mm", ELECTRONIC LETTERS, Vol. 29, pp. 558-560, 1993; M. R. Amersfoort et al., "Low-Loss Phased-Array Based 4-Channel Wavelength Demultiplexer Integrated with Photodetectors", IEEE Photonics Technology Letters, Vol. 6(1), pp. 62-64, January 1994; and S. Chandrasekhar et al., "Monolithic Eight-Wavelength Demultiplexed Receiver for Dense WDM Applications", IEEE Photonics Technology Letters, Vol. 7(11), pp. 1342-1344, November 1995.

A combination WDM/PD array is shown in the article of F. Tong et al. entitled, "Characterization of a 16-Channel Optical/Electronic Selector for Fast Packet-Switched WDMA Networks", IEEE Photonics Technology Letters, Vol. 6(8), pp. 971-974, August 1994, except that, in the case here, the InGaAs/GaAs PDs are on a separate chip integrated with electronic transimpedance amplifiers, selectable switches and output limiting amplifier. Light generated from the multiple output waveguides of a separate AWG DEMUX chip is focused through a lens array to the array of photodetectors or photodiodes (PDs).

See also the article of B. Glance et al. entitled, "Applications of the Integrated Waveguide Grating Router", Journal of Lightwave Technology, Vol. 12(6), pp. 957-962, June 1994, which shows multiple applications for AWG devices with multiple inputs/outputs and their integration with various types of active components.

In some of the foregoing disclosures, optical semiconductor amplifiers (SOAs) are employed to boost the incoming channel signals such as from an optical link. Thus, the first on-chip optical component is an active component comprising an SOA to amplify the channel signals. Since these signals are of different wavelengths, however, the gain of the SOA is not equally distributed to all of the channel signals and, as a result, the signals to be amplified do not receive the same gain. This is a problem because the signals should have substantially equal intensity or power before they are demultiplexed; otherwise, some of the channel signals will have significantly degraded BER due to the dynamic range of the receiver photodiodes and transimpedance amplifiers.

OBJECTS OF THE INVENTION

It is an object of this invention to provide an optical receiver photonic integrated circuit (RxPIC) that includes an optical service channel (OSC).

SUMMARY OF THE INVENTION

According to this invention, an optical receiver photonic integrated circuit (RxPIC) comprises a semiconductor monolithic chip having an input to receive from an optical transmission link a combined channel signal originating from an optical transmitter source and comprising a plurality of channel signals having different wavelengths forming a wavelength grid. An optical decombiner is integrated in the chip and optically coupled to the input to receive the multiplexed channel signal and provide a decombined individual channel signal on an output waveguide of a plurality of such output waveguides provided from the optical decombiner. A plurality of photodetectors are also integrated in the chip and each photodetector is optically coupled to one of the output waveguides to receive a decombined channel signal and convert the channel signal to an electrical signal. A controller is coupled to receive a portion of the converted signals to determine at least one performance property of the signals and provide service channel signal as feedback about that property via the semiconductor monolithic chip to the optical transmitter source. The controller is coupled to an integrated optical service channel (OSC) on the chip that has a light source which is modulated by the service channel signal. The light source may be integrated on the chip. The optical service channel (OSC) is coupled as an input to the decombiner for transport off the chip to optical transmitter source. If there is an optical amplifier at the input of the chip, the service channel signal will be amplified by that amplifier. Such an optical amplifier may be an off-chip rare earth doped amplifier or an on-chip semiconductor optical amplifier.

An optical service channel (OSC) integrated on a TxPIC chip to receive a service signal from the optical receiver RxPIC chip. Such a TxPIC chip comprises an optical transmitter photonic integrated circuit (TxPIC) comprising a plurality of optical signal channels each including a modulated signal source with its modulated signal output coupled to an input of an integrated optical combiner to form a WDM output signal for transport off the TxPIC chip.

Another feature of this inventions is a method of monitoring and controlling a performance property of an optical receiver, such as, but not limited to, the bit error rate (BER) in an optical communication network, where the optical receiver in the optical transmission network may be a monolithic photonic integrated circuit (RxPIC) chip.

A further feature of this invention is the provision of for a wider window margin in an eye diagram of a received electrical signal in a transmission system, such as in an optical communication network.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, the same reference symbols also refer to the same parts illustrated in other drawings.

FIG. 1 is a schematic diagram of an optical receiver photonic integrated circuit (RxPIC) chip comprising this invention.

FIG. 2 is a schematic diagram of another embodiment of a RxPIC chip comprising this invention.

FIG. 3 is a detailed schematic diagram of a gain clamped-semiconductor optical amplifier (GC-SOA) and DEMUX of a RxPIC chip comprising this invention where multiple GC-SOAs are provided which also include an integrated heater for each GC-SOA.

FIG. 4 is a schematic diagram of an RxPIC chip illustrating a further embodiment comprising this invention.

FIG. 5 is a more detailed schematic diagram of the RxPIC chip of FIG. 4 comprising this invention and illustrating the optical demultiplexer as an arrayed waveguide grating demultiplexer (AWG DEMUX) in the layout of the optical components in the RxPIC chip.

FIG. 5A is a detailed schematic view diagram of the GC-SOA/AWG vernier input which is a feature of this invention.

FIG. 6 is a schematic diagram of an alternative embodiment of the detailed RxPIC chip layout of FIG. 5 comprising this invention.

FIG. 7 is a schematic diagram of a GC-SOA with greater detail of mode adaptors (MAs) at its input and output.

FIG. 7A is a schematic diagram of a GC-SOA in an RxPIC chip that includes an input waveguide to the GC-SOA at an angle relative to the chip input facet to suppress spurious inputs to the GC-SOA other than the incoming channel signals.

FIG. 7B is a schematic diagram of a plan view of a GC-SOA in a RxPIC chip where the chip includes a curved-shaped GC-SOA with its front end at an angle relative to the chip input facet to suppress spurious inputs to the GC-SOA other than the incoming channel signals.

FIG. 8A is a schematic cross sectional diagram of a specific embodiment of a GC-SOA that may be utilized in the RxPIC of this invention, illustrating an example of the semiconductor layers of the device.

FIG. 8B is a schematic cross sectional diagram of a specific embodiment of a PIN photodiode that may be utilized in the RxPIC of this invention, illustrating an example of the semiconductor layers of the device.

FIG. 8C is a schematic cross sectional diagram of a specific embodiment of an AWG that may be utilized in the RxPIC of this invention, illustrating an example of the semiconductor layers of the device.

FIG. 9 is a plan view of a GC-SOA that may be utilized in this invention illustrating a segmented electrode contact for applying a bias to the device.

FIG. 10 is a plan view of another view of a GC-SOA that may be that may be utilized in this invention illustrating a tapered electrode contact for applying a bias to the device.

FIG. 11 is schematic cross-sectional diagram of an embodiment of a GC-SOA that may be utilized in this invention illustrating an example of the semiconductor layers of the device with a longitudinal monotonically increasing GC-SOA current channel from the forward end to the rearward end of the device.

FIG. 12 is a schematic cross sectional diagram of a first type of GC-SOA that may be utilized in this invention, to wit, a DFB type GC-SOA.

FIG. 13 is a schematic cross sectional diagram of a second type of GC-SOA that may be utilized in this invention, to wit, a DBR type GC-SOA.

FIG. 14 is a schematic side view diagram of a third type of GC-SOA that may be utilized in this invention, to wit, an external injection type GC-SOA.

FIG. 15 is a schematic cross sectional diagram of a fourth type of GC-SOA that may be utilized in this invention, to wit, a VCSEL type GC-SOA.

FIG. 16 is the first of several figures following this figure schematically illustrating a first embodiment for eliminating ASE generated by the GC-SOA from a RxPIC chip.

FIG. 16A is a second embodiment illustrating another approach for eliminating ASE generated by the GC-SOA from the RxPIC chip.

FIG. 17 is a third embodiment for eliminating ASE generated by the GC-SOA from the RxPIC chip.

FIG. 18 is a fourth embodiment for eliminating ASE generated by the GC-SOA from the RxPIC chip.

FIG. 19 is a fifth embodiment for eliminating ASE generated by the GC-SOA from the RxPIC chip.

FIG. 19A is a side elevation and fUrther modification of the fifth embodiment shown In FIG. 19.

FIG. 20 is a sixth embodiment for eliminating ASE generated by the GC-SOA from the RxPIC chip.

FIG. 21 is a seventh embodiment for eliminating ASE generated by the GC-SOA from the RxPIC chip.

FIG. 22 is an eighth embodiment for eliminating ASE generated by the GC-SOA from the RxPIC chip.

FIG. 23 is a schematic plan view of an AWG DEMUX having means to provide polarization mode selectivity that may be utilized in this invention.

FIG. 24 is a schematic plan view of an AWG DEMUX having second optical amplifier means in the form of an array of optical semiconductor amplifiers (SOAs) in the arrayed arms of the AWG DEMUX that may be utilized in this invention.

FIG. 25 is a schematic side view of a type of photodetector for employment with this invention, to wit, a PIN photodiode (PD) as known in the art.

FIG. 26 is a schematic side view of another type of a photodetector for employment with this invention, to wit, an avalanche photodiode (APD) as known in the art.

FIG. 27 is a schematic side view of further type of a photodetector for employment with this invention, to wit, an interdigitated contact or MSM photodetector as known in the art.

FIG. 28 is a schematic side view of a first embodiment of a flip-chip bonded RF submount board with an RxPIC chip comprising this invention.

FIG. 28A is a schematic side view in exploded form of a second embodiment of a flip-chip bonded RF submount board with an RxPIC chip comprising this invention.

FIG. 28B is a schematic side view in exploded view of a third embodiment of a flip-chip bonded RF submount board with an RxPIC chip comprising this invention.

FIG. 29 is perspective schematic illustration of a wire bonded RF submount board with an RxPIC chip comprising this invention.

FIG. 30 is a schematic plan view of architecture for coupling staggered output PD pads formed on the RxPIC which pads are wire bonded to corresponding input pads on multiple RF submount boards to control coupling impedance.

FIG. 31 is a schematic side view of one integrated approach for forming a mode adapter (MA) at the input of a GC-SOA on the RxPIC chip.

FIG. 32 is a schematic plan view of another integrated approach for forming a mode adapter (MA) at the input of a GC-SOA on the RxPIC chip.

FIG. 33 is a schematic view of a first embodiment for eliminating the residual clamping signal emanating from the GC-SOA.

FIG. 34 is a schematic view of a second embodiment for eliminating the residual clamping signal emanating from a GC-SOA.

FIG. 35 is a schematic view of a third embodiment for eliminating the residual clamping signal emanating from a GC-SOA.

FIG. 36 is a schematic view of a fourth embodiment for eliminating the residual clamping signal emanating from a GC-SOA.

FIG. 37 is a schematic view of a fifth embodiment for eliminating the residual clamping signal emanating from a GC-SOA.

FIG. 38 is a schematic view of a first embodiment for suppressing the lasing of one of the polarization modes, either the TE mode or the TM mode, in the GC-SOA developed gain clamping laser signal.

FIG. 39 is a schematic view of a second embodiment for suppressing the lasing of one of the polarization modes, either the TE mode or the TM mode, in the GC-SOA developed gain clamping laser signal.

FIG. 40A is a schematic view of a third embodiment for suppressing the lasing of one of the polarization modes, either the TE mode or the TM mode, in the GC-SOA developed gain clamping laser signal.

FIG. 40B is a schematic view of a fourth embodiment for suppressing the lasing of one of the polarization modes, either the TE mode or the TM mode, in the GC-SOA developed gain clamping laser signal.

FIG. 41 is a schematic view of a fifth embodiment for suppressing the lasing of one of the polarization modes, either the TE mode or the TM mode, in the GC-SOA developed gain clamping laser signal.

FIG. 42 is a schematic view of a sixth embodiment for suppressing the lasing of one of the polarization modes, either the TE mode or the TM mode, in the GC-SOA developed gain clamping laser signal.

FIG. 43 is a schematic view of a seventh embodiment for suppressing the lasing of one of the polarization modes, either the TE mode or the TM mode, in the GC-SOA developed gain clamping laser signal.

FIG. 44 is a schematic plan view of a first embodiment for providing counter propagating Raman amplification to the optical transmission link from the RxPIC chip comprising this invention.

FIG. 45 is a schematic plan view of a second embodiment for providing counter propagating Raman amplification to the optical transmission link from the RxPIC chip comprising this invention.

FIG. 46 is a schematic plan view of a first embodiment of an RxPIC chip comprising this invention that includes a service channel for monitoring optical characteristics of the channel signals and forwarding information back to the optical transmitter.

FIG. 47 is a schematic plan view of a second embodiment of an RxPIC chip comprising this invention that includes a service channel for monitoring optical characteristics of the channel signals and forwarding information back to the optical transmitter.

FIG. 48 is a schematic diagram of a typical photodiode and a transimpedance amplifier (TIA) configuration as known in the art.

FIG. 49 is a schematic diagram of another typical photodiode and a differential transimpedance amplifier (TIA) configuration as known in the art.

FIG. 50 is a schematic diagram of a dual photodiode and a differential transimpedance amplifier (TIA) configuration comprising this invention.

FIG. 51 is a partial schematic diagram of the RxPIC chip comprising this invention illustrating the utilization of the TIA configuration of FIG. 50 comprising this invention.

FIG. 52 is a schematic plan view of a testing scheme of the AWG DEMUX portion of the RxPIC chip employing a thermoelectric cooler (TEC) for optimizing the peak spectrum of the AWG either through observation of all the channel signals and/or the differential signal between photodiodes to thermally tune the wavelength grid of the AWG.

FIG. 53 is a schematic plan view of a testing scheme of the RxPIC chip while the chip is still in the wafer through the provision a signal input to the SOA for on-wafer testing the response of the SOA and the AWG DEMUX.

FIG. 54 is a GC-SOA in a RxPIC chip where the gain clamped signal of the GC-SOA is also employed as a counter pump signal for providing gain to the incoming channel signals propagating on the optical link.

FIG. 55 is a schematic side elevation, similar to FIG. 28, of a flip-chip mounting of a TIA submount to the RxPIC chip comprising this invention.

FIG. 56 is an alternate embodiment of a DEMUX that may be employed in the RxPIC chip of this invention comprising an on-chip echelle grating or curved grating spectrometer.

FIG. 57 is a bandgap diagram of a tensile-strained MQW region for the GC-SOA in the RxPIC comprising this invention.

FIG. 58 is a bandgap diagram of a tensile-strained active bulk layer for the GC-SOA in the RxPIC comprising this invention.

FIG. 59 is a schematic plan view of a AWG DEMUX made temperature insensitive by having high and low dn/dT arrayed waveguide regions.

FIG. 60 is a schematic plan view of an AWG DEMUX made temperature insensitive by employing a region on the waveguide arms that has a heater or current pumped region to change the refractive index of the arms to compensate for wavelength changes. The region can include one or more regions that include an inserted material having a different coefficient of thermal expansion, such as one that decreases or increases with increasing temperature to provide a more athermal AWG structure.

FIG. 61 is an alternate embodiment to FIG. 60 wherein there are a plurality heater strips or current pumping regions which can be selectively and/or independently varied to compensate for temperature driven index changes of the AWG.

FIG. 62A is a schematic plan view of a first embodiment of a RxPIC chip of this invention employing a photo detection scheme comprising velocity matched distributed photodetectors (VMDPs).

FIG. 62B is a schematic plan view of a second embodiment of a RxPIC chip of this invention employing a photo detection scheme comprising velocity matched distributed photodetectors (VMDPs).

FIG. 63 is a schematic plan view of a third embodiment of an RxPIC chip of this invention employing a photo detection scheme comprising co-planar traveling wave photodetectors.

FIG. 64 is a schematic plan view of an optical transmitter photonic integrated circuit (TxPIC) and an optical receiver photonic integrated circuit (RxPIC) optical coupled via a point-to-point optical transmission system, with heater control of the DFB laser sources in the TxPIC and heater control of both the TxPIC and the RxPIC AWG devices to optimize the matching of the wavelength grids of these optical components.

FIG. 65A is a schematic cross-sectional view of a ridge waveguide, GC-SOA that may be utilized in this invention.

FIG. 65B is a schematic cross-sectional view of a ridge waveguide, AWG that may be utilized in this invention.

FIG. 65C is a schematic side view of an integrated ridge waveguide, GC-SOA and AWG as shown in FIGS. 65A and 65B.

FIG. 66 is a schematic side view of a GC-SOA and AWG to provide for regrowth to achieve lateral guiding with an index step to optimize for birefringence at the AWG and maintain single mode guiding in the SOA.

FIG. 67 is a schematic illustration of another embodiment of the RxPIC chip comprising this invention where the input channel signals are initially amplified with a fiber amplifier rather than a GC-SOA.

FIG. 68 is an alternate embodiment of a DEMUX that may be employed in the RxPIC chip of this invention.

FIG. 69 is an optical-to-electrical-to-optical (OEO) converter utilizing PIC circuits comprising this invention.

FIG. 70 is a schematic view of a forward error correction (FEC) enhanced system in an optical transport network with a feedback service channel to correct laser driver current or bias and modulator bias and data signal waveforms based upon FEC received at the RxPIC.

FIG. 71 is a more detailed schematic view of the RxPIC receiver system in the optical transport system of FIG. 70.

FIG. 71A is typical desired eye diagram of a channel signal in an optical transport network.

FIG. 71B is a desired eye diagram of a channel signal in an optical transport network of this invention.

FIG. 72 is a flow chart diagram of chirp control in which BER data from an RxPIC shown in FIG. 70 is communicated to a TxPIC or transceiver via an optical service channel.

FIG. 73 is schematic plan view of an RxPIC chip where the on-chip arrayed waveguide grating (AWG) of the RxPIC is temperature tuned to adjust its passband response to reduce insertion losses deploying monitoring PIN photodiodes in higher order Brillouin zone outputs of the AWG.

FIGS. 73A and 73B are graphic illustrations of checking the wavelength grid passband of the AWG as shown in FIG. 73 relative to a single laser output wavelength.

DETAILED DESCRIPTION OF THE INVENTION

Reference is now made to FIG. 1 which illustrates one feature of this invention. FIG. 1 is a diagrammatic view of integrated optical components comprising the optical receiver photonic integrated circuit (RxPIC) 10 of this invention. RxPIC chip 10 comprises a gain clamped semiconductor amplifier (GC-SOA) 12 having an input at an input facet (not shown) of chip 10 to receive, such as from an optical transmission link, multiplexed optical data signals $\lambda_1 \ldots \lambda_N$ for immediate amplification prior to signal demultiplexing. This is an important function in order to insure that the optical signal to noise ratio or OSNR is maintained at a low noise figure. More importantly, GC-SOA 12 is used instead of a SOA, such as disclosed in the M. Zirngibl et al. paper, supra. A GC-SOA. is an amplifier in which feedback is created through an established laser cavity in the amplifier around the amplifying medium so that oscillation is generated inside the amplifier cavity at a predetermined wavelength as defined by a grating formed in the amplifier cavity. This device is, therefore, a semiconductor laser amplifier having a DFB laser cavity, although the lasing cavity could also be a DBR lasing cavity within the scope of this invention. The reasons why a GC-SOA is better than a SOA in this application is to provide a gain clamped signal to eliminate loss of gain to higher wavelength channel signals and also the TE/TM gain ratio is fixed due to the presence of the gain camp signal and, therefore, this ratio does not change due to power variances in the input channel signals.

As shown in FIG. 1, the output from GC-SOA is provided to an optical demultiplexer (DEMUX) 14 where the signal channels are demultiplexed and placed on DEMUX waveguide outputs as channel signals, $\lambda_1 \ldots \lambda_N$, to respective photodiodes 16 PD(1) . . . PD(N), which produce electrical signals which are then initially amplified by low noise figure, transimpedance amplifiers (TIAs) 18 as is known in the art. The preferred demultiplexer is an arrayed waveguide grating because of its low insertion loss properties. However, it is within the scope of this invention to also include as a demultiplexer, an Echelle grating.

It is within the scope of this invention that, instead of employing an on-chip optical amplifier 12 as shown in FIG. 1, an off-chip fiber amplifier may be employed, such as EDFA 12A illustrated in FIG. 67. As shown in FIG. 67, this monolithic RxPIC chip 10 would then be comprised of integrated components comprising, for example, a demultiplexer 14 in the form of an AWG, for example, and photodetectors 16(1) . . . 16(N).

It is further within the scope of this invention that RxPIC 10 chip 10 primarily consists of an AWG and an array of photodetectors which will be explained in more detail later.

It is also with the scope of this invention that the primary components comprising this invention, to wit, a GC-SOA 12, demultiplexer 14 (preferably an AWG) and photodetector array 16 be of separate discrete optical elements. However, it will be understood by those skilled in the art the impact of their integration on a single InP chip to be a highly desirable, compact, cost effective and easily replaceable component as an optical receiver system.

It is within the scope of this application that photodiodes 16 PD(1) . . . PD(N) may be comprise of a PIN photodiode as shown in FIG. 25, or an avalanche photodiode as shown in FIG. 26, or a metal-semiconductor-metal (MSM) device comprising inter-digitized contacts as shown in FIG. 27. Examples of an avalanche photodiode are disclosed in pending U.S. patent application, Ser. No. 10/327,362 and entitled, "InP-BASED PHOTONIC INTEGRATED CIRCUITS WITH Al-CONTAINING WAVEGUIDE CORES AND InP-BASED ARRAY WAVEGUIDE GRATINGS (AWGs) AND AVALANCHE PHOTODIODES (APDs) AND OTHER OPTICAL COMPONENTS WITH AN InAlGaAs WAVEGUIDE CORE", which application is incorporated herein by its reference. Examples of MSM photodetectors are disclosed in articles of B. D. Soole, et al., entitled, "Waveguide MSM photodetector on InP", *ELECTRONICS LETTERS*, Vol. 24(24), 24 Nov., 1988; "High-Speed Performance of InAlAs/InGaAs MSM Photodetectors at 1.3 µm and 1.5 µm Wavelengths", *IEEE Photonics Technology Letters*, Vol. 2(8), August, 1989; and "InGaAs Metal-Semiconductor-Metal Photodetectors for Long Wavelength Optical Communications", *IEEE Journal of Quantum Electronics*, Vol. 27(3), pp. 737-752, March, 1991, which articles are incorporated herein by their reference.

FIGS. 62A and 62B provide for alternative type of photodetectors that may be employed on RxPIC 10 as compared to the types that have been previously explained relative to FIGS. 25-27 and comprise high speed velocity-matched distributed photodetectors (VMDPs). VMDPs are optical waveguides upon which are fabricated a plurality of photodetectors that are interconnected with optical and coplanar electrical waveguides and their quantum efficiency is dependent upon the number of photodetectors deployed in an array along the electrical waveguides. "Velocity-matched" refers to matching the velocity of the RF optics and RF signal along the optical waveguides. Each of the photodetectors in the array contribute constructively to an optimum output so that all the photodetectors in the array must operate in phase with one another relative to any signal channel in order for an optimum electrical response to be produced. In FIG. 62A, each output channel on a waveguide 39 includes an array of photodiodes 270 which produce an electrical signal proportional to the amplitude of the channel signal in a waveguide 39. The electrical signal is collected by a separate microwave transmission line 272 that is velocity matched to the optical waveguide 39 and the electrical signals are taken off of chip 10 at pads 274. See, for example, the article of L. Y. Lin et al., entitled "Velocity Matched Distributed Photodetectors With High-Saturation Power and Large Bandwidth", *IEEE Photonics Technology Letters*, Vol. 8(10), pp. 1376-1378, October, 1996, which article is incorporated herein by its reference. In FIG. 62B, TIAs 276 and limiting amplifiers 278 are integrated on RxPIC chip 10 employing InP-HBT or InP-HEMT technology.

Reference is now made to FIG. 63 which discloses another type of photodetector that may be deployed in this invention comprising traveling-wave photodetectors (TW-PDs). In FIG. 63, the arrangement comprises a photodetector 280, such as a PIN photodiode, fabricated at the end of waveguide 39 from AWG 30. Photodetector 280 is central of a parallel plate, co-planar transmission line comprising signal line 284 and ground lines 286 providing for a matched electrical termination at the output end. As an example, see the article of Kirk S. Giloney et al., entitled "Traveling-Wave Photodetectors", *IEEE Photonics Technology Letters*, Vol. 4(12), pp. 1363-1365, December, 1992, which article is incorporated herein by its reference.

As shown in FIG. 2, additional amplification of the DEMUX'ed channel signals can be provided with integrated semiconductor optical amplifiers (SOAs) 20 in the optical waveguides formed between DEMUX 16 and photodiodes (PDs) 16.

As illustrated in FIG. 3, there may be more than one GC-SOA 12A, 12B and 12B at the RxPIC input for purposes of redundancy so that the on-chip performance of these respective GC-SOAs 12A-12C can be checked relative to the ITU grid of the DEMUX 14 in order that the best performing GC-SOA can be selected, e.g., the one with the best gain, saturated power, noise figure, etc. characteristics. The number of SOAs 12 included on chip 10 is preferably in the range of about 2 to 5 such devices. Three are shown in the illustration here. However, more such devices are preferred, such a sufficient number to cover or extend slightly beyond the spectral range for DEMUX 14 where the wavelength variation of the spectral grid in the fabrication of DEMUX 14 may be not be the same for all devices formed in the same wafer or for devices formed from wafer to wafer. In this manner, the yield of RxPIC chips 10 obtainable from a wafer can be decisively increased. Once the best performing GC-SOA is selected, the input coupling of the channel signals from the fiber link can be aligned and fixed to the selected GC-SOA. The selection of performance is enhanced also by the employment of heaters 22 placed in close proximity to each GC-SOA 12A-12C so that the response of the individual SOAs 20 can be adjusted to better matched to the ITU grid of optical DEMUX 14.

Reference is now made to FIG. 4 illustrating the plan view or layout of a more detailed form of RxPIC chip 10 of this invention which further includes input optical mode adapters (MAs) 24A, 24b and 24C for the respective GC-SOAs 12A, 12B and 12C as well as respective output optical mode adapters (MAs) 26A, 26B and 26C. Passive MAs 24A-24C permit multi-wavelength beam expansion into the GC-SOAs from the single mode fiber coupled to one of the selected inputs, while passive MAs 26A-26C permit beam reduction to a single mode passive waveguide 37 connecting the respective GC-SOAs 12 to DEMUX 14. It is preferred that MAs 24 and 26 adiabatically increase and decrease the input beam, respectively, in order that the beam is gradually expanded and then contracted for lowest optical loss. Also, the use of MAs are critical from the standpoint of forming a composite beam of light that is circular and render it less critical in tolerances relative to fiber alignment of the fiber input to RxPIC 10 with regard to input MAs 24. Also, output MAs 26 provide for matching the optical mode from SOAs 12 to DEMUX 14 to insure polarization insensitivity is preserved with low optical losses and lower optical back reflections such as from downstream optical components. More will be said about these mechanisms later. Also, shown in FIG. 4 are the contact pads 28 at the output end of chip 10 for receiving the respective electric signals from PDs 16 for transfer off the chip to an RF submount board for electrical domain amplification and subsequent processing.

It would be best to have the alignment of the array of PDs 16 on chip 10 to be out of direct alignment of the axial optical path of GC-SOAs 12. Spontaneous emission (ASE generated at the selected GC-SOA 12 propagating through chip 10 will provide added noise to photodetectors 16. A scheme to spare photoconductors 16 from this noise is illustrated in FIG. 5, next to be discussed.

Reference is next made to FIG. 5 which illustrates in even more detail embodiment of this invention for RxPIC chip 10 comprising this invention. Chip 10 is formed in the InGaAsP/InP regime and, for example, may have dimensions of about 1.45 mm by 6.2 mm. Chip 10 includes a plurality of input MAs 24A-24C to expand the input beam at the channel signal input to a selected GC-SOA 12A-12C, as previously explained, and the channel signals are reduced to single mode by a respective output MA 26A-26C. The input fact to RxPIC chip 10 may include an AR coating, as may be the case of any of the other embodiments disclosed. The AR coating aids in coupling multiplexed channel signals into the chip as well as prevents internal backward reflections from occurring and interfering with the operation of the chip, particularly the operation of photodiodes 16. The signals are then provided, via a passive on-chip waveguide 37, to a vernier input of a first slab or free space region 32 of AWG DEMUX 30. It is preferred that the length of the MAs be as small as possible so as not to add to increasing the area real estate required for chip 10. The vernier input shown here comprises three different inputs to the input slab 32 of AWG 30 so that a best operational match of GC-SOA 12 to the wavelength grid of AWG 30 can be selected. Thus, through the selection of the best vernier input in the first order Brillouin zone and the best performing GC-SOA 12, the best wavelength grid alignment to AWG 30 can be selected that provides optimized wavelength matching and lowest coupling loss. This is shown in more detail in FIG. 5A, which is a bit exaggerated in scale to illustrate this invention. In FIG. 5A, there are five GC-SOAs 12A-12E shown integrated on chip 10 with their respective output waveguides 37 comprising a group of vernier inputs 37V in the central portion of the first order Brillouin zone of slab or space region 32. Because fabricating techniques may not precisely place the amplifier waveguide input at the exact position desired at the slab 32 input, the placement of a plurality of waveguide inputs along the center of the first order Brillouin zone forms a vernier permitting the selection through signal testing of the respective GC-SOAs 12 to determined which first order input provides the optimum performance in handing the multiplexed channel signals, such as in terms of signal separation, low optical noise and narrow signal bandwidth. While the best performing GC-SOA 12 may be on the wrong waveguide arm to the input of AWG 30 for best wavelength matching to the grid of the AWG, a lower performance-GC-SOA 12 may be chosen in combination with temperature tuning of AWG, via an AWG heater 30A, to optimize the matching of the wavelength grid of AWG 30 to the selected GC-SOA.

While other types of optical demultiplexers may be utilized in this invention, such as an echelle grating, a multi-channel grating demultiplexer comprising wavelength-select angled or blazed gratings, a reflector stack filter, or multimode interference (MMI) couplers.

A RxPIC chip 10 with a echelle grating type demultiplexer is shown in FIG. 56. Chip 10 comprises an integrated photonic circuit that includes GC-SOA 12, echelle grating 175 and photodetectors 16(1) . . . 16(7). Grating 175 disperses the multiplexed signal wavelengths received from GC-SOA 12 into separate signals that are reflected back to respective output waveguides 176 and associated photodetectors 16. See, for example, the papers of J. B. D. Soole et al., entitled, "WDM Detection Using Integrated Grating Demultiplexer and High Density PIN Array", *LEOS* 1992, Summer Topical Meeting Digest, pp. B7-B8, Jul. 29, 1992 to Aug. 12, 1992, Santa Barbara, Calif.; High Speed Monolithic WDM detector for 1.5 μm Fibre Band", *ELECTRONIC LETTERS*, Vol. 31(15), pp. 1276-1277, Jul. 20, 1995; and "Monolithic InP/InGaAsP/InP Grating Spectrometer for the 1.48-1.56 mm Wavelength Range", *Applied Physics Letters*, Vol. 58(18), pp. 1949-1951, May 6, 1991, all of which are incorporated herein by their reference.

A demultiplexer can also be comprised of a series of angled gratings each of which has a grating period designed to remove from the waveguide a selected wavelength channel from the propagating multiplexed channel signal. This type of demultiplexer is illustrated in FIG. 68. RxPIC 10 comprises a GC-SOA 12 to receive the incoming channel signals, $\lambda_1 \ldots \lambda_N$, which provides signal amplification after which the signals propagate through mode adaptor 26 and onto a single mode waveguide 182. Waveguide 182 contains a series of angled or blazed gratings 180(1) . . . 180(N), one for each channel signal. Each grating period is designed to have a peak reflection wavelength equal to one of the signal wavelengths, $\lambda_1 \ldots X_N$, so that each of the signal wavelength, $\lambda_1$, $\lambda_2$, $\lambda_3$, etc., is consecutively reflected out of waveguide 182 to a corresponding photodetector 16(1) . . . 16(N) at the same semiconductor layer level in the chip as waveguide 182. Photodetectors 16 may be formed along one edge of chip 10 to transfer the detected signals off-chip. Each of the gratings 180(1) . . . 180(N) may be also provided with a heater 184 in close proximity to a grating so that the gratings 180 may be individually tuned at the factory or in the field to insure that that their reflection wavelength peaks are at or very close to the respective channel signal wavelength peak for optimum detection at a corresponding output photodetector 16. By the same token, if a channel signal or signals are slight off their peak wavelengths, the respective gratings 180 can be selectively temperature tuned to be made closer to the off-peak wavelength or wavelengths. An advantage of this embodiment as an optical demultiplexer is that the clamping signal and any ASE developed at the GC-SOA 12 is directed forward along waveguide 182 and out of chip 10 providing for high OSNR in signal detection by photodetectors 16.

A reflector stack filter functioning as a demultiplexer may be of the type that has plural reflector surfaces that provide for successive reflection of peak wavelengths comprising the channel signal wavelengths spatially along the filter so that the spatial array of demultiplexed channels signals may be directed to an array of corresponding photodetectors (see U.S. Pat. No. 6,111,674 which is incorporated herein by its reference) or narrow band elliptical mirrors or elliptical Bragg reflectors of the type disclosed in the paper of Charles H. Henry et al., entitled "Four-Channel Wavelength Division Multiplexers and Bandpass Filters Based on Elliptical Bragg Reflectors", *Journal of Lightwave Technology*, Vol. 8(5), pp. 748-755, May, 1990, which paper is incorporated herein by its reference.

A multichannel grating reflector functioning as a demultiplexer is illustrated in the article of P. A. Kirby, entitled, "Multichannel Wavelength-Switched Transmitters and Receivers—New Component Concepts for Broad-Band Networks and Distributed Switching Systems", *Journal of Lightwave Technology*, Vol. 8(2), pp. 202-211, February, 1990, which is incorporated herein by its reference.

An MMI coupler device comprises a multi-mode slab waveguide, which can support several modes, with N inputs (in the case here including demultiplexing only one input is needed) and M outputs and is based upon a self-imaging property wherein an input field profile is reproduced in a single or multiple images at periodic intervals along the propagation direction of the slab waveguide. See, for example, the articles of Lucas B. Soldano et al., entitled, "Optical Multi-Mode Interference devices Based on Self-Imaging: Principles and Applications", *Journal of Lightwave Technology*, Vol. 13(4), pp. 615-627, April, 1995, and of K. Okamoto et al., entitled "Fabrication of Coherent Optical Transversal Filter Consisting of MMI Splitter/Combiner and Thermo-Optic Amplitude and Phase Controllers", *ELECTRONIC LETTERS*, Vol. 35(16), pp. 1331-1332, Aug. 5, 1999, which articles are incorporated herein by their reference.

With respect to all of these different embodiments for an optical demultiplexer, an AWG device is preferred because of its better routing and filtering characteristics. Reference is now made to FIG. 5 where an AWG 30 is shown in RxPIC chip 10. As is well known in the art, the slab 32 provides for diffraction of a multi-wavelength signal beam into a plurality of outputs to waveguide arms 34, each having a different path length. The outputs of waveguide arms: 34 are coupled to a second slab or free space region 36 where the respective channel wavelengths are place respectively on a plurality of output passive waveguides such as along the first order, central Brillouin zone of slab 36. Each of these outputs in passive waveguides 39 from WAG 30 is coupled to a respective PD 16 and the electrical signal output of the PD 16 is placed on a respective output signal pad 28 of chip 10.

GC-SOAs 12A-12C of chip 10 are provided with segmented electrodes or contacts 32, that may take on a countless number of configurations, but only a few examples are shown here with respect to FIGS. 5, 6, 9 and 10. In connection with GC-SOA 12A, two segmented electrodes or contacts 32A and 32B are shown approximately equal distance from the ends of the optical amplifier. These respective contacts 32A and 32B are respectively coupled to receive currents, $I_1$ and $I_2$. On the other hand, as shown relative to GC-SOA 12B, segmented contacts 32A and 32B are positioned closer to the output end of the amplifier. Conversely, a multiple number segment contacts 32A-32E may be utilized such as shown in connection with GC-SOA 12C. Segmented contacts 32A-32E are respectively contacted to receive different currents $I_1$-$I_5$. In each of these three different cases of GC-SOA contacts, it can be that $I_1 > I_2$ in order to improve the noise figure (NF) of the amplifier. On the other hand, if $I_2 > I_1$, then better power saturation, $P_{SAT}$, can be achieved. By placing the contacts closer to the output of the amplifier, such as shown in connection with GC-SOA 12B, improved performance relative to noise figure (NF) as well as saturation gain might be achieved. In this connection, the multiple array of segmented electrodes 32A-32E in GC-SOA 12C may be provided with a variety of distributions of applied current, for example a monotonically increasing applied current, $I_1$-$I_5$, applied respectively to contacts 32A-32E, i.e., $I_1 < I_2 < I_3 < I_4 < I_5$. or a distribution that is relatively larger at both the input and output ends than in the middle, e.g. $I_1 > I_2 > I_3$, $I_3 < I_4 < I_5$. The current distribution is optimized to provide the best noise figure and saturation power performance RxPIC chip 10 may also have an open trough or layer barrier 38 formed in the chip body which, for example, extends into the substrate of the chip for the purpose of blocking or otherwise scattering stray light out of the chip, particularly stray light (e.g. ASE) from GC-SOAs 12, so that such stray light does not affect PDs 16, i.e., does not interfere with the true channel signal sensing to be accomplished by these photodiodes for demultiplexed channel signals received from AWG DEMUX 30. If barrier 38 is an open trough, it is best that its side surface 38A be somewhat rough so that stray light propagating to the trough edge from the direction of GC-SOA 12 will be scattered out by the rough side surface of the trough and out of chip 10. On the other hand, if barrier 38 is to be filed with a light blocking or absorbing material, a number of materials may be used, which may be semiconductor, dielectric, amorphous or polycrystalline in nature.

Lastly, the input surface of chip 10 is preferably coated at its input surface 11 with an antireflecting (AR) material, as is known in the art, in order to increase the input coupling efficiency to the chip and also to eliminate spurious reflections from the facet altering the behavior of GC-SOA 12.

Reference is now made to FIG. 6 where the RxPIC layout provides for less scattered light interference between optical components but the compromise is that this necessitates larger chip real estate. However, the area real estate necessary for chip components may be reduced to some degree by fanning out the bonding pads 28 on chip 10, particularly for PDs 16 so that they are positioned along more than one edge of chip 10 as shown in FIG. 6, compared to FIG. 5 where they are aligned only along one edge of the chip. Thus, RxPIC chip 10 in FIG. 6 is larger than the RxPIC chip 10 shown in FIG. 5 and may be, for example, 4.3 mm by 4.2 mm. Also, further shown in FIG. 6 is a SOA 40 and an ASE filter 42 formed in each of the output waveguides 39 from AWG 30. SOAs 40 of selectively controlled, via an applied positive bias, or even negative bias to function as an absorber, to provide for equalization in gain across the demultiplexed channel signals emanating from AWG 30. Filters 42 have a narrow bandwidth within the channel signal spectrum to filter out other wavelengths, particularly higher wavelengths of spontaneous emission or ASE generated in SOAs 40.

It should be noted in this embodiment as well as previous embodiments that GC-SOAs 12 generate amplified spontaneous emission or ASE. Another reason why AWGs are the preferred choice for demultiplexing channel signals on-chip is because of the narrow wavelength filter quality of AWG 30 can filter out the clamping signal associated with the GC-SOA which are in the bandwidth of ASE.

It is desirous to keep photodetectors 16 positioned out of direct axial alignment with the GC-SOAs 12 so as to prevent spontaneous emission from these devices from being detected by PDs 16. This is accomplished by the placement of the outputs of GC-SOAs 12 not to be in direct optical alignment with PDS 16. However, this is not always possible to one hundred percent because the chip size may become too large in the direction 44 so that it is more apt to break during processing and becomes more difficult to manage for placement in a hermetic package. In the embodiment of FIG. 6, therefore, a trough (not shown) may be utilized in the manner of trough 38 illustrated in FIG. 5.

As indicated in the previous embodiment, multi-segment SOA contacts 32 aid to minimize the total current drawn by these devices, particularly in the upstream portion of the device where the gain should be higher. Moreover, if the saturation power is not required to be too high, the full bias applied to reach saturation need not be applied at the downstream end of these devices. The last electrode segment 32C may, alternatively, be employed to measure photocurrent of the GC-SOA 12 to monitor its gain and correspondingly increase or decrease the gain as necessary to optimize the operation of the device.

Since the optical power increases from the upstream end towards the downstream end of a GC-SOA then the optimum use of pump current in a GC-SOA should increase towards the downstream end if it is desired to avoid saturation effects. This can be accomplished in the FIG. 6 embodiment by placing less bias on electrode segments 32A compared, for example, to segments 32B and 32C. Thus, for example, the applied bias may be controlled such that $I_3 > I_2 > I_1$. Alternatively, as shown in FIG. 9, the electrode segments 44 may be monotonically increasing in size toward the downstream end of GC-SOA 12 so that for equal biases the currents will vary, such that resulting currents drawn via electrode segments 44A-44F, due to their area, would be 44F>44E>44D>44C>44B>44A. Another alternative is shown in FIG. 10 where electrode segment 46 is tapered so as to be monotonically increasing in segment contact area from the upstream end to the downstream end of the device. Thus, monotonically increasing current will be supplied along the length of GC-SOA 12.

A further embodiment relating to current control to GC-SOA 12 is shown in FIG. 11 where a cross-section of GC-SOA 12 is shown, in particular at the region of the GC-SOA at its downstream end. In FIG. 11, GC-SOA 12 comprises a buffer layer 62 of n-InP on an n-InP substrate 60 followed by a grating layer 64 of InGaAsP, which is also referred throughout the description in this application as a "Q" layer or "Q" multi-quantum well region, meaning a "InGaAsP quaternary" layer or region. Also, it should be realized that a semi-insulating substrate, such as InP:Fe or InP:O, may be used instead of semiconductor substrate, e.g., n-InP with an appropriate change in metal contacting as is known in the art. Q layer 64 is followed by an InP layer 66 that smoothes out the growth surface for the growth of the amplifier active region 65 which is Q layer or quantum well region. This is followed by the growth of confinement layer 68 of undoped or p-doped InP. At this point, the initial MOCVD growth process is completed, a selective etch is made to buffer layer 62, for example, and a second growth comprising the growth of current blocking layer 74 is accomplished which may be, for example, InP:Fe, InP:O or InP:O:Fe, followed by a selective etch though the overgrown blocking layer 72 to InP confinement layer 68. This isotropic etch step is accomplished with a tapered mask so that the width of opening 69 formed along the length of the GC-SOA monotonically increases from the upstream end to the downstream end of the device, the largest width being as shown in FIG. 11. Then, a third growth is accomplished comprising cladding layer 70 on p-InP followed by the growth of the contact layer 72 p$^+$-InGaAs. Thus, the resulting structure is a tapered current channel formed along the optical axis of GC-SOA 12 so that the gain created through contact layer 72 monotonic increases from the upstream end to the downstream end of the device.

Reference is now made to FIG. 7 which illustrates a plan view of a particular embodiment for GC-SOA 12 and its optically coupled MAs 24 and 26. The similar structural device is shown in the paper of P. Doussiere et al., entitled "1.55 μm Polarization Independent Semiconductor Optical Amplifier with 25 dB Fiber to Fiber Gain", *IEEE Photonics Technology Letters*, Vol. 6(2), pp. 170-172, February, 1994, which paper is incorporated herein by its reference. This figure in particular illustrates the waveguide layer of the device where the optical mode of the multiplexed signal is initially expanded in input MA 24, amplified in GC-SOA 12 (unlike the device in the paper to Doussiere et al.) and then the optical mode is converted back to single mode via output MA 26 for proper mode entry into waveguide 37 and AWG 30. The cavity of GC-SOA 12 includes a light feedback mechanism to provide a laser signal at a frequency not within the bandwidth of the channel signals. As will be seen later in FIG. 8A, the feedback mechanism may be a grating. Another such mechanism would be built-in mirrors at the laser signal wavelength at each end of the GC-SOA cavity.

Reference is now made to FIG. 7A showing another embodiment for GC-SOA 12 and MAs 24 and 26. In this embodiment, RxPIC chip 10 includes an input waveguide formed in the chip for receiving the multiplexed channel signals, $\lambda_1 \ldots \lambda_N$, from an optical link via optical fiber 46. To be noted is that input waveguide 48 is curved relative to input facet 52. Fiber 46 is angularly disposed relative to input facet 52 and is aligned to optimize the coupling of the signal into input waveguide 48. It then is mode expanded via MA 24, amplified by GC-SOA 12, mode contracted via MA 26 and propagates on waveguide 37 to AWG 30. In the InP regime, these waveguiding components 48, 24, 12, 26 and.37 may utilize a light propagating waveguide comprised of InGaAsP or Q, which is cladded by n-type and p-type InP layers as shown in the paper to P. Doussiere et al. The angularity of input waveguide 48 relative to a normal to the input facet 52 may be several degrees, in the case here shown as 7°. Input facet 52 also includes an antireflecting (AR) coating 54 to reduce stray or scattered light from reflecting back into input waveguide 48. Also, the angularly disposed input waveguide 48 at 7° further reduces input facet reflectivity. Curved waveguide 48 to facet 52 prevents optical feedback into the cavity of GC-SOA 12. Also, undesired reflections are caused from input facet 52 where optical fiber 46 is butt coupled to RxPIC 10 and these reflections can affect the incoming signals, such as, changes in intensity, which is undesirable in DWDM applications.

A further shape for GC-SOA 12 and its associated MAs 24 and 26 may be of the type shown in the paper to Hatakeyama et al., entitled, Uniform and High-Performance Eight-Channel Bent Waveguide SOA Array for Hybrid PICs", *IEEE Photonics Technology Letters*, Vol. 13(5), pp. 418-420, May, 2001, which paper is incorporated herein by its reference. The waveguides, comparable to waveguides 48 and 37, as well as coupled MAs, comparable to MAs 24 and 26, are bow-shaped so that the straight SOA section and the MAs/passive waveguides are smoothly coupled by an 820 µm curvature. The SOA in this paper, however, is not gain-clamped and is utilized in a different application (switching) and the SOA active layer and the MAs/passive waveguides are one and the same layers.

In FIG. 7B, GC-SOA 12 is also curved with expanding mode adaptor 24 provided at input facet 52 to receive the incoming multiplexed channel signals. The grating for the laser signal of GC-SOA 12 may be provided only in the downstream section 12G1 or, alternatively, could be provided, as well, in the upstream curved section 12G2 where the gratings in both sections are normal to direction of light propagation and the pitch of the grating in section 12G2 is greater than that in section 12G1. See U.S. Pat. No. 6,008,675, and FIG. 3, which patent is incorporated herein by its reference.

There are different types of gain clamped-semiconductor optical amplifiers that may be utilized in connection with this invention. FIG. 12 shows a first and preferred type comprising a DFB type GC-SOA 70 which basically comprises a plurality of semiconductor layers deposited on an n-InP substrate 72. These layers, in sequence, comprise a n-InP confinement layer 74, a Q grating layer 76 within which is formed a periodic grating to cause lasing at a clamp signal frequency, an InP smoothing layer 78, an active region 80 such as a plurality of quantum well layers of InGaAsP, which also functions as the waveguide layer of the device, a p-InP confinement layer 82, a p$^+$-InGaAs contact layer 84, followed by a metal contact 86. Carrier recombination occurs in active region 80 to provide for multiplexed signal amplification as well as lasing action at the clamping signal wavelength, $\lambda_S$, for providing a clamping gain function, which wavelength is within the gain bandwidth of SOA 70 but outside the wavelength grid of wavelengths, $\lambda_1 \ldots \lambda_N$, to be amplified by the SOA. See for example, published patent application EP 0639876A1, published Feb. 22, 1995, which is incorporated herein by its reference.

FIG. 13 illustrates another type of GC-SOA comprising a DBR type GC-SOA 90 illustrated in FIG. 13, having a plurality of layers formed on a n-InP substrate 92 comprising, in sequence, confinement layer 94, grating layer 96 with distributed feedback grating regions 96A and 96C and central gain region 96B, smoothing layer 98 of InP, Q region 100 comprising an InGaAsP layer or quantum well layers of this quaternary, confining layer 102 of p-InP, contact layer of p$^+$-InGaAs, and segment contacts 106A, 106B and 106C. See the article of D. Wolfson et al., entitled, "Detailed Theoretical Investigation of the Input Power Dynamic Range for Gain-Clamped Semiconductor Optical Amplifier Gates at 10 Gb/s", *IEEE Photonic Technology Letters*, Vol. 10(9), pp. 1241-1243, September, 1998, which article is incorporated herein by its reference. With respect to this article, either a DBR GC-SOA with active DBR grating regions or passive DBR grating regions may be utilized. In the case of a passive type, contacts 106A and 106C to the DBR grating regions would not be pumped. However, in the case of an active type, contacts to the DBR grating regions 106A and 106C would be pumped. The latter case is preferred because the currents, $I_1$ and $I_3$, can be varied to tune the period between these grating regions in order to selectively tune the laser clamping signal. In this manner, the tuning of the clamping signal can be easily accomplished outside of the amplification bandwidth of the incoming signals, $\lambda_1 \ldots \lambda_N$, thereby enhancing the manufacturing yield of chips 10 incorporating these types of devices. Current $I_2$ adjusts the gain of the SOA. Such an arrangement for adjusting the gain can include the adjustment of all three contacts 106A, 106B and 106C and also by providing a difference in the currents $I_1$ and $I_2$ with $I_1$ remaining constant, for example, will also adjust the gain of the amplifier.

It is within the scope of this invention that grating regions 96A and 96C in FIG. 11 can be chirped so that through the employment of multi-segment contacts 106A, 106B and 106C the tunability range of the clamping signal can be greater over a larger range of tunable wavelengths.

FIG. 14 illustrates a still further type of GC-SOA comprising, in this case, a SOA 110. SOA 110 is shown here as a discrete component but is integrated into RxPIC 10, and is provided at its input with an injected gain clamping signal along with the multiplexed multi-wavelength signals, $\lambda_1 \ldots \lambda_N$, from the optical link. The gain clamping signal may be optically coupled to the input of chip 10 from an external source or, alternatively, may be integrated in a separate region of RxPIC chip 10 and optically coupled into the input waveguide, such as, for example, waveguide 48 in FIG. 7A, into SOA 110. SOA 110 comprises n-InP substrate 112 upon which is epitaxially deposited lower confinement layer 114 of n-InP, waveguide core and active region 116 of Q, either an InGaAsP layer or multiple quantum wells of this quaternary, upper confinement layer of p-InP 118, and contact layer 119 of p$^+$-InGaAs. In this embodiment, the clamping signal can also be tuned or changed. Also, it is within the scope of this invention to also tune this clamping wavelength to be at a Raman amplification wavelength with counter propagating of the Raman signal so that it can be coupled out of the RxPIC chip 10 via its input port for coupling into the optical fiber link and counter propagating therein to amplify the incoming signals, $\lambda_1 \ldots \lambda_N$.

Reference is now made to FIG. 15 which is a further embodiment of a GC-SOA 110A that may be integrated into RxPIC chip 10 comprising this invention. GC-SOA 110A comprises a vertical cavity surface emitting laser (VCSEL) having a n-InP substrate 112A upon which is epitaxially deposited (following the initial deposit of a n-InP buffer layer) a stack of semiconductor DBR layers comprising bottom mirror 127, confinement layer 116A of n-InP, Q waveguide layer 118A, spacer layer 120A of InP, active region 122 comprising a Q layer or a Q-QW region, confinement layer 124 of p-InP, a stack of semiconductor DBR layers comprising top mirror 128 and a contact layer 123 of P$^{++}$-InGaAs. Bottom and top DBR mirrors 127 and 128 may be comprised of 20 to 50 layers of InAlGaAs layers of alternating different mole fractions, or alternating layers of InAlAs/InGaAs or InAlGaAs/InP or InGaAsP/InP. This is followed by the necessary metallization comprising p-side metal contact 125 and metal contact 129. Operation through current and bias of GC-SOA 110A provides lasing action producing gain clamping signal 117A between mirrors 127 and 128 providing gain at active region 122 for amplification of the channel signals, $\lambda_1 \ldots \lambda_N$, propagating in waveguide layer 118A. An advantage of deploying VCSEL GC-SOA 110A is that the portion of the gain of clamping signal 117A not utilized can exit the chip via the top or bottom of amplifier 110A since DBR mirrors 127 and 128 are not 100% reflective. On the other hand, amplifier 110A is more difficult to fabricate than many of the other embodiments disclose herein. There are several other ways of eliminating the unutilized gain of the clamping signal which will be described latter.

There is also a Mach-Zehnder (MZ) type of SOA that may be utilized in this invention. In this case, the clamping signal can be coupled into the MZ-SOA.

It should be noted that in all of the forgoing embodiments of this invention, the gain clamping signal can be either on the long wavelength (red) or short wavelength (blue) side of the bandwidth or wavelength spectrum of the multiplexed channel signals.

Reference is now made to FIGS. 8A, 8B and 8C which respectively disclose representative InP-based embodiments, in cross-section, comprising a DFB GC-SOA 120, a photodetector, shown here as a PIN photodiode 16, and a grating arm 34 of AWG 30. In FIG. 8A, DFB GC-SOA 120 comprises a first epitaxial growth process on n-InP substrate 112 upon which is epitaxially deposited in sequence a n-InP buffer layer 124, a lower confinement layer 126 of n-InP, Q grating/waveguide layer 128 (bandgap of about 1.3), an InP spacer layer 130 (bandgap of about 1.4), active/waveguide region of Q-QW layers 132 (bandgap of about 1.5), and upper confinement layer 134 of p-InP. Next, a selective etchback is performed with masking of the yet to be defined current confinement region 129, followed by a second epitaxial growth process comprising blocking layers which comprise a first layer 131 of n-InP followed by semi-insulating (SI) layer 133 of InP:Fe, InP:O or InP:O:Fe, and a third layer 141 of p-InP. Masking over the current confinement region 129 of the formed device is removed and a third epitaxial growth process is commenced comprising cladding layer 135 of p-InP, followed by contact layer 136 of p$^+$-InP, which may be optional here but is desired elsewhere in the integrated chip, and thence contact layer 138 of p$^+$-InGaAs. Device 120 is completed with p and n electrodes 138 and 139. The channel signals propagate along active layer 132 with evanescent overlap with waveguide layer 128 and these signals absorb gain and are amplified. Layer 128 also includes a DFB grating 128A for generation of the gain clamping signal.

It should be realized that the fabrication of GC-SOA 120 is done in conjunction with other optical components included in integrated form on RxPIC 10. Thus, the epitaxial fabrication sequence in the description here may be modified or include other steps so that the layers and structures of such components can be also be added or otherwise realized. This same statement also applies relative to the structures shown in FIGS. 8B and 8C.

In conjunction with the GC-SOA 120 of FIG. 8A, reference is now made to FIGS. 31 and 32 which illustrate input mode adaptors or converters 24 that may be employed for GC-SOA 12 or 120. In this connection, with reference to FIG. 31, the mode adaptor taper 24 is in the vertical plane of PIC chip 10 whereas, in FIG. 32, the mode adapter 24 is tapered in the horizontal plane of PIC chip 10, i.e., in the plane of its as-grown layers. In FIG. 31, generally the same layers are shown as in the case of previously described FIG. 8A. However, with a selective masking technique, such as selective area growth (SAG), taper 24 may be formed in Q active region 132 during its growth to provide for an adiabatic expansion of the input light comprising channel signals, $\lambda_1 \ldots \lambda_N$. In this connection, see U.S. Pat. No. 6,141,477, which patent is incorporated herein by its reference. Patent '477 illustrates such a taper at the output end of an active region rather then the input end of an active region. Such an output taper can be also employed at the output end of GC-SOA 12 of FIG. 31.

In FIG. 32, the input tapered mode adapter 24 is shown in the horizontal plane. In fact, tapering can be provided in both the vertical and lateral directions to provide an input or output mode adapter 24 or 26 that adiabatically transform the input or output light as taught in U.S. Pat. No. 6,174,748 relative to output light, which patent is incorporated herein by its reference. In patent '748, the purpose is to produce an output beam of substantially circular mode profile, which need not be the case here as long as the multiplexed channel signals are adiabatically converted to single mode.

Reference is now made to FIG. 8B which illustrates a cross-section of a photodetector that may be utilized in RxPIC chip 10. Photodetector 140 is a PIN photodiode comprising multiple epitaxially deposited layers, some of which are not necessary to its operation but present because of their necessity for other optical component(s) on the same monolithic chip 10. The structure comprises, as is the case of GC-SOA 120, a first epitaxial growth process of n-InP substrate 122 upon which is epitaxially deposited in sequence a n-InP buffer layer 124, a lower confinement layer 126 of n-InP, Q layer 128 (bandgap of about 1.3 with no grating 128A provided in this portion of the chip), an InP spacer layer 130 (bandgap of about 1.4), active/waveguide region of Q-QW layers 132 (bandgap of about 1.5), and upper confinement layer 134 of p-InP. Next, a selective etchback is performed with masking of the yet to be defined current confinement region 129, followed by a second epitaxial growth process to form current blocking layers comprising a first layer 131 of n-InP followed by SI layer 133 of InP:Fe, InP:O or InP:O:Fe and a third layer of p-InP. Masking over the current confinement region 129 of the formed device is then removed and a third epitaxial growth process is commenced comprising cladding layer 135 of p-InP. This is followed by the deposition of contact layer 136 of p$^+$-InP and dielectric passivation layer 137. Contact layer 136 is defined by dielectric layer 137 which may be SiO$_2$ or other such dielectric. The device is completed with a p-side metal contact 138 and a n-side metal contact 139. It should be noted that GC-SOA 120 is substantially the same as PIN photodiode 140 except that waveguide layer 128 contains no grating at photodiode 140. Q layer 128 at photodiode 140 functions as a carrier depletion device by being reversed biased and generating a current signal proportional to the light entering the photodiode. Also, as will be realized from the previous description of RxPIC chip 10, there are N such photodiodes 140 (or 16) formed on the chip.

Reference is now made to FIG. 8C which illustrates the epitaxially deposited layers for AWG 130 such as AWG arrayed arms 34 as well as representative of cross-sections of input and output waveguides 37 and 39. FIG. 8C represents an exemplary cross-section of any of these waveguide structures comprising AWG 130. The slab or space regions 32 and 36 of AWG 30 would have the same composite structure except the waveguiding region would have a larger extent in the lateral direction. As in the case of the optical components 120 and 140 in FIGS. 8A and 8B, a first epitaxial growth process on n-InP substrate 122 comprises epitaxial deposition, in sequence, a n-InP buffer layer 124, a lower confinement layer 126 of n-InP, Q waveguide AWG layer 128 (bandgap of about 1.3 with no grating in this portion of the chip), an InP spacer layer 130 (bandgap of about 1.4), active region of Q-QW layers 132 (bandgap of about 1.5 but having no direct function in AWG 30), and upper confinement layer 134 of p-InP. Next, a selective etchback is performed with masking to define waveguide structure 127, followed by a second epitaxial growth process comprising cladding layers (in previously described structures of FIGS. 8A and 8B functioning as blocking layers) comprising a first layer 131 of n-InP followed by SI layer 133 and a third layer 135 of p-InP. It is within the scope of this invention that waveguide 127 be not covered, i.e., it can be an air-exposed waveguide or, alternatively, other layers may be utilized for burying waveguide 127, such as, $SiO_2$, glass (silica), BCB, ZnS or ZnSe as examples.

The preceding described embodiments of FIGS. 8A (GC-SOA), 8B (PD) and 8C (AWG) are examples of buried types of devices. On the other hand, these devices can be deep ridge waveguide devices as illustrated, for example, in FIGS. 65A, 65B and 65C. GC-SOA 330 in FIG. 65A, along with AWG 350 in FIG. 65B, comprise a n-InP substrate 332 upon which are epitaxially deposited n-InP confinement layer 344, Q-grating/waveguide layer 336 (with grating layer 336A and smoothing layer 336B), and undoped InP layer 338. This is followed by the growth of active region 340 in GC-SOA 330 employing selective area growth (SAG) so as to taper this layer at 331 as shown in FIG. 65C. This is followed next with the growth of p-InP confinement layer 342 over both GC-SOA 330 and AWG 350. Then an etchback is performed to form the deep ridge waveguide structures as shown in FIGS. 65A and 65B. Note that the ridge is formed back through the waveguide core 336 to provide for birefringence at the AWG and ease of manufacturability, i.e., providing for less epitaxial growth steps. These structures may be exposed to air or covered with a high refractive index material such as BCB, ZnS or ZnSe.

To be noted in FIG. 65C, the waveguide layer 336 is continuous. However, through several epitaxial growth steps, the regrowths provide for lateral guiding with an index step optimized for birefringence at the AWG and single mode guiding at the GC-SOA or the photodetector. In this connection, reference is now made to FIG. 66. FIG. 66 shows a longitudinal cross-section of RxPIC 10 comprising input mode converter 400, GC-SOA 360, AWG 380 and PIN photodetectors 390(N). A typical process for fabrication of this structure is a first growth process comprising the deposition of a n⁺-InP buffer layer 364 followed by the deposition of a Q-grating layer 366, followed by an n-InP cap or stop etch layer (not shown due to subsequent removal). Next, a selective dry etch employing a photoresist mask is made in Q layer 366 to form DFB grating 367 for GC-SOA 360. Next, a second growth process is initiated comprising an undoped-InP planarization layer 368 to planarize over grating 367. This is followed by a third growth process comprising the deposition of Q-waveguide layer 370 and thence an n-InP cap or stop etch layer (not shown due to subsequent removal). Then a photoresist mask is applied to the area of AWG 380 and the AWG is defined via selective etching. Then, waveguide layer 370 over the regions comprising GC-SOA 360 and PIN photodetectors 390 are etched away. This is followed by a fourth epitaxial growth process for overgrowing the grating 367 as well as forming active region 374 for both GC-SOA 360 and PIN photodetector 390. First, an undoped InP layer 372 is deposited followed by a Q-active layer or MQW active region 374, followed by p-InP layer 376 and contact layer 378 of p⁺-InGaAs. These layers 372, 374, 376 and 378 are then etched over mode converter 400 and AWG 380. Subsequent processing provides for a buried waveguide structure such as shown in FIGS. 8A, 8B and 8C or a ridge waveguide structure such as shown in FIGS. 65A and 65B. The etched regions 382 over mode converter 400 and AWG 380 may be overlaid, for example, with InP:Fe, InP:O, BCB, ZnS or ZnSe. Arrow lines 385 in FIG. 66 shows the path of the channel signal mode as it propagates through the one illustrated signal channel of RxPIC 10.

FIGS. 16-22, 37 and 54 relate to various ways of either eliminating the amplified spontaneous emission (ASE) or residual laser gain clamping signal, or both, from RxPIC chip 10. The residual gain clamping signal and ASE generated by the amplifying function of GC-SOA 12 or 120 is undesirable on chip 10 as it will interfere with the accurate detection functioning of photodiodes 16 or 120. When current is injected into GC-SOA 12 or 120, ASE is emitted which is optical noise that interferes with the detection response of photodetectors 16 as well as providing reflected light back into GC-SOA 12. Also, the DFB grating generated laser light to maintain the gain of GC-SOA 12 is not totally utilized and, therefore, propagates out of the amplifier to AWG 30. These figures illustrate approaches to eliminate this noise from RxPIC chip 10.

In FIG. 16, reliance on AWG 30 per se to filter out this noise is selected. In the case here, the AWG 30 must be designed to function as such a filter so that the cone filter function is limited strictly to wavelengths within the wavelength grid of the channel signals. Wavelengths outside this spectrum, such as ASE at higher frequencies or a laser clamping signal at a higher or lower wavelength not within this spectrum, is rejected by the narrow band filtering of AWG 30. In this case, AWG 30 must be designed to have a large free spectral range (FSR) to filter out the GC-SOA clamping wavelength signal.

As illustrated in FIG. 16A, the input waveguide 37 from GC-SOA 12 can be provided with a high angular bend at 37A along which the signal wavelengths can be guided but not the higher wavelengths of ASE or of a gain clamping signal if of sufficiently higher wavelength than that of the channel signal spectrum. Otherwise, where the laser gain clamping signal is a shorter wavelength than the channel signal spectrum, other means may be necessary to remove this signal from chip 10.

The free spectral range (FSR) of AWG 30 can, thus, be designed to filter the gain clamping signal propagating from GC-SOA 12 to AWG 30. If the wavelengths of the modes are very different, then the FSR of AWG 30 will have to also be large as well. This can therefore become a design constraint for the AWG. Thus other measures will have to be taken to rid the RxPIC chip 10 of this residual clamping signal, which is to be described in several subsequent embodiments.

FIG. 17 illustrates another way of filtering out ASE and the laser gain clamping signal. In this illustration, a bank of on-chip SOAs 31(1) . . . 31(N) are integrated in each of the output waveguides 39 of AWG 30 to provide immediate gain to the demultiplexed channel signals which have experienced some insertion loss. These SOAs 31 are followed by in-line filter devices 33(1) . . . 33(N) which may be on-chip angled or blazed gratings with broadband reflective gratings within the bandwidth of the clamping signal and ASE to, not only eject the ASE and clamping signal light from GC-SOA 12 from chip 10, but also eject the ASE generated by SOAs 31. Thus, these unwanted wavelengths which are noise are eliminated from proceeding on with the demultiplexed channel signals to photodetectors 16(1) . . . 16(N).

FIG. 18 is a further embodiment for rejection of ASE and the residual gain clamping signal employing architecture similar to FIG. 17 except that the input amplification to the multiplied channel signals is a Raman or a rear earth fiber amplifier 35, such as an EDFA, as opposed to the employment of GC-SOA 12 or 120. Here, instead of on-chip initial amplification via GC-SOA 12 of the multiplexed channel signals, an off-chip booster fiber amplifier 35 is utilized. (This is similar to FIG. 67, previously described). In the case here, SOAs 31(1) ... 31(N), shown in FIG. 18, are optional. In-line filters 33(1) ... 33(N) each have a filter band that passes the demultiplexed channel signal but ejects the ASE and the residual clamping signal from chip 10. As shown in the embodiment of FIG. 19, no initial booster amplification of the multiplexed channel signals may be necessary so that, after channel signal demultiplexing, the individual channel signals may be amplified via SOAs 31(1) ... 31(N) and the ASE and other optical noise removed by in-line filters 33(1) ... 33(N) formed on chip 10. Alternatively, as shown in FIG. 19A, in a side view of RxPIC chip 10, output waveguides 39 from AWG 30 include SOAs 20(N) which have a design essentially the same as a PIN photodiode, such as the photodiode 140 in FIG. 8C. SOAs 20(N) are inserted in each waveguide 39 to provide for channel signal amplification due such as to insertion loss. The amplified channel signal then proceeds into a respective angled grating 183(N) which functions as a narrow passband filter for reflecting the channel signal upwardly or transversely of PD 16. Grating 183(N) is transparent to the ASE and other optical noise such as residual clamping lasing signal so that these different wavelengths exit the chip as shown at 185.

Reference is now made to FIG. 20 illustrating a still further way of rejecting ASE and the residual clamping signal from RxPIC chip 10. In this case, compared to the embodiment of FIG. 19A, the angled or blazed grating filter 33A here is deployed on the input side of AWG 30 rather on its output side where a single grating filter 39 is designed to reflect the bandwidth spectrum 37A of the multiplexed channel signals. The ASE and clamping signal are outside this spectrum and, therefore, are transparent to filter 39 and, as a result, are transferred through the filter and out of chip 10 as shown at 185. A heater 33B may be associated with filter 39 to tune the bandwidth of the grating to better match the wavelength spectrum of the channel signal grid to the wavelength grid of AWG 30.

FIG. 21 illustrates another embodiment for extraction of the ASE noise from chip 10 by employing a Mach-Zehnder interferometer (MZI) 41 in chip 10 between GC-SOA 12 and AWG 30. Since spontaneous emission from GC-SOA 12 is not coherent, such emission cannot be guided through MZI 41 and, therefore, functions as a filter for receiving only coherent channel signal wavelengths. The residual clamping signal can be filtered by AWG 30, as in the embodiment shown in FIG. 16 or by the employment of angled grating filters 31(1) ... 31(N) of FIGS. 17-19.

In FIG. 22, an additional AWG 43 is employed as a filter mechanism for ASE and the residual gain clamping lasing signal. In this embodiment, the channel signals, $\lambda_1 \ldots \lambda_N$, are demultiplexed via AWG 30 and passed along output waveguides 39 through SOAs 31(1) ... 31(N), to cover for insertion loss, to NxN AWG 43 which provides a narrow signal passband rejecting any wavelengths outside the channel signal spectrum. The channel signals are then forwarded via waveguides 39A to their respective photodetectors 16(1) ... 16(N) for optical to electrical signal conversion.

In FIG. 33, the residual gain clamping signal is removed by forming in the AWG input waveguide 37 from GC-SOA 12 a higher order angled or blazed grating 170 which deflects the higher or lower wavelength gain clamping signal, outside of the wavelength spectrum of the channel signals, out of RxPIC chip 10. Grating 170 can be part of GC-SOA 12. The filtering out of the ASE in this embodiment would be accomplished in AWG 30 as described in the embodiment of FIG. 16. It is important that waveguide 37 be single mode so that grating 170 functions to eject the gain clamping signal from chip 10.

FIG. 34 is similar to the embodiment of FIG. 33. In the plan view of FIG. 34, InP-based RxPIC chip 10 comprises a GC-SOA 12 with an output coupled to a mode adapter 26 and a waveguide 182. Waveguide 182 includes higher order grating 180 with an integrated heater 184 and PIN photodiode 17 positioned in the same planar level to receive light reflected from grating 180. In the case here, the grating 180 has a peak wavelength that is substantially the same as the peak wavelength of the residual gain clamping signal generated by GC-SOA 12. The residual gain clamping signal is, therefore, deflected out of waveguide to PIN photodiode 17 where it is detected and provides an electrical signal off-chip to monitor the optical characteristics of the gain clamping signal, such as, for example, its intensity and wavelength so that adjustments can be made, if necessary, to the applied bias of GC-SOA 12.

FIG. 35 is similar to FIG. 34 except that it is a view perpendicular to the view of FIG. 34 and illustrates, in cross-section, angled grating filter 180 in waveguide 182. A lateral waveguide 188 is provided in the same as-grown layer as waveguide 182 to direct the residual gain clamping signal laterally to an etched trough or groove 187 formed in InP chip 10. Trough 187 has an angled surface at 45° with a deposited reflective surface 189 formed on the angled surface to reflect, along its length, the gain clamping signal upwardly at 50 (or possibly downwardly depending at what vertical position photodiode 17 is integrated into chip 10) to an optical aligned photodiode 17 integrated in chip 10. Trough 187 may be etched by employing RIE. The space of trough 187 may be filled with air or contain some others low refractive index medium.

Instead of the integrated photodiode 17 being directly vertical (FIG. 35) or directly lateral (FIG. 34) of clamping signal filter 180, photodiode 17 can be offset transversely in chip 10 from the position of grating filter 180 as illustrated in FIG. 36. Also, instead of photodiode 17 being directly above or transversely of waveguide 182, photodiode 17 can be positioned below waveguide 182, as shown in FIG. 37, and the reflected light from angled grating filter 180 is directed downwardly at an angle, employing a second order or higher order integrated grating 183 to reflect the residual clamping signal downwardly to integrated PIN photodiode 17. Such a second order grating 183 can be in the same semiconductor layer in which filter 180 is formed or in a different or separate semiconductor layer.

A final approach for removing the residual gain clamping lasing signal is to employ this signal for pre-amplification of the oncoming channel signals, provided that the gain clamping signal is also chosen to be within the absorption spectrum of the channel signals. This illustrated in FIG. 54 where the gain clamping is reflected back to mode adapter 26 and propagates out of the front facet of chip 10, indicated as $\lambda_R$, and into the fiber link to counter-propagate in the link. With $\lambda_R$ designed to be within the absorption bandwidth of the incoming channel signals, these signals will receive gain from its counter-propagation. Rather than a built-in reflector at the downstream end of GC-SOA 12, a quarter wavelength shift to the channel signal can be provided in the grating of GC-SOA 12 or a multiple of that wavelength over 4N, so that most of the power of the gain clamp signal not utilized in the amplifier will be directed out of the back or input port of chip 10 into the fiber link.

In connection with the foregoing embodiment of FIG. 54, it is within the scope of this invention to provide on-chip laser pumps to provide for counter-propagation of gain into optical link to provide for initial amplification of the incoming channel signals. This is illustrated in the embodiments of FIGS. 44 and 45. In FIG. 44, an on-chip semiconductor Raman pump laser 230 is provided at one of the remaining first order outputs or higher order Brillouin zone outputs of AWG 30 to provide counter propagating signal, $\lambda_R$, through AWG 30 and GC-SOA 12 into the fiber link to provide for pre-amplification of the incoming channel signals. Such a pumping signal is transparent to the operation of GC-SOA 12. Alternatively, as shown in FIG. 45, an on-chip semiconductor Raman pump laser 232 could be coupled into AWG input waveguide 37 to provide counter propagating signal, $\lambda_R$, through SOA 12A into the fiber link to provide for pre-amplification of the incoming channel signals. Note here, that an SOA 12A is denoted rather than a GC-SOA since the Raman lasing pump laser signal can provide the on-chip gain clamping. Such Raman pumps could be provided at both such locations if desired. Also, and importantly so, it should be noted that Raman pump laser 232, whether an on-chip semiconductor Raman laser or off-chip Raman fiber amplifier coupled in a waveguide 39 of AWG 30 or waveguide 37, can be deployed instead of having an on-chip GC-SOA 12 or SOA 12A so that RxPIC chip 10, in this embodiment, would be comprised of Raman pump laser 232, AWG 30 and photodetectors 16(1) . . . 16(N).

Reference is now made to FIG. 46, which discloses an on-chip signal monitoring circuit and transmitter laser for providing a service channel signal, $\lambda_S$. Electro-optical circuit 234 is coupled to one of the first order outputs or higher order Brillouin zone outputs of AWG 30 and monitors the channel signals, via AWG output 233, for their peak wavelength value to determine if the channel signals are on the peak wavelengths and, if not, to provide digitized information in service channel signal, $\lambda_S$, back to a correspondent optical transmitter about the quality of the channel signal wavelengths relative to the standardized wavelength grid at the optical transmitter. As shown alternatively in FIG. 47, such an on-chip electro-optical circuit 236 may also be provided with its input 235 into waveguide 37 to counter-propagate service channel signal, $\lambda_S$, through GC-SOA 12 and into the optical link.

In connection with circuit 234 or 236 of FIGS. 46 and 47, reference is now made to FIG. 64 illustrating an application of these types of circuits in an optical communication system. The system shown in FIG. 64 comprises an optical transmitter PIC (TxPIC) chip 300 optically linked in an optical point-to-point transmission system via optical link 288 to RxPIC chip 10. TxPIC 300 comprises a plurality of integrated components in plural paths to an AWG multiplexer 310 where each such path includes a DFB laser source 302, an electro-optical modulator 306 and a SOA 308 (optional) coupled to an input of AWG 310. Each laser source 302 is operated cw at a designated peak wavelength corresponding to a standardized grid, such as the ITU grid. The output of each laser source 302 is modulated with an information signal at its respective modulator 306. Modulator 306 may be, for example, a semiconductor electroabsorption (EA) modulator or a Mach-Zehnder (MZ) modulator as known in the art. The modulated signal may then be provided with gain via SOA 308. SOAs 308 are optional and are preferred not to be an on-chip optical component because the overall power consumption of TxPIC chip 300 will be less without them since most of the on-chip power consumption will come from the operation of SOAs 308. In the absence of SOAs 308, DFB sources 302 will have to be operated at higher thresholds and operating currents. The output of AWG multiplexer 310 is coupled off-chip to optical link 288.

In order to operate TxPIC chip 300 in a stabilized manner, each DFB source 302 is provided with a corresponding, integrated heater 304 and AWG 310 is provided with TEC 310A. A small sample of the multiplexed channel signal output from AWG 310 is provided through a 1% tap, for example, and is provided as an electrical signal input, via optical to electrical domain conversion at on-chip PD 312, on line 311 to programmable logic controller (PLC) 316. PLC 316 discriminates among the different channel signals, $\lambda_1 \ldots \lambda_N$, to determine if the operating wavelengths of DFB sources are at their desired wavelength peaks as determined by reference to a peak wavelength reference memory. This discrimination process can be carried out by employing dithering signals on the modulated channel signals providing each such signal with an identification tag. As a result, each of the channel signals can be separated and analyzed as to its wavelength to determine if it is at a proper wavelength relative to a standardized grid, such as the ITU grid. Such a discrimination scheme is disclosed in U.S. patent application, Ser. No. 10/267,331, filed Oct. 8, 2002 and entitled TRANSMITTER PHOTONIC INTEGRATED CIRCUITS (TxPIC) AND OPTICAL TRANSPORT NETWORKS EMPLOYING TxPICs, which application is owned by the assignee herein and is incorporated herein by its reference. If the peak wavelength of any particular DFB laser source 302 is off, its operating wavelength is corrected to the desired peak grid wavelength by a signal provided from PLC 316 to heater control circuit. (HCC) 320 which provides a temperature control signal to a corresponding laser source heater 304 for increasing or decreasing the operating temperature of its DFB laser source 302 by an amount necessary to increase or decrease its operating wavelength to be substantially the same as desired and stored peak wavelength.

The temperatures of DFB laser sources 302 are not monitored but the temperature of AWG is monitored with a thermistor 313 which provides PLC 316 current information of the AWG ambient temperature via input 315. PLC 316 can then provide a control signal to heater control circuit (HCC) 318 to provide a temperature control signal to TEC 310A to increase or decrease the ambient temperature of AWG 310. In this manner the wavelength passband grid of AWG 310 may be shifted and adjusted to optimize it to be as close as possible to the standardized grid and the wavelength grid of DFB laser sources 304.

Also, the input side of AWG 310 includes a port 317 relative to a higher order Brillouin zone of the input side of AWG 310 for the purpose of receiving a service signal, $\lambda_S$, from RxPIC 10 via optical link 288, which is explained in further detail below. This service signal is demultiplexed by AWG 310 and provided on port 317 as an output signal and thence converted to the electrical domain by integrated, on-chip PD 314. The electrical signal from PD 314 is taken off-chip and provided as an input 319 to PLC 316.

At RxPIC chip 10, AWG demultiplexer 30 includes higher order Brillouin zone outputs 289A and 289B to receive respective channel signals, such as, for example, $\lambda_1$ and $\lambda_2$ or any other such signal pairs, in order to determine if their grid wavelengths are off the desired peak wavelength and, if so, by how much. Also, using these two channel signals as a wavelength grid sample, a determination can be made as to whether the AWG wavelength is shifted and, if so, by how much. Photodetectors 290A and 290B provide an electrical response to optical signals on outputs 289A and 289B which signals are provided on lines 291A and 291B to PLC 292. These PDs 290A and 290B are sensitive to the peak optical responses of these signal outputs and can be deployed in the electrical domain to determine if their peak wavelengths are off a desired peak wavelength. Also, if the delta shift, 6, of both is approximately same amount and in the same direction (both either a red shift or a blue shift relative to their desired wavelength peak), this delta shift is indicative that a shift in the wavelength grid of either Rx AWG 30 or possibly Tx AWG 306 has occurred. In these cases, PLC 292 can first make adjustment to the Rx AWG grid via heater control circuit (HCC) 294 via line 295 to Rx TEC 30A to either increase or decrease the ambient operating temperature of AWG 30 to shift its wavelength grid either to the longer or shorter wavelength side based on the determined delta shift. If this adjustment does not resolve the issue, then data relating to either the DFB channel signal wavelengths or the Tx AWG wavelength gird being offset from its desired setting can be forwarded over optical link 288 as a service channel signal, $\lambda_S$, for correction at the transmitter end. In these circumstances, PLC 292 can forward such wavelength and grid correction data as a service channel signal, $\lambda_S$, via an electrical correction data signal on output line 293 to service signal modulator 296, which may be comprised of an on-chip integrated DFB laser and EO modulator, to provide this signal through AWG 30 and counter propagation via optical link 288 to TxPIC 300. This service channel signal, $\lambda_S$, is then demultiplexed via AWG 310 and provided on higher order output 317 to PD 314. The electrically converted service signal data is deciphered by PLC 316 which makes a correction to the operating wavelength of a DFB laser source 302 via HCC 320 and/or makes a correction to the wavelength grid of AWG 310 via HCC 318.

Reference is now made to FIG. 69 where the RxPIC chip 10 and the TxPIC chip 300 of FIG. 64 are deployed as an optical-to-electrical-to-optical (OEO) converter 400 for optical signal regeneration in an optical transmission link. As shown in FIG. 69, the incoming multiplexed channel signals, $\lambda_1 \ldots \lambda_N$, are received by RXPIC chip 10 from optical link 408, demultiplexed and converted into corresponding electrical channel signals and provided through low impedance coupling lines 403 to electronic regenerator 401 comprising a plurality of circuits 402, 404 and 406, which may be comprised of a chip set for each demultiplexed electrical channel signal received from RxPIC 10. Circuit 402 comprises a transimpedance amplifier and a limiting amplifier. Circuit 404 comprises retiming and reshaping circuit where the bit clock is extracted from the signal to reclock the signal and regenerate the channel signal. The regenerated electrical channel signal may be further amplified via circuit 406 and provided as an output on low impedance lines 407 to the electro-optical modulators 306 of TxPIC chip 300 where the corresponding optical signals are again regenerated, the plural channels are multiplexed via AWG 310 and provided as multiplexed channel signal, $\lambda_1 \ldots \lambda_N$, on optical link 410. OEO converter 400 has the advantage of being cost effective, compact, easily field-replaceable compared to previous OEO converters and eliminates of the problems of optical-to-optical converters comprising erbium doped fiber amplifiers (EDFAs), functioning as line amplifiers, that need continuous attention relative to saturation where if the input signal power increases or decreases, the amplifier gain drops or increases. Also there is a problem of gain nonflatness across the channel signal wavelength band so that gain equalization techniques need to be provided. Also, these optical line amplifiers,. while being the choice today for transmission line optical signal amplification, they are not as compact or readily replaceable as converter 400 particular when changes are made to increase the number of multiplexed channels and traffic to carried over an optical link. OEO converter 400 of FIG. 69 eliminates this problems and considerations particularly since the converter can be easily swapped in between optical links 408 and 410 with a converter having larger channel capacity.

An important feature of RxPIC chip 10 is the monolithic incorporation of optical components, in particular GC-SOA 12 and AWG 30, which can provide polarization independent gain to the channel signals and function as a polarization insensitive waveguide grating router or demultiplexer. In GC-SOA 12, either the stable lasing in the TE mode or TM mode to provide the DFB clamping signal is preferred. It should be stable over the life of GC-SOA 12 or chip 10, i.e., discrimination between the TE mode and the TM mode should be made large. If both TE and TM modes lase or alternate between lasing in these polarization modes, this will lead to unstable operation of GC-SOA 12. This can also manifest itself in gain variation and additional noise in GC-SOA 12.

Relative to GC-SOA 12, one way of accomplishing polarization independent gain as incorporated in a PIC is to provide for the active region, such as active region 132 in GC-SOA in FIG. 8A, to have alternately strained tensile and compressive multiple quantum wells of Q (InGaAsP) to balance the polarization dependent gain across the plural wells. Thus, if six such wells are utilized in active region 132, three wells are tensile strained and three wells are compressively strained and the former are alternated with the latter. In this regard, see the article of M. A. Newkirk et al., entitled, "1.5 mm Multiquantum-Well Semiconductor Optical Amplifier with Tensile and Compressively Strained Wells for Polarization-Independent Gain", *IEEE Photonics Technology Letters*, Vol. 4(4), pp. 406-408, April, 1993, which article is incorporated herein by its reference. Another approach is to potentially utilize the technique suggested in U.S. Pat. No. 5,790,302, which patent is incorporated herein by reference, where a two part grating would be utilized which has a minimum reflection at a first wavelength, which is also minimum for TE portion of the light, and a minimum reflection at a second wavelength, which is also minimum for TM portion of the light, and a product of these reflections is a minimum for both wavelengths and optimized at an intermediate wavelength so that the resulting TE and TM modes will be substantially the same.

A further way of rendering GC-SOA 12 polarization insensitive, which is shown in FIGS. 38 and 39, is to employ a $\lambda/4$ grating, shown at 171 in FIG. 38, or two $\lambda/8$ gratings, shown at 173 in FIG. 39, in the gain clamping grating of GC-SOA 12. These gratings can suppress the stronger of the two TE and TM modes to render them more substantially the same. Another way, illustrated in FIG. 40A, is to employ a loss refractive index grating to enable one of the two modes over the other mode. This is accomplished by making the grating layer 128 to have a bandgap similar to that of active region 132 so that the grating will function as a selective loss for one of the modes thereby enhancing the other mode. On the other hand, by making the grating layer 128 to have a significantly larger bandgap compared to that of active region 132, then the grating will function to be index selective of one of the modes while suppressing the other mode. A further approach is to perturb the active region 132 itself employing a grating 128A, as shown in FIG. 40B, to provide selective gain for one of the modes.

A still further way of ridding or otherwise suppressing on of the polarization modes in the GC-SOA 12 is by employment of an AR coating as illustrated in FIG. 41. The AR coatings applied to the input and output regions of GC-SOA can be designed to favor one polarization mode over the other since these AR coatings 190 are typically broadband. This embodiment would be best utilized where GC-SOA 12 and AWG 30 are separate, discrete optical components.

Another way of ridding or otherwise suppressing one of the polarization modes in the GC-SOA 12 is through the employment of a grating shape that is tailored to favor one polarization mode over another. As shown in FIG. 42, this is illustrated as a square wave form 192 but it could be specifically tailored via other grating shapes, such as triangular or a waveform similar to sinusoidal, to accomplish the same result.

Also, as illustrated in FIG. 43, the grating in the grating layer 191 could be made to be a second or higher order grating where the plane of scattering is relaxed for one of the polarization modes, that is, $\beta_{TE}$ is not equal to $\beta_{TM}$. With the first order grating, the direction of mode scattering is in the plane of the waveguide. However, with a second or higher order grating, one of the modes, shown at 194, can be preferentially scattered transversely out of waveguide 193 while the other mode 196 remains in waveguide 193.

Lastly, a frequency selective feedback optical element that selects between the TE mode and the TM mode can be utilized in the RxPIC chip 10 as incorporated in waveguide 37 between GC-SOA 12 and AWG 30.

With respect to polarization insensitivity at AWG 30, reference is made to FIG. 23 where AWG 30 comprises at least one input waveguide 37 and a plurality of output waveguides 39 between which are space regions 32 and 36 and N grating arms 34. Also, shown are higher order Brillouin zone input arms 37A and higher order Brillouin zone output arms 39A. As shown in the cross-section in FIG. 8C of an AWG waveguide 34, the fabrication process generally lends itself to geometrically forming rectilinear shaped cross-sectional waveguide structures. Thus, the TM and TE modes of the signals will be favored one over the other. Only way of solving this problem is illustrated in U.S. Pat. No. 5,623,571, which is incorporated herein by its reference. As is known, the TM mode will propagate faster through grating arms 34 than the TE mode. What can be done is slow down the propagation of the TM to equal, in phase, the propagation of the TE mode. A patch 30E is made in the overlying cladding layer or top glass layer over the waveguide, i.e., some of the overlying layer is removed in patch region 30E to increase the birefringence in region 30E relative to the birefringence remaining in other overlying regions of the same grating arms 34. As a result, a balance can be achieved in the propagation phase between the TE and TM modes so that an in-phase relationship between these modes is maintained dependent on the path lengths of the arms in region 30E versus those portions outside of this region for the same arrayed arms. One way of determining the extent and depth of patch 30E is providing a separate wavelength, $\lambda_T$, in higher order inputs 37A and monitor those wavelengths at higher orderoutputs 39A to look at the polarization characteristics of the these signals to determine what depth must be etch for patch region 30E to appropriately change the TE/TM ratio and achieve polarization independence of AWG 30.

Another approach to achieve polarization insensitivity in AWG 30 is to provide a fabrication technique that provides for nearly square cross-sectional arrayed waveguides so that AWG 30 will have substantially zero birefringence waveguides. This is described and taught in the articles of J. Sarathy et al., entitled, "Polarization Insensitive Waveguide Grating Routers in InP", *IEEE Photonics Technology Letters*, Vol. 10(12), pp. 1763-1765, December, 1998, and in J. B. D. Soole et al., entitled, "Polarization-Independent InP Arrayed Waveguide Filter Using Square Cross-Section Waveguides", *ELECTRONIC LETTERS*, Vol. 32(4), pp. 323-324, Feb. 15, 1996, both of which are incorporated herein by their reference.

Reference is now made to FIG. 24 which illustrates another approach for achieving polarization insensitivity through the incorporation of SOAs 45(1) . . . 45(N) in each of the arms 34 of AWG 30. As is known, the TM mode will propagate faster through grating arms than the TE mode. What can be done is slow down the propagation of the TM to equal in phase the propagation of the TE mode. This was done in FIG. 23 by using patch 30E. Here, effectively it is accomplished by using SOAs which are of different lengths, so that the TM modes in arms 34 will be attenuated. The amount of required attenuation can be calculated through AWG computer simulation of the individual wavelength channels so that the length of SOAs 45 can be determined and attenuation of the TM mode over the TE mode can be provided for their equalization in arrayed arms 34. In this case, see, for example, the article of M. Zingibl et al., entitled "Planarization Independent 8X8 Waveguide Grating Multiplexer on InP", *ELECTRONICS LETTERS*, Vol. 29(2), pp. 201-202, Jan. 21, 1993 and published European patent application EP 0731576A2, dated Sep. 11, 1996, both of which are incorporated herein by their reference. Thus, arms 34 can be provided to polarization insensitive as well as provide for equalization of signal gain across the wavelength grid of AWG 30.

Reference is now made to several embodiments relating to architecture for coupling the electrical signal outputs from bonding pads 28 of the RxPIC chip photodiodes 16 to a RF submount substrate or a miniature circuit board or a monolithic microwave integrated circuit (MMIC), with particular reference being made to FIGS. 28, 29, 30, 51 and 55. In FIG. 28, a side view of a particular configuration for RxPIC chip 10 is shown in a schematic form showing in integrated form GC-SOA 12, AWG 30 and plural photodetectors or PINs 16(1) . . . 16(N). Output pads 28(1) . . . 28(N) of PINs 16(1) . . . 16(N) are solder bumped to output pads 154(1) . . . 154(N) of respective transimpedance amplifiers (TIAs) 152(1) . . . 152(N) formed on MMIC 150. TIAs 152 provide for conversion of the current signals developed by the respective PINs 28 into voltage signals. MMIC 150 is also shown here to include a portion 153 of RF submount 150 which includes other circuit components as known in the art, such as an automatic gain control (AGC) circuit for increasing the signal strength and range, which circuit can apply a gain control signal to TIAs 152 or provide the signal across the differential input of TIAs 152; a power amplifier (PA) to increase the signal gain from TIAs 152; and a clock and data recover (CDR) circuit. A CDR circuit (not shown) recovers the embedded clock from a baseband non-return-to-zero (NRZ) or return-to-zero (RZ) data stream and generates a clean data stream (e.g., data that does not have timing jitter due to, for example, the limited bandwidth of the transmission channel). The clock recovery function of a CDR circuit is typically performed with a phase-locked loop (PLL) which requires a tunable clock signal, such as generated by a voltage controlled oscillator (VCO). This arrangement provides for compactness with RF submount 150, carrying receiver electronics in overlying relation to PIC chip 10 and supported at a bonding point of bonding pads 28 and 154. As a result, RF board 150 is spatially supported above chip 10 to provide for a space between them for circulation of air and cooling.

FIG. 55 is substantially the same as FIG. 28 but a more detailed version of FIG. 28. As shown in FIG. 55, an optical link is coupled to the input end of PIC chip 10, where the received multiplexed signals, $\lambda_1 \ldots \lambda_N$, are provided to GC-SOA 12 for amplification and thence via waveguide 37 provided to AWG 30 where the signals are demultiplexed and provided on output waveguides 39 to PIN photodetector array 16(1) . . . 16(N). The electrical signal outputs from these photodetectors is provided to PIN contact 28(1) . . . 28(N) which are then solder bonded to corresponding TIA contacts 154(1) . . . 154(N) providing electrical connection to corresponding TIAs 160(1) . . . 160(N) and thence to power or limiting amplifiers 162(1) . . . 162(N). The outputs of power amplifiers 162 may be provided to other circuit components such as CDR circuits or the electrical signals can be taken off of RF submount 150 via RF transmission lines 163 at bonding pads 163A.

With reference to FIG. 28A, the arrangement is shown where PIC chip 10 comprises input GC-SOA 12 and AWG demultiplexer 130. The multiplexed signal outputs, $\lambda_1 \ldots \lambda_N$, are mirrored off of chip 10 by 45° mirror 155. Note that, in this embodiment, the PIN photodiodes 16(1) . . . 16(N) are formed on RF submount 150 rather then on chip 10. The optical signals reflected from mirror 155 are directed up to the aligned array of PINs 16(1) . . . 16(N) where the converted electrical signals are directed to corresponding TIAs, PAs and CDR circuits on RF submount 150. Also, a lens array on a separate board can be employed between submount 150 and chip 10 to aid in focusing the signals, $\lambda_1 \ldots \lambda_N$, onto the top detection surface PIN photodiodes 16(1) . . . 16(N) on RF submount 150, such as in a manner illustrated in the article of A. E. Stevens et al., entitled, "Characterization of a 16-Channel Optical/Electronic Selector for Fast Packet-Switched WDMA Networks", *IEEE Photonics Technology Letters*, Vol. 6(8), pp. 971-974, August, 1994, which article is incorporated herein by its reference. RF submount 150 is secured to chip 10 by means of solder ball bonding via solder balls 156.

Reference is now made to FIG. 28B which illustrates a further example of an arrangement of chip 10 and RF submount 150. In this arrangement, additional boards are employed comprising submount 166 and filler board 164. Only one end of InP chip 10 is shown that includes AWG demultiplexer 30. A 45° angled edge 157 is formed along the output edge of output waveguides 39 from AWG 30 handling demultiplexed channel signals, $\lambda_1 \ldots \lambda_N$. The angled edge 157 is coated with a mirror surface as is known in the art. As in the case of the embodiment of FIG. 28A, RF submount includes PIN photodetectors 16(1) . . . 16(N) which are surface photodetectors aligned with the respective signals, $\lambda_1 \ldots \lambda_N$, where the signals are then processed via the TIAs, PAs 162(1) . . . 162(N) and CDR circuits on RF submount 150. Filler board 164 and RF submount 150 provide support for PIC chip 10, as secured via ball bonding 156, and both filler board 164 and RF submount 150 are supported on submount 166.

Reference is now made to FIGS. 29 and 30 which disclose wire bonded versions of connecting photodetector pads 28 to RF submount pads 159 on one or two RF circuit boards. All the electronic RF circuit components are on microwave submounts 150, 150A and 150B as it is easier to control the circuit impedance on these circuit submounts rather than on PIC chip 10. Microwave submounts 150, 150A and 150B may be, for example, ceramic submounts. As shown in FIG. 29, photodetector pads 28 are wire bonded to corresponding bonding pads 159 on microwave submount 150 and the signals are then feed into TIAs 160 and thence on to other circuit components, as previously described, via high speed transmission lines 168.

As shown in FIG. 30, in order to save space and provide for more compactness, photodetector bonding pads 28 may be placed in two or more staggered rows on the edge of PIC chip 10 and one or more pad rows of pads 28A are wire bonded to TIA bonding pads 159A on a first RF submount 150A which are correspondingly coupled to TIA circuits 160A. The remaining pad row or rows of pads 28B are wire bonded to TIA bonding pads 159B on a second RF submount 150B which are correspondingly coupled to TIA circuits 160B. By staggering the pad rows on chip 10 as well as employing more than one RF submount, short bonding wires can be employed so that the inductance relative to the microwave circuits can be minimized. In this connection, high speed transmission boards 150A and 150B are mounted in spaced relation to RxPIC chip 10 by a spacing distance greater than 5 μm. Also, the staggered spacing of pads 28 still allows for good separation between the accompanying photodetectors 16 while permitting the shrinkage of the overall PIC dimensions, particularly if the staggered rows are provided along two sides of the PIC chip 10, as demonstrated for one row of pads 28 shown in FIG. 6. For example, both the diagonal spacing and the side-by-side spacing of pads 28A and 28B on chip 10 may be a minimum of about 250 μm. This spacing is critical to insure minimal crosstalk between channel signals.

Reference is now made to FIGS. 48-51. In FIG. 48, the simple transimpedance amplifier (TIA) 200 with a feedback resistor 201 is shown and is well known in the art. The gain of amplifier 200 is dependent upon the input signal level and the signal current, $I_S$, can vary over a fairly large range. An automatic gain control (AGC) circuit can be coupled to amplifier 200 to linearly control its gain.

As shown in FIG. 49, the transimpedance amplifier (TIA) 202 can have a differential output. The differential output helps to reduce the noise at the output of the amplifier. However, the employment of a truly differential input, as illustrated in FIG. 50, can significantly reduce any cross-talk on RxPIC 10 between the channel signals output. For this scheme to work, a photodiode reference input is also provided to TIA 202. As shown in FIG. 50, TIA 204 has a differential input as well as differential output. Feedback resistors 205 are provided for both differential inputs to TIA 204 as well as DC blocking capacitors 203 are provided in these inputs too. The differential outputs of TIA 204 are coupled to limiting amplifier 206. As shown in FIG. 50, one of the differential inputs is coupled to a respective signal photodetector 16 and the other differential input is coupled to a respective reference photodetector 206 which is also formed in RxPIC chip 10 as shown in FIG. 51, to be discussed next. In the case here, both photodetectors 16 and 206 will substantially detect the same noise environment, i.e., photodetector 16 will detect the signal plus noise and photodetector 206 will detect the noise scattered in chip 10, which is generally crosstalk noise and optical noise from other optical components integrated in the chip. As a result, the crosstalk and noise can be substantially cancelled out via the differential input to TIA 204.

As shown in FIG. 51, photodetectors 16(1) . . . 16(N), for detecting the channel signals via waveguides 39 are formed along an edge of chip 10 and are primary photodetectors $PD_{P1}$, $PD_{P2}$, etc. Companion photodetectors 206(1) . . . 206(N), for detecting optical noise, in particular crosstalk noise, are alternating with photodetectors 16(1) . . . 16(N) and are secondary photodetectors $PD_{S1}$, $PD_{S2}$, etc. Also, ground pads 208 on chip 10 are connected via bonding wires to ground pads 214 on the RF submount 150. Photodetectors 16 and 206 are separated a sufficient amount to prevent undue crosstalk, e.g., about 250 µm or more.

Alternatively, one or less than all of the entire companion photodetectors 206 can be deployed on RxPIC chip 10 to provide an optical noise signal for all or more than one primary photodetector 16(N), rather than providing one secondary photodetector 206(N) in proximity to each and every primary photodetector 16(N). Although this will function to establish a useful noise floor for the detected RxPIC channel signals for use with differential TIAs 204, the established signal noise floor will not be as accurate as in the case where there is one companion photodetector 206 for every primary photodetector 16 since the amount of optical noise at every primary photodetector location on the chip will not necessarily be the same.

It should be noted that in FIG. 51, bonding wires 216 should be as short as possible to reduce photodetector inductance. Another way of eliminating this inductance is to eliminate these bonding wires 216 all together by forming TIAs 204 directly on chip 10. This is accomplished by utilizing InP-HBT or InP-HEMT circuitry on chip 10.

It is desirable that certain components be included with chips 10 or formed in an InP wafer with the chip die configuration to provide for testing capabilities. Some examples are shown in connection with FIGS. 52 and 53 to be described now.

In FIG. 52, higher order Brillouin zone arms 39A and 39B are taken off of output space region 36 of AWG 30 and angled facets 220 are provided in a manner similar to facet 225 shown in FIG. 53, to be next described, so that the signal light of one or more channels can be taken off chip while the chip is still in the InP wafer. The light input is provided to AWG 30 in a manner as shown in FIG. 53. Thus, the optical output from the angled on-chip reflectors can be detected employing an optical interrogation probe where the output is collected and analyzed to determine if the signals are being properly demultiplexed through AWG 30 relative to the AWG wavelength grid, the relative intensity of the signals, their peak frequency, etc. This approach saves a great deal of time and expense by eliminating wafers with poor quality optical components without going to the expense of cleaving the wafer into individual die and testing them separately. Alternatively, instead of an angle facet 220, a higher order grating can be formed at this point to deflect the signal out of the chip for detection. Also, instead of either an angled facet 220 or a higher order grating, photodetector or photodetectors 222 can be fabricated directly on chip and employed to test the channel signal properties while the chip die remain in-wafer. These same photodetectors 222 can be employed later, after the remove of chip from the wafer for signal monitoring and feedback indicative of the operating wavelength peaks of the channel signals and the amount, if any, that they are off relative to a predetermined wavelength grid, such as standard ITU grid.

It should be pointed out that, in connection with FIG. 52, photodetectors 16(1) . . . 16(N) of an as-cleaved chip can be initially employed to examine the total signal and differential signal between detectors to tune the wavelength grid of AWG 30 via TEC 30A. The temperature of AWG 30 is changed so that its wavelength grid best matches the wavelength grid of the channel signals to be demultiplexed. In order to accomplish this grid tuning, it is preferred that at least two of the channel signals need to be detected. Once the AWG wavelength grid has been optimized to a standardized grid, such as the ITU grid, the factory setting for TEC 30A is placed in memory of the RxPIC controller circuitry. Such circuitry is beyond the scope of this disclosure and will be detailed in later applications. More is said about this monitoring and adjustment in connection with FIGS. 73, 73A and 73B.

Reference is now made to FIG. 53 illustrating the in-wafer testing of RxPIC chips 10. As mentioned previously, it is advantageous to test the RxPIC chips 10 in-wafer because if the initial testing of a majority of them results in poor performance, time and expense of dicing the chips from the wafer as well as subsequent individual chip testing has been circumvented. Also, such in-wafer testing can be easily automated since the input to each chip is at a known or predetermined location in the InP wafer. As a result, in-wafer testing can be handled in a matter of seconds to a few minutes where individual die testing would take a period of days and, therefore, lead to higher product costs. In FIG. 53, the in-wafer chips or die 10 include an in-wafer chip sacrificial spacing or region 224. Within region 224, there is formed an in-wafer groove 223 having an angular mirror surface 225A formed via selective etching. A mirror coating, which is optional, could be also deposited on these surfaces. The angled surfaces 225 are preferably angled at 45° so that an interrogation beam, normal to the surface of the wafer, may be moved by an automated mechanism over the wafer to surface 225 to provide an optical signal input, such as a plurality of test pulse channel optical signals into chip 10 via its chip input. The testing is accomplished by probe testing the outputs of the respective photodiodes 16. Alternatively, it should be noted that that grooves 223 also served at the opposite end of the in-wafer RxPIC chip 10 serve as a point to detect the rear end light from photodetectors 16 through an optical pickup such as an optical fiber coupled to an off-chip photodetector. The testing of an on-chip GC-SOA 12 and AWG 30 is conducted as indicated relative to the discussion of FIG. 52 or using the probe card as disclosed in U.S. patent application, Ser. No. 10/267,331, supra, which application has been previously incorporated herein by reference. Characteristics that may be checked, for example, include optical power of the gain clamped-SOA or passband response and insertion loss of the AWG. After testing is complete, the region 224 can be cleaved away from chip 10 as indicated by the set of cleave lines in FIG. 53.

Reference is now made to FIGS. 57 and 58. Active region 240 of GC-SOA 12 may be a multiple quantum well (MQW) region as illustrated in FIG. 57 or may be a single active layer, such as illustrated in FIG. 58. In FIG. 57, the MQWs 242 are compressively strained and the barriers 244 may be tensile strained to produce an overall strain-balanced structure in which the electron light hole, mostly TM barrier transition is slightly favored over the larger energy electron heavy hole TE well transition. Alternatively, the MQWs 242 can be alternately tensile and compressively strained. The TE:TM emission ratio can be adjusted by the amount of strain and the number of compressive versus tensile barriers having identical effective bandgaps. Such treatment provides for a polarization insensitive SOA. See Chapter 5, "Semiconductor Laser Growth and Fabrication Technology", Section IV, "Polarization Insensitive Amplifiers by Means of Strain", pp. 177-179, in the book entitled, "Optical Fiber Communication -IIIB" (Vol. 2), edited by Kaminow and Koch, Academic Press, published in 1997, which Section is incorporated herein by its reference. For further background, see the articles of M. A. Newkirk et al., entitled, "1.5 mm Multiquantum-Well Semiconductor Optical Amplifier with tensile and compressively Strained Wells for Polarization-independent gain", *IEEE Photonics Technology Letters*, Vol. 4(4), pp. 406-408, April, 1993, and of Young-Sang Cho et al, entitled, "Analysis and Optimization of Polarization-Insensitive Semiconductor Optical Amplifiers with Delta-Strained Quantum Wells", *IEEE Journal of Quantum Electronics*, Vol. 37(4), pp. 574-579, April, 2001, both of which are incorporated herein by their reference.

In FIG. 58, if a single active layer is employed, the Q active layer 246 may be tensile strained and the confinement layers 248 may be compressively strained (the latter is optional).

AWG 30 can be made substantially temperature insensitive and its wavelength spectrum stabilized over time so that changes in the ambient do not affect changes in the AWG arm lengths thereby changing its narrow passband characteristics. This T-insensitivity can be achieved in a InGaAsP/InP AWG 30 by employing a high dn/dT array waveguide 1.3Q region 260 and two low dn/dT arrayed waveguide 1.1.Q regions 262 as illustrated in FIG. 59 and described in the article of H. Tanobe et al., entitled, "Temperature Insensitive Arrayed Waveguide Gratings in InP Substrates", *IEEE Photonics Technology Letters*, Vol. 10(2), pp. 235-237, February, 1998, which article is incorporated herein by its reference. As taught in this article, the difference in the optical path length of any pairs of waveguide arms 34 in the array becomes longer when the waveguides are heated. This brings about a red shift to the demultiplexed channel wavelength toward a longer wavelength. This effect is cancelled out by employing 1.1Q and 1.3Q regions 260 and 262 providing different sections with different values for dn/dT in the waveguides dependent on a predetermined relationship between their lengths. Alternatively, as shown in FIG. 60, a heater or electrically pumped region 264 can be provided over a portion of wavelength arms 34, operated via a temperature controller, to stabilize the wavelength spectrum of AWG 30 by changing the refractive index of the arms to compensate for wavelength changes from desired peak wavelength passbands of arms 34. Region 264 can also include one or more regions that are provided with a material or materials overlying AWG 30 where the materials have different coefficient of thermal expansions, such as decreasing or increasing in length with increasing temperature, to provide a more athermal structure. This can also be accomplished by using heater strips or current pumping stripes 266, as shown in FIG. 61, where the applied bias to strips 266 can be uniform or non-uniform across the strip array, e.g., applied in a monotonically increasing to monotonically decreasing manner across the array. Thus, the applied bias can be selectively and/or independently varied to compensate for temperature driven index changes of the AWG.

Reference is now made to FIG. 70 illustrating a forward error correction (FEC) enhanced optical transport network 500 shown as single direction transmission in a point-to-point optical transmission link including at least one TxPIC 502 and at least one RxPIC 504 optically coupled by optical link 506. It should be understood that network 500 can be bidirectional where TxPIC 502 can also be a transceiver and including a receiver, such as RxPIC 504, which transceivers are also illustrated in patent application, Ser. No. 10/267, 331, filed Oct. 8, 2002, which is incorporated herein. In such a bidirectional network, optical link 506 would be deployed for use with the eastbound and westbound traffic on different channel wavelengths. TxPIC 502 includes a plurality of DFB laser sources 508(1) . . . 508(N) optically coupled, respectively, to electro-optic modulators (MODs) 510(1) . . . 510(N), in particular, electro-absorption modulators or Mach-Zehnder modulators. The outputs of the modulators 510(1) . . . 510(N) are optically coupled to an optical combiner or MUX 511, e.g., an arrayed waveguide grating (AWG). As shown in FIG. 70, each DFB laser source 508 has a driver circuit 512(1) . . . 512(N). Each modulator 510(1) . . . 510(N) includes a driver 514(1) . . . 514(N) for input of the bias point of the modulator and the data stream for modulation. $FEC_1$ . . . $FEC_N$ encoders 518(1) . . . 518(N) are used to reduce errors in transmission of data transmitted over network 500. These encoders may also be a joint FEC encoder 520 to jointly encode bit code representative of transmitted data. As well known in the art, the performance of a received data signal is measured deploying an eye diagram, such as shown in FIG. 71A, which will be discussed in more detail later. Further, $FEC_1$ . . . $FEC_N$ encoders 518(1) . . . 518(N) are deployed to reduce the bit error rate (BER) by transmitting on the laser source light output with additional bits through the employment of error-correcting code containing redundant information of the data bit stream, along with the transmission of the main data bits. The error-correcting code is deployed at the optical receiver for correcting most errors occurring in transmission of the data bits thereby increasing the immunity of system 500 from noise resulting in reduced channel crosstalk. The encoders 518 are shown in connection with the transmission of redundant encoded data bits at DFB laser sources 508 but this redundant code can also be transmitted at modulators 510, i.e., the FEC encoders 518 can be deployed between the modulated data source or modulators 510 and the multiplexer 511. At the optical receiver end, the RxPIC chip 504 comprises a demux or demultiplexer 522 and a plurality of photodiodes (PDs) 523(1) . . . 523(N), one each for each channel signal $\lambda_1$ . . . $\lambda_N$ transmitted from TxPIC chip 502. RxPIC chip may also include an optical amplifier at its input, either integrated into the input of the chip, e.g., a gain-clamped SOA (not shown), or an external optical amplifier, e.g., an EDFA (not shown). The electrically converted signals are respectively received in receivers 524(1) . . . 524(N) and the FEC encoded date is decoded at $FEC_1$ . . . $FEC_N$ decoders 526(1) . . . 526(N). The details relative receivers 524 are shown in FIG. 71 and will be discussed in further detail later. It should be noted that $FEC_1$ . . . $FEC_N$ decoders 526(1) . . . 526(N) may also be a joint FEC decoder 530 for all signal channels which are decoded as a group.

As shown in FIG. 70, the FEC decoded data is received on line 527 for providing the BER data to real-time BER controller 528. Controller 528 discerns such parameters such as output power level of DFB laser sources 508, the bias point and chirp of modulators 510 and decision threshold values, such as the threshold decision voltage at the receiver as well as the phase and threshold offset relative to the eye diagram. Controller 528 provides feedback service channel information via line 531 feedback through demultiplexer 522, optical link 506 (as shown at arrow 526) to controller 516 on the transmitter side. The service channel data is then provided to DFB laser sources 508 via line 513 drivers 512 to correct the intensity of a respective laser source. Also, correction signal are provided on line 509 to modulator drivers 514 of modulators 510 to make adjustments on the rise time of modulated data, particularly in cases of lone data pulse "1's", to adjust the cross-over point to be further discussed in connection with FIG. 71B, to adjust the bias point of the modulator and to enhance the extinsion ratio of the modulator as well as change the modulator chirp (alpha parameter), and to make RF magnitude adjustments on the modulated data stream. At the receiver, controller 528 also makes adjustments to receivers 524 in particular to adjust decision threshold values such as phase and threshold offset to respectively to achieve better data recovery within the decision window of the eye and offset the decision threshold from the eye position of most noise on the data stream.

Reference is now made to FIG. 71 which is a detail of one signal channel in the optical receiver comprising RxPIC chip 504 and receiver 524. Chip 504 includes photodiodes 523 from which an electrical data signal is obtained and pre-amplified by transimpedance amplifier and main amplifier by automatic gain control amplifier shown together at 540. The amplified signal is then provided to electronic dispersion equalization (EDE) circuit 542 followed by clock and data recovery (CDR) circuit 544 after which the data is passed on SerDes circuit 546 which is a serializer/deserializer circuit, as know in the art, for converting the serial data into parallel format for faster handing of the data stream. CDR circuit 544 may be part of the SerDes circuit 546. At this point, the trailing overhead, following the client payload, which carries the FEC coded data format is decoded at FEC decoder 526 and may be provided as feedback on line 552 to EDE circuit 542 as well as CDR circuit 544 to respectively provide information on the amount of eye dispersion distortion and to provide correction information for adjusting for timing errors due to imperfect clock recovery. The parallel data proceeds on at 550 to a cross-point switch for rerouting, etc.

FIG. 71A pictorially shows a typical eye diagram 560 for recovered data where dotted line 562 shows the center of the eye 560. The upper portion 560A of eye carries more noise then the lower portion 560B of eye 560. As a result, the threshold decision level is reduced to be below the center 562 of eye 560 to a level, for example, at 563. In this manner, the threshold decision point or offset voltage 566 is set within a narrower window margin 564 for decision threshold since line 563 is shorter than center line 562 of eye 560. However, as provided by this invention relative to EDE circuit 542, a wider window margin 574 is achieved, as shown in FIG. 71B through the lowering of the eye center 572 relative to the wrap-around on bit boundaries to lower the point of the vertical opening of the eye to provide for a lower threshold for a better margin for lower bit errors due to noise relative to the higher noise on the upper rail 570A of the eye. Also the cross points for the lower rail 570B wrap-around in bit boundaries relative to the horizontal opening of the eye are made lower so that the margin for timing errors due, for example, to imperfect clock recovery is wider as indicated at 574 in FIG. 71B, for timing determination to read a bit within its respective bit boundary, such as indicated at 572. The wider timing margin in eye 570 as well as a lower threshold below the bit boundary center crossing away from the upper eye rail of greatest noise provides for optimum data recovery. This optimum eye data recovery is provided by the EDE circuit 542 providing for maximum phase margin at the correct threshold decision voltage.

Reference is now made to FIG. 72 which is a flowchart illustrating an example of a process of feedback correction relative to FIG. 70, in the case here correcting for modulator operating parameters, e.g., bias voltage and voltage swing to adjust for modulator chirp and extinsion ratio, and DFB laser source parameters, e.g., DFB laser intensity or channel wavelength, through feedback control signal service channel, $\lambda_S$, from the optical receiver to the optical transmitter to reduce the bit error rate (BER). The chirp parameter of a quantum well electro-absorption modulator, such as may be modulators 510 in FIG. 70, is a function of the change in absorption characteristics and refractive index of the modulator with bias voltage. Typically, a voltage bias may be selected over a range within which the chirp parameter of the modulator shifts from positive to negative. In a high data rate channel close to the dispersion limit, a positive chirp increases the BER while a negative chirp decreases the BER. Similarly, a high extinction ratio tends to decrease the BER while a low extinction ratio tends to increase the BER. Forward error correction (FEC) decoders 526 in the optical receiver are employed to determine the BER of each channel. While this information may be forwarded to the optical transmitter in a variety of ways, it is shown here being transmitted through an optical service channel. The modulator operating parameters, e.g., bias voltage and voltage swing of the modulator, relative to a particular signal channel are adjusted using data relative to the channel BER determined at FEC decoder 526. As illustrated in FIG. 72, BER data is transmitted from the optical receiver to an optical TxPIC or transceiver via the optical service channel shown in FIG. 70. Electronic controller 516 of TxPIC 502 employs this data to tune the bias voltage and/or voltage swing of a corresponding modulator 510 to adjust the bias and voltage swing of modulation to optimize BER, including optimized BER for the particular fiber type of optical fiber link 506.

With reference to FIG. 72, the BER of the respective received channel signals is monitored at 580, one channel at a time, but done sequentially at high speed via transmitter and receiver controllers 516 and 528 in FIG. 70. As indicated at 582, the FEC encoded information is decoded at decoders 526 and provided to receiver controller 528, via lines 527 where it is sorted and respectively sent via the service channel as signal Xs, on line 531 and received at transmitter controller 516 for distribution to modulators 510. Also, in FIG. 70, information is also sent via line 529 from receiver controller 528 to RxPIC chip 504 to temperature tune its AWG DEMUX 522 via its TEC 521, as well as, for example, TEC 30A in FIG. 52 or TEC 602 in FIG. 73, next to be discussed, based upon the transmission of one signal channel to match the AWG wavelength grid passband to the wavelength grid of DFB laser source array 512(1) . . . 512(N) of FIG. 70. As shown at 583 in FIG. 72, the chirp or chirp factor, α, of a respective channel modulator 510 is adjusted and, again, the BER for each respective channel is checked (584) and determined whether or not the BER has been reduced to a satisfactory level. A satisfactory level is, for example, a BER below $10^{-12}$. If yes, other channels at the transmitter TxPIC 502 are checked (585) until all signal channels have satisfactory chirp or α. If no, then adjustment of the signal channel wavelength is accomplished (586) and, again, the BER monitored at the receiver is checked to determine if it is reduced to an acceptable level. If not, the process is redone, starting with adjustment of the modulator channel chirp (583) followed by channel wavelength channel adjustment (586), if necessary, until an acceptable channel BER level is achieved. When all of the channels have been checked (588 to 585) and adjusted relative to both modulator chirp and laser intensity and/or channel wavelength with satisfactory BER (at 587 in FIG. 72), the process is complete and the monitoring process for these laser source and modulator parameters may begin all over again at 580.

To be noted that in connection with FIG. 70, the wavelength adjustment of respective DFB laser sources 508 is made relative to bias changes to the respective source via drivers 512. However, it is within the scope of FEC enhanced system 500 to also change the channel wavelength via a DFB laser source heater such as with heaters 208 shown in FIG. 37 of provisional application, Ser. No.

60/328,207, incorporated herein by reference and as taught in its corresponding non-provisional application, Ser. No. 267,331, filed Oct. 8, 2002, such as seen in FIGS. 12-16, filed concurrently herewith and incorporated by reference.

Reference is now made to FIG. 73 depicting RxPIC chip 600 and its associated TEC 602. Chip 600 may include at its input 604 from the fiber channel link an optical amplifier 606 for adding gain to the multiplexed channel signals after which they provided at first order Brillouin zone input to input slab 610 of the arrayed waveguide grating (AWG) 608 via on-chip optical waveguide 706. AWG 708 includes a plurality of waveguide gratings coupled between input slab 610 and output slab 614 wherein the multiplexed channel signals, as known in the art, are demultiplexed and provided as an output at a first order Brillouin zone of output slab 614 and the respective demultiplexed channel signals are provided on output waveguides 616 to respective on-chip PIN photodiodes 622(1) . . . 622(12).

As shown in FIG. 73, monitoring PIN photodiodes 624 and 626 are fabricated in the higher order +/− Brillouin zones (e.g., the −1 and +1 Brillouin zones) of AWG 608 and are optically coupled to these zones via respective waveguides 618 and 620. The two photodiodes 624 and 626 are placed there for the purposes of detection on opposite sides of the AWG passband. A DFB laser in a TxPIC, such as TxPIC 502 in FIG. 70, is aligned to the passband of AWG 608 when the DFB laser source wavelength, such as wavelength 628 shown in FIGS. 73A and 73B, is tuned such that photodiodes 624 and 626 have a balanced output, i.e., their outputs are of the same magnitude on adjacent sides of laser source wavelength 628 such as shown at 630 and 632 in FIG. 73A and 73B.

Referring again to FIG. 73, AWG 608 of RxPIC chip 600 is temperature tuned via TEC 602 to adjust its passband response to reduce insertion losses. Photodiodes 624 and 626 may be fabricated to be integrated at the +/− higher order or first order Brillouin zone output positions of slab 614. As previously indicated, when the refractive index of AWG 608 is properly tuned relative to a selected channel wavelength, there is an indication of equal power in both +/− Brillouin zone photodiodes as illustrated in FIGS. 73A and 734B.

The passband response of AWG 608 will depend upon its refractive index and, therefore, may be adjusted by temperature tuning. The passband response of AWG 608 may be characterized in the factory to set an operating temperature of the AWG for which the passband response of the AWG is aligned to a standardized wavelength grid, such as the ITU wavelength channel grid, i.e., the peaks of transmissivity of the AWG are approximately aligned with the desired wavelength channels to achieve acceptable insertion loss levels in the AWG.

While the invention has been described in conjunction with several specific embodiments, it is evident to those skilled in the art that many further alternatives, modifications and variations will be apparent in light of the foregoing description. For example, beside the deployment of InGaAsP/InP regime, described relative to the chip structures for the RxPIC disclosed in this application, the structures of this invention, the InGaAs/InP regime can also be deployed in this invention for the structures for the RxPIC. Also, the number of signal channels on a TxPIC or RXPIC chip is a matter of choice and skill in achieving tighter spacing of optical components integrated in a PIC chip while maintaining tolerable cross-talk levels. Thus, the invention described herein is intended to embrace all such alternatives, modifications, applications and variations as may fall within the spirit and scope of the appended claims.

What is claimed is:

1. An optical receiver photonic integrated circuit (RxPIC) comprising:
   a semiconductor monolithic chip having an input to receive from an optical transmission link a multiplexed channel signal originating from an optical transmitter source and comprising a plurality of channel signals having different wavelengths forming a wavelength grid;
   an optical decombiner integrated in the chip and optically coupled to the input to receive the multiplexed channel signal and provide a decombined individual channel signal on a respective output waveguide of a plurality of output waveguides from the optical decombiner;
   a plurality of photodetectors integrated in the chip and each optically coupled to one of the output waveguides to receive a decombined channel signal and convert the channel signal to an electrical signal; and
   an optical service channel (OSC) integrated on said chip to provide a service signal from said chip to the optical transmitter source and including a service channel modulator coupled to said optical service channel (OSC) and modulated to provide a service signal via said chip input through the optical transmission link to the optical transmitter source.

2. The optical receiver photonic integrated circuit (RxPIC) of claim 1 wherein said optical service channel (OSC) modulator is a semiconductor laser or an electro-optic modulator integrated on said chip.

3. The optical receiver photonic integrated circuit (RxPIC) of claim 1 wherein said optical service channel (OSC) is coupled as an input to the output of said decombiner for transmission of said service signal from said chip input via said decombiner.

4. The optical receiver photonic integrated circuit (RxPIC) of claim 1, the optical transmitter source comprising:
   an optical transmitter photonic integrated circuit (TxPIC) comprising a plurality of optical signal channels each including a modulated signal source with its output coupled to an input of an integrated optical combiner to form a WDM output signal for transmission off the TxPIC chip; and
   an optical service channel (OSC) integrated on said TxPIC chip to receive a service signal from the optical receiver RxPIC chip.

5. The optical receiver photonic integrated circuit (RxPIC) of claim 4 wherein said TxPIC chip optical service channel (OSC) is coupled at one end as an input of said optical combiner to operate as an output for said service channel received as an input via an output of said TxPIC chip through said optical combiner.

6. The optical receiver photonic integrated circuit (RxPIC) of claim 4 wherein the other end of said TxPIC chip optical service channel (OSC) is coupled to a photodetector for converting said service signal from an optical signal into an electrical signal.

7. The optical receiver photonic integrated circuit (RxPIC) of claim 6 wherein said electrical service signal is provided to a controller for correction of a performance parameter on said TxPIC chip.

8. The optical receiver photonic integrated circuit (RxPIC) of claim 7 wherein said performance parameter is correction of an operational wavelength or output power of a modulated signal source.

9. The optical receiver photonic integrated circuit (RxPIC) of claim 8 wherein said modulated signal source comprises an integrated semiconductor laser, or an integrated semiconductor laser with an integrated externally operated electro-optic modulator.

10. The optical receiver photonic integrated circuit (RxPIC) of claim 7 wherein said performance parameter is correction of bias point, voltage swing, chirp or extinction ratio of a modulated signal source.

11. The optical receiver photonic integrated circuit (RxPIC) of claim 10 wherein said modulated signal source comprises an integrated semiconductor laser, or an integrated semiconductor laser with an integrated externally operated electro-optic modulator.

12. An optical receiver photonic integrated circuit (RxPIC) comprising:
a semiconductor monolithic chip having an input to receive from an optical transmission link a multiplexed channel signal originating from an optical transmitter source and comprising a plurality of channel signals having different wavelengths forming a wavelength grid;
an optical decombiner integrated in the chip and optically coupled to the input to receive the multiplexed channel signal and provide a decombined individual channel signal on a respective output waveguide of a plurality of output waveguides from the optical decombiner;
a plurality of photodetectors integrated in the chip and each optically coupled to one of the output waveguides to receive a decombined channel signal and convert the channel signal to an electrical signal;
a controller coupled to receive a portion of the converted electrical signals to determine at least one performance property of the signals; and
an optical service channel (OSC) integrated on said chip where said chip input is an output from said chip for a signal provided in said on-chip optical service channel (OSC).

13. The optical receiver photonic integrated circuit (RxPIC) of claim 12 further comprising an optical amplifier at the input of said chip.

14. The optical receiver photonic integrated circuit (RxPIC) of claim 13 wherein said amplifier is a rare earth doped amplifier, a semiconductor optical amplifier (SOA) or a gain clamped semiconductor optical amplifier (GC-SOA).

15. The optical receiver photonic integrated circuit (RxPIC) of claim 13 wherein said optical amplifier is integrated in the chip at said chip input to amplify the combined channel signals.

16. The optical receiver photonic integrated circuit (RxPIC) of claim 15 wherein said optical amplifier is a semiconductor optical amplifier (SOA) or a gain clamped semiconductor optical amplifier (GC-SOA).

17. The optical receiver photonic integrated circuit (RxPIC) of claim 13 wherein said optical amplifier provides for equalized spectral amplification across the channel signal wavelength grid.

18. The optical receiver photonic integrated circuit (RxPIC) of claim 12 wherein said performance property is a bit error rate (BER).

19. The optical receiver photonic integrated circuit (RxPIC) of claim 18 wherein said BER is transmitted to the optical transmitter source for adjusting an operational characteristic of at least one electro-optic modulator at the optical transmitter source to improve the BER between said optical transmitter source and the optical receiver photonic integrated circuit (RxPIC).

20. The optical receiver photonic integrated circuit (RxPIC) of claim 19 wherein said operational characteristic is an absorption characteristic of an electro-optic modulator.

21. The optical receiver photonic integrated circuit (RxPIC) of claim 19 wherein said operational characteristic is a bias voltage applied to an electro-optic modulator.

22. The optical receiver photonic integrated circuit (RxPIC) of claim 19 wherein said operational characteristic is a chirp parameter of an electro-optic modulator.

23. The optical receiver photonic integrated circuit (RxPIC) of claim 19 wherein said operational characteristic is an extinction ratio of an electro-optic modulator.

24. The optical receiver photonic integrated circuit (RxPIC) of claim 19 wherein said operational characteristic is a voltage swing of an electro-optic modulator.

25. The optical receiver photonic integrated circuit (RxPIC) of claim 19 wherein said operational characteristic is an extinction ratio of an electro-optic modulator.

26. The optical receiver photonic integrated circuit (RxPIC) of claim 19 wherein said operational characteristic is a RF magnitude adjustment on the combined channel signal.

27. The optical receiver photonic integrated circuit (RxPIC) of claim 12 wherein said performance property is output power of at least one laser source at the optical transmitter source.

28. The optical receiver photonic integrated circuit (RxPIC) of claim 27 wherein the RxPIC controller provides a signal channel via an optical service channel to the optical transmitter source for adjusting the output power of said at least one laser source.

29. The optical receiver photonic integrated circuit (RxPIC) of claim 28 wherein said output power adjustment is accomplished via a change of current bias applied to a local heater for said at least one laser source or a change of current bias applied to said at least one laser source.

30. The optical receiver photonic integrated circuit (RxPIC) of claim 12 wherein the optical transmitter source is an optical transmitter photonic integrated circuit (TxPIC) chip providing a plurality of modulated channel signals that are combined on-chip to form the combined channel signal comprising the plurality of channel signals formed on the chip.

31. The optical receiver photonic integrated circuit (RxPIC) of claim 12 wherein said controller is a real time BER controller.

32. The optical receiver photonic integrated circuit (RxPIC) of claim 12 wherein said controller has an output coupled to said decombiner to tune a wavelength grid of said decombiner to better match the wavelength grid of channel signals from the optical transmitter source.

33. The optical receiver photonic integrated circuit (RxPIC) of claim 32 wherein said decombiner is an arrayed waveguide grating (AWG), an Echelle grating, a multichannel grating demultiplexer comprising wavelength-select angled or blazed gratings, a reflector stack filter, or multimode interference (MMI) coupler.

34. The optical receiver photonic integrated circuit (RxPIC) of claim 12 wherein said decombiner is an arrayed waveguide grating (AWG), an Echelle grating, a multichannel grating demultiplexer comprising wavelength-select angled or blazed gratings, a reflector stack filter, or multimode interference (MMI) coupler.

35. The optical receiver photonic integrated circuit (RxPIC) of claim 12 further comprising a FEC decoder to receive said converted signals and decode and correct error bits in said signals, a portion of said converted signals provided to said controller to monitor the error bit rate (BER) of said channel signals.

36. The optical receiver photonic integrated circuit (Rx-PIC) of claim 35 wherein said FEC decoder is a joint FEC decoder for all of said converted signals or is a separate FEC decoder for each of said converted signals.

37. The optical receiver photonic integrated circuit (Rx-PIC) of claim 12 wherein said controller adjusts decision threshold values of a decision window of an eye diagram for converted signals to improve data recovery.

38. The optical receiver photonic integrated circuit (Rx-PIC) of claim 37 wherein said decision threshold values are phase offset or threshold offset within the decision window eye diagram.

39. The optical receiver photonic integrated circuit (Rx-PIC) of claim 38 wherein said decision threshold values comprise a threshold offset from a horizontal eye rail of the eye diagram having highest signal noise.

40. The optical receiver photonic integrated circuit (Rx-PIC) of claim 12 wherein said photodetectors are PTN photodiodes, avalanche photodiodes, metal-semiconductor-metal detectors, velocity-matched distributed photodetectors or traveling-wave photodetectors.

41. The optical receiver photonic integrated circuit (Rx-PIC) of claim 12 wherein said optical service channel (OSC) further comprises a modulated source integrated on said chip to provide said optical service channel signal for transmission to the optical transmitter source.

42. The optical receiver photonic integrated circuit (Rx-PIC) of claim 12 further comprises:
   one end of said optical service channel (OSC) is couple as an input in the output side of said optical decombiner;
   the other end of said optical service channel (OSC) is coupled to an optical service channel (OSC) modulator;
   an output from said controller coupled to said optical service channel (OSC) modulator to modulate the same to produce an optical service channel signal.

43. The optical receiver photonic integrated circuit (Rx-PIC) of claim 42 wherein said optical service channel (OSC) modulator is a laser or an electro-optic modulator.

44. The optical receiver photonic integrated circuit (Rx-PIC) of claim 42 wherein said optical service channel (OSC) modulator is integrated on said chip to said other end of said optical service channel (OSC).

45. The optical receiver photonic integrated circuit (Rx-PIC) of claim 44 wherein said optical service channel (OSC) modulator is a semiconductor laser or an electro-optic modulator integrated on said chip.

46. An optical receiver photonic integrated circuit (Rx-PIC) comprising:
   a semiconductor monolithic chip having an input to receive from an optical transmission link a multiplexed channel signal originating from an optical transmitter source and comprising a plurality of channel signals having different wavelengths forming a wavelength grid;
   an optical decombiner integrated in the chip and optically coupled to the chip input to receive the multiplexed channel signal and provide a decombined individual channel signal on a respective output waveguide of a plurality of chip integrated output waveguides from the optical decombiner;
   a plurality of photodetectors integrated in the chip and each optically coupled to one of the output waveguides to receive a decombined channel signal and convert the channel signal to an electrical signal; and
   an optical service channel (OSC) integrated on the same chip to generate an optical service signal indicative of certain received parameters relating to the decombined individual channel signals and transmit the generated optical service signal on the optical transmission link back to the optical transmitter source.

47. The optical receiver photonic integrated circuit (Rx-PIC) of claim 46 wherein the generated optical service channel signal is provided by an optical modulator source integrated in the RxPIC.

48. The optical receiver photonic integrated circuit (Rx-PIC) of claim 47 wherein optical modulator source comprises a modulated semiconductor laser or a combination semiconductor laser and electro-optic modulator.

49. An optical receiver photonic integrated circuit (Rx-PIC) comprising:
   a semiconductor monolithic chip having an input to receive from an optical transmission link a combined channel signal originating from an optical transmitter source and comprising a plurality of channel signals having different wavelengths forming a wavelength grid;
   an optical decombiner integrated in the chip and optically coupled to the input to receive the multiplexed channel signal and provide a decombined individual channel signal on a respective output waveguide of a plurality of output waveguides from the optical decombiner;
   a plurality of photodetectors integrated in the chip and each optically coupled to one of the output waveguides to receive a decombined channel signal and convert the channel signal to an electrical signal;
   a controller coupled to receive a portion of the converted signals to determine at least one performance property of the signals and provide a service channel signal as feedback via said semiconductor monolithic chip to the optical transmitter source;
   said performance property comprising output power of at least one laser source at the optical transmitter source;
   the controller providing the service channel signal via an optical service channel to the optical transmitter source for adjusting the output power of the at least one laser source output power where the adjustment is accomplished via a change of current bias applied to a local heater for the at least one laser source or a change of current bias applied to the at least one laser source.

50. The optical receiver photonic integrated circuit (Rx-PIC) of claim 49 wherein the optical transmitter source is an optical transmitter photonic integrated circuit (TxPIC) chip providing a plurality of modulated channel signals that are combined on-chip to form the combined channel signal comprising the plurality of channel signals formed on the chip.

51. The optical receiver photonic integrated circuit (Rx-PIC) of claim 49 further comprising a modulated source integrated on the semiconductor monolithic chip and modulated by the service channel signal from the controller to provide an optical service channel signal which is provided via the decombiner to the optical service channel.

52. An optical receiver photonic integrated circuit (Rx-PIC) comprising:
   a semiconductor monolithic chip having an input to receive from an optical transmission link a combined channel signal originating from an optical transmitter source and comprising a plurality of channel signals having different wavelengths forming a wavelength grid;

an optical decombiner integrated in the chip and optically coupled to the input to receive the multiplexed channel signal and provide a decombined individual channel signal on a respective output waveguide of a plurality of output waveguides from the optical decombiner;

a plurality of photodetectors integrated in the chip and each optically coupled to one of the output waveguides to receive a decombined channel signal and convert the channel signal to an electrical signal;

a controller coupled to receive a portion of the converted signals to determine at least one performance property of the signals and provide a service channel signal as feedback via said semiconductor monolithic chip to the optical transmitter source;

said controller having an output coupled to the optical decombiner to tune a wavelength grid of the optical decombiner to better match the wavelength grid of combined channel signals received from the optical transmitter source.

53. The optical receiver photonic integrated circuit (Rx-PIC) of claim 52 wherein the optical decombiner is an arrayed waveguide grating (AWG), an Echelle grating, a multichannel grating demultiplexer comprising wavelength-select angled or blazed gratings, a reflector stack filter, or multimode interference (MMI) coupler.

54. An optical receiver photonic integrated circuit (Rx-PIC) comprising:

a semiconductor monolithic chip having an input to receive from an optical transmission link a combined channel signal originating from an optical transmitter source and comprising a plurality of channel signals having different wavelengths forming a wavelength grid;

an optical decombiner integrated in the chip and optically coupled to the input to receive the multiplexed channel signal and provide a decombined individual channel signal on a respective output waveguide of a plurality of output waveguides from the optical decombiner;

a plurality of photodetectors integrated in the chip and each optically coupled to one of the output waveguides to receive a decombined channel signal and convert the channel signal to an electrical signal;

a controller coupled to receive a portion of the converted signals to determine at least one performance property of the signals and provide a service channel signal as feedback via said semiconductor monolithic chip to the optical transmitter source, the performance property comprising adjustment of laser source intensity at the optical transmitter source or adjustment of intensity modulator bias, extension ratio or chirp ($\alpha$ parameter), or both; and a FEC decoder to receive said converted signals and decode and correct error bits in said signals, a portion of said converted signals provided to said controller to monitor the error bit rate (BER) of said channel signals and, based upon BER monitoring, provide a service channel signal via an optical service channel to the optical transmitter source for adjusting laser source intensity or intensity modulator bias, extension ratio or chirp ($\alpha$ parameter).

55. The optical receiver photonic integrated circuit (Rx-PIC) of claim 54 wherein the FEC decoder is a joint FEC decoder for all of the converted signals or is a separate FEC decoder for each of the converted signals.

56. An optical receiver photonic integrated circuit (Rx-PIC) comprising:

a semiconductor monolithic chip having an input to receive from an optical transmission link a combined channel signal originating from an optical transmitter source and comprising a plurality of channel signals having different wavelengths forming a wavelength grid;

an optical decombiner integrated in the chip and optically coupled to the input to receive the multiplexed channel signal and provide a decombined individual channel signal on a respective output waveguide of a plurality of output waveguides from the optical decombiner;

a plurality of photodetectors integrated in the chip and each optically coupled to one of the output waveguides to receive a decombined channel signal and convert the channel signal to an electrical signal;

a controller coupled to receive a portion of the converted signals to determine at least one performance property of the signals and provide a service channel signal as feedback via said semiconductor monolithic chip to the optical transmitter source; and said controller adjusts decision threshold values of a decision window of an eye diagram for converted signals to improve data recovery.

57. The optical receiver photonic integrated circuit (Rx-PIC) of claim 56 wherein the decision threshold values are phase offset or threshold offset within the decision window eye diagram.

58. The optical receiver photonic integrated circuit (Rx-PIC) of claim 57 wherein the decision threshold values comprise a threshold offset from a horizontal eye rail of the eye diagram having highest signal noise.

* * * * *